(12) United States Patent
Tanaka et al.

(10) Patent No.: US 7,683,386 B2
(45) Date of Patent: Mar. 23, 2010

(54) SEMICONDUCTOR LIGHT EMITTING DEVICE WITH PROTRUSIONS TO IMPROVE EXTERNAL EFFICIENCY AND CRYSTAL GROWTH

(75) Inventors: Hisanori Tanaka, Anan (JP); Yasunobu Hosokawa, Anan (JP); Yuuki Shibutani, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 10/920,419

(22) Filed: Aug. 18, 2004

(65) Prior Publication Data

US 2005/0179130 A1    Aug. 18, 2005

(30) Foreign Application Priority Data

Aug. 19, 2003    (JP) .............................. 2003-294775

(51) Int. Cl.
*H01L 29/18* (2006.01)
(52) U.S. Cl. .................. 257/88; 257/95; 257/E21.119; 438/29
(58) Field of Classification Search ................... 257/88, 257/E21.119, 94, 95, 89; 438/29
See application file for complete search history.

(56) References Cited

U.S. PATENT DOCUMENTS

| | | | |
|---|---|---|---|
| 4,163,953 A | 8/1979 | Springthorpe et al. | |
| 4,214,251 A | 7/1980 | Schairer | |
| 4,774,435 A | 9/1988 | Levinson | |
| 4,881,237 A | 11/1989 | Donnelly | |
| 5,003,357 A | 3/1991 | Kim et al. | |
| 5,309,001 A | 5/1994 | Watanabe et al. | |
| 5,696,389 A | 12/1997 | Ishikawa et al. | |
| 5,734,225 A | 3/1998 | Biebuyck et al. | |
| 5,779,924 A * | 7/1998 | Krames et al. ................ 216/24 |
| 5,814,839 A | 9/1998 | Hosoba | |
| 5,905,275 A | 5/1999 | Nunoue et al. | |
| 5,955,748 A | 9/1999 | Nakamura et al. | |
| 6,072,819 A | 6/2000 | Shakuda | |
| 6,091,083 A | 7/2000 | Hata et al. | |
| 6,091,085 A | 7/2000 | Lester | |
| 6,095,666 A | 8/2000 | Salam | |

(Continued)

FOREIGN PATENT DOCUMENTS

EP    0 544 512 A1    6/1993

(Continued)

OTHER PUBLICATIONS

K. Tadatomo et al., "High Output Power InGaN Ultraviolet Light-Emitting Diodes Fabricated on Patterned Substrates Using Metalorganic Vapor Phase Epitaxy", The Japan Society of Applied Physics, vol. 40 (2001, pp. 583-585, Jun. 16, 2001.

(Continued)

*Primary Examiner*—Wael Fahmy
*Assistant Examiner*—John C Ingham
(74) *Attorney, Agent, or Firm*—Wenderoth, Lind & Ponack, L.L.P.

(57) ABSTRACT

A substrate has at least one recess and/or protrusion formed in and/or on a surface thereof so as to scatter or diffract light generated in an active layer. The recess and/or protrusion is formed in such a shape that can reduce crystalline defects in semiconductor layers.

24 Claims, 23 Drawing Sheets

U.S. PATENT DOCUMENTS

| | | | |
|---|---|---|---|
| 6,107,644 A | 8/2000 | Shakuda et al. | |
| 6,232,623 B1 | 5/2001 | Morita | |
| 6,238,947 B1 | 5/2001 | Shakuda | |
| 6,316,785 B1 | 11/2001 | Nunoue et al. | |
| 6,325,850 B1 | 12/2001 | Beaumont et al. | |
| 6,335,546 B1 | 1/2002 | Tsuda et al. | |
| 6,346,771 B1 | 2/2002 | Salam | |
| 6,348,096 B1 | 2/2002 | Sunakawa et al. | |
| 6,410,942 B1* | 6/2002 | Thibeault et al. | 257/88 |
| 6,426,519 B1 | 7/2002 | Asai et al. | |
| 6,469,320 B2 | 10/2002 | Tanabe et al. | |
| 6,479,889 B1 | 11/2002 | Yoshida et al. | |
| 6,504,590 B1* | 1/2003 | Kikuchi et al. | 349/113 |
| 6,514,782 B1 | 2/2003 | Wierer, Jr. et al. | |
| 6,555,845 B2 | 4/2003 | Sunakawa et al. | |
| 6,566,231 B2 | 5/2003 | Ogawa et al. | |
| 6,617,182 B2 | 9/2003 | Ishida et al. | |
| 6,620,238 B2 | 9/2003 | Tsuda et al. | |
| 6,791,119 B2* | 9/2004 | Slater et al. | 257/99 |
| 6,802,902 B2 | 10/2004 | Beaumont et al. | |
| 6,815,726 B2 | 11/2004 | Ishida et al. | |
| 6,821,804 B2* | 11/2004 | Thibeault et al. | 438/29 |
| 6,870,191 B2 | 3/2005 | Niki et al. | |
| 6,994,751 B2 | 2/2006 | Hata et al. | |
| 7,033,854 B2 | 4/2006 | Morita | |
| 7,053,420 B2 | 5/2006 | Tadatomo et al. | |
| 7,118,929 B2 | 10/2006 | Frayssinet et al. | |
| 7,125,736 B2 | 10/2006 | Morita | |
| 7,179,667 B2 | 2/2007 | Okagawa et al. | |
| 2001/0022495 A1 | 9/2001 | Salam | |
| 2002/0063521 A1 | 5/2002 | Salam | |
| 2002/0117104 A1 | 8/2002 | Hata et al. | |
| 2003/0057444 A1 | 3/2003 | Niki et al. | |
| 2003/0143771 A1 | 7/2003 | Kidoguchi et al. | |
| 2003/0209705 A1 | 11/2003 | Emerson et al. | |
| 2005/0001227 A1 | 1/2005 | Niki et al. | |
| 2005/0035359 A1 | 2/2005 | Ishida et al. | |
| 2005/0179130 A1 | 8/2005 | Tanaka et al. | |
| 2005/0263778 A1 | 12/2005 | Hata et al. | |
| 2007/0072320 A1 | 3/2007 | Frayssinet et al. | |
| 2008/0303043 A1 | 12/2008 | Niki et al. | |
| 2009/0042328 A1 | 2/2009 | Niki et al. | |

FOREIGN PATENT DOCUMENTS

| | | |
|---|---|---|
| EP | 1 088 914 | 4/2001 |
| EP | 1 101 841 | 5/2001 |
| EP | 1 378 949 A1 | 1/2004 |
| GB | 2 296 378 A | 6/1996 |
| GB | 2 304 230 A | 3/1997 |
| GB | 2 329 238 A | 3/1999 |
| GB | 2 331 625 A | 5/1999 |
| GB | 2 381 380 A | 4/2003 |
| GB | 2 381 381 A | 4/2003 |
| JP | 56-087383 A | 7/1981 |
| JP | 58-096781 A | 6/1983 |
| JP | 62-076686 A | 4/1987 |
| JP | 4-313281 | 11/1992 |
| JP | 5-085894 | 4/1993 |
| JP | 5-145119 | 6/1993 |
| JP | 5-59861 | 8/1993 |
| JP | 5-335622 | 12/1993 |
| JP | 6-237012 | 8/1994 |
| JP | 6-291368 | 10/1994 |
| JP | 8-222763 | 8/1996 |
| JP | 8-236870 | 9/1996 |
| JP | 9-312442 | 12/1997 |
| JP | 10-209495 | 8/1998 |
| JP | 11-150306 A | 6/1999 |
| JP | 11-224960 A | 8/1999 |
| JP | 11-238687 | 8/1999 |
| JP | 11-274560 | 10/1999 |
| JP | 11-274568 A | 10/1999 |
| JP | 2000-21772 | 1/2000 |
| JP | 2000-106455 | 4/2000 |
| JP | 2000-156524 | 6/2000 |
| JP | 2000-174339 | 6/2000 |
| JP | 2000-216431 | 8/2000 |
| JP | 2000-216497 | 8/2000 |
| JP | 2000-216502 | 8/2000 |
| JP | 2000-277437 | 10/2000 |
| JP | 2000-332300 A | 11/2000 |
| JP | 2001-094216 | 4/2001 |
| JP | 2001-148348 | 5/2001 |
| JP | 2001-160539 | 6/2001 |
| JP | 2002-164296 | 6/2002 |
| JP | 2002-280611 | 9/2002 |
| JP | 2003-197961 A | 7/2003 |
| JP | 2005-101566 | 4/2005 |
| WO | 99/20816 | 4/1999 |
| WO | 01/41225 | 6/2001 |
| WO | 02/103813 A1 | 12/2002 |
| WO | 03-010831 | 2/2003 |

OTHER PUBLICATIONS

U.S. Appl. No. 10/897,163, filed Jul. 23, 2004 (Published as U.S. 2005-0001227 on Jan. 6, 2005, as listed above).
Office Action dated Jan. 12, 2006 issued in U.S. Appl. No. 10/897,163.
Yamada, M., et al., "InGaN-Based Near-Ultraviolet and Blue-Light-Emitting Diodes with High External Quantum Efficiency Using a Patterned Sapphire Substrate and a Mesh Electrode" *Jpn. J. Appl. Phys.* vol. 41 (2002) Pt. 2, No. 12B, pp. L1431 to L1433.
Tadatomo, Kazuyuki, et al., "High Output Power InGaN Ultraviolet Light-Emitting Diodes Fabricated on Patterned Substrates Using Metalorganic Vapor Phase Epitaxy" *Jpn. J. Appln. Phys.* vol. 40 (2001) Pt. 2, No. 6B, pp. 583 to L585.
*Notification of Reasons for Refusal* of corresponding Japanese Patent Application No. 2005-101566, with partial English language translation.
U.S. Office Action issued Sep. 2, 2009 in U.S. Appl. No. 10/897,163.
Ponce, F.A. et al., *Spatial distribution of the luminescence in GaN thin films,* Appl. Phys. Lett. vol. 68, No. 1 (Jan. 1, 1996), pp. 57-59.
Japanese Notification of Reasons for Refusal issued Dec. 5, 2006 in connection with JP Application No. 2002-213490 corresponding to the present U.S. application.
U.S. Office Action issued Jan. 12, 2006 in connection with U.S. Appl. No. 10/897,163 corresponding to the present U.S. application.
U.S. Office Action issued Oct. 11, 2006 in connection with U.S. Appl. No. 10/897,163 corresponding to the present U.S. application.
U.S. Office Action issued Apr. 6, 2007 in connection with U.S. Appl. No. 10/897,163 corresponding to the present U.S. application.
U.S. Office Action issued Oct. 22, 2007 in connection with U.S. Appl. No. 10/897,163 corresponding to the present U.S. application.
U.S. Office Action issued Apr. 4, 2008 in connection with U.S. Appl. No. 10/897,163 corresponding to the present U.S. application.
U.S. Office Action issued Oct. 23, 2008 in connection with U.S. Appl. No. 10/897,163 corresponding to the present U.S. application.
Yu et al., "Optical properties of wurtzite structure GaN on sapphire around fundamental absorption edge (0.78-4.77 eV) by spectroscopic ellipsometry and the optical transmission method," Appl. Phys. Lett., vol. 70, No. 24, Jun. 16, 1997, pp. 3209-3211.
Japanese Notification issued Apr. 28, 2009 in connection with JP Application No. 2006-252509 (with partial English translation).
U.S. Office Action issued May 12, 2009 in connection with U.S. Appl. No. 12/022,794.
U.S. Office Action issued Jul. 10, 2003 in connection with U.S. Appl. No. 10/201,600.

\* cited by examiner

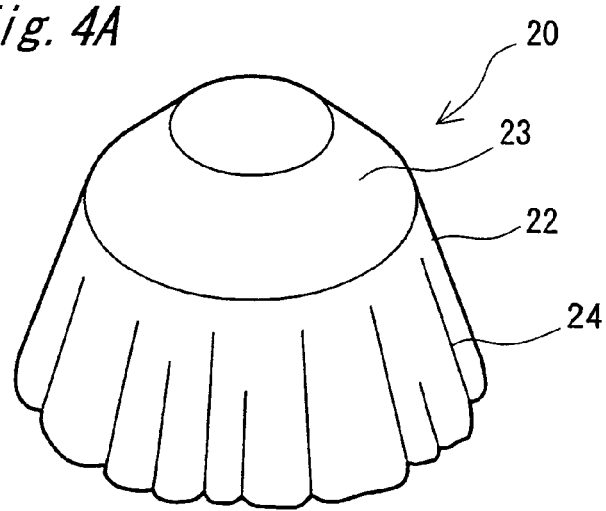
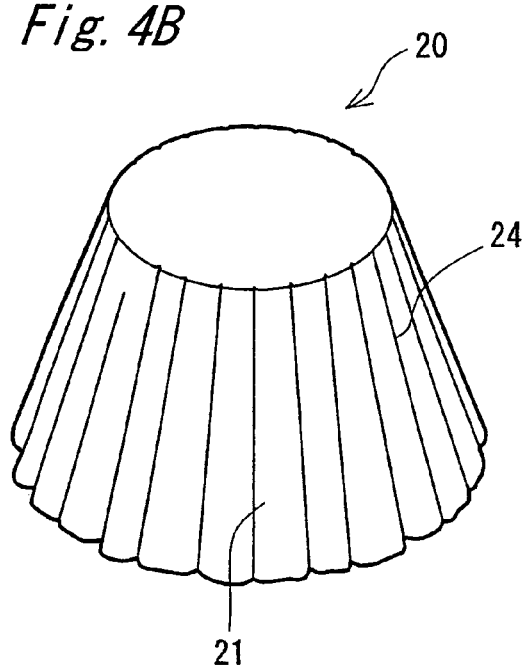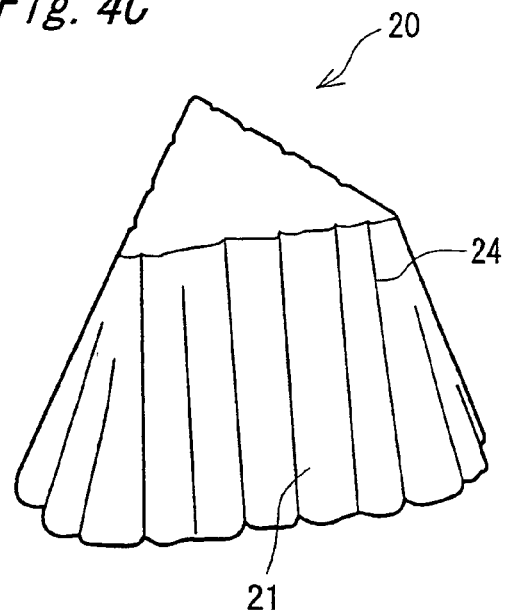

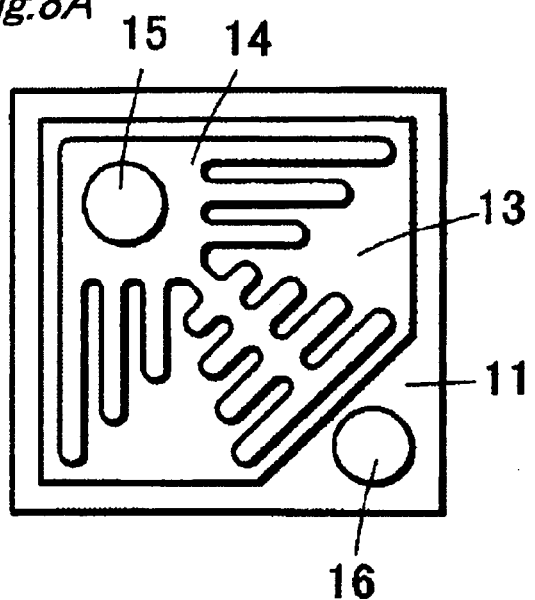
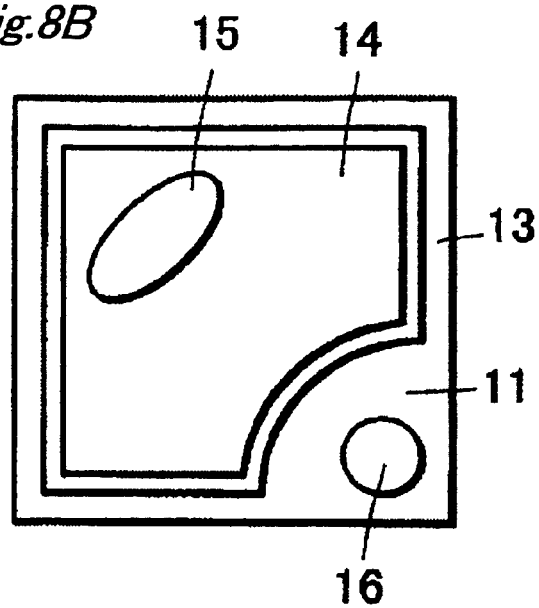
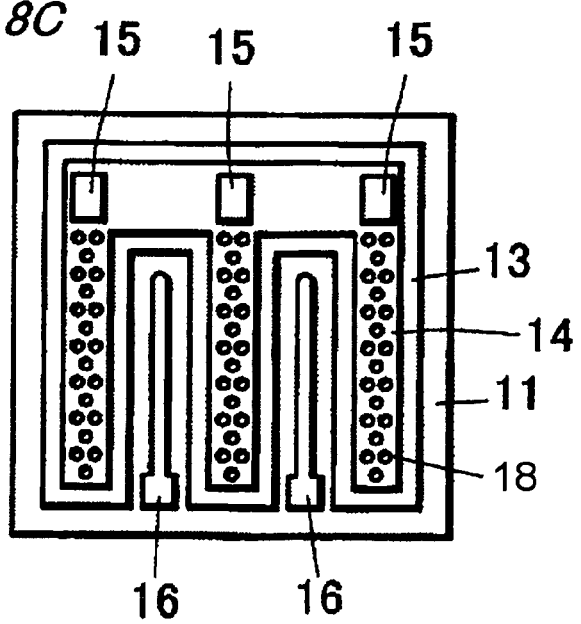

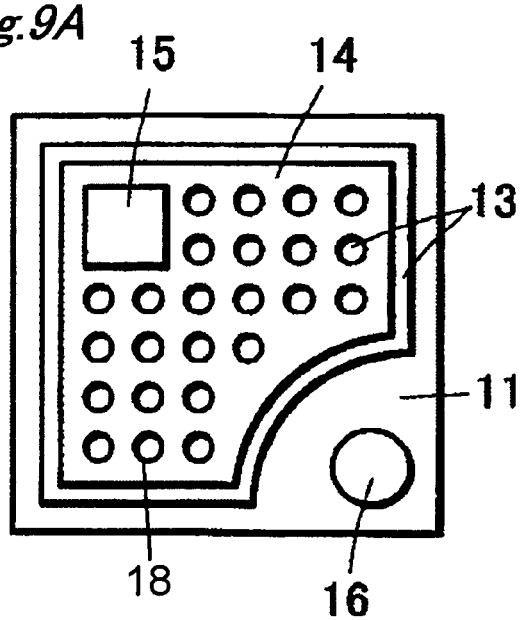
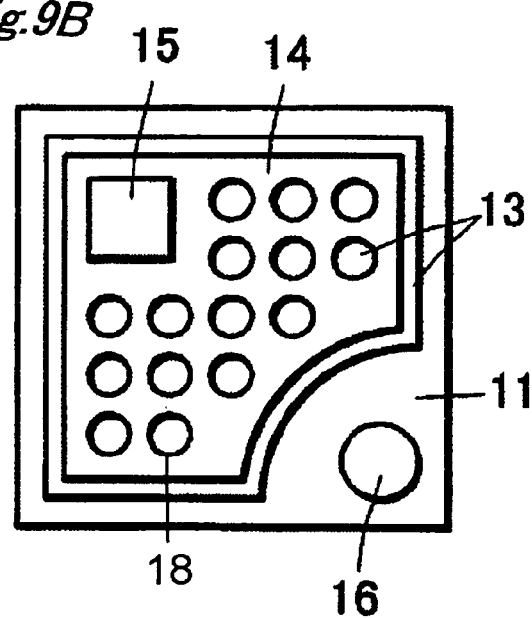
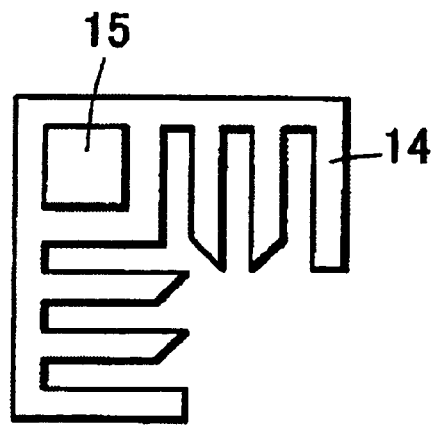
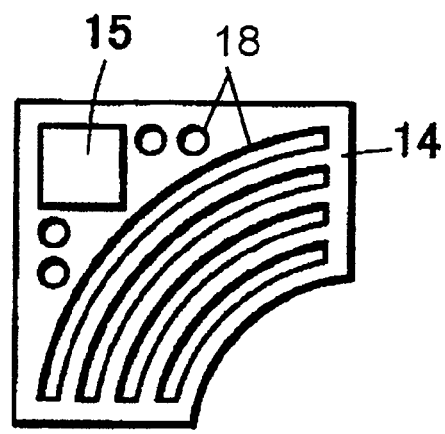

SEMICONDUCTOR LIGHT EMITTING DEVICE WITH PROTRUSIONS TO IMPROVE EXTERNAL EFFICIENCY AND CRYSTAL GROWTH

TECHNICAL FIELD

The present invention relates to a semiconductor device having a recess or protrusion provided on a substrate and, more particularly, to a semiconductor light emitting device that improves its external efficiency by having the recess or protrusion provided on the substrate.

BACKGROUND ART

A semiconductor device, for example, a light emitting diode (LED) essentially comprises an n-type semiconductor layer, an active layer and a p-type semiconductor layer laminated on a substrate in this order. Electrodes are formed on the p-type semiconductor layer and on the n-type semiconductor layer. Light is generated in a light emitting region of the active layer through recombination of holes injected from the p-type semiconductor layer and electrons injected from the n-type semiconductor layer. The light is extracted to outside from a surface whereon the electrodes are formed, or from a back surface of the substrate where a semiconductor layer is not formed.

A light emitting diode having such a structure as described above requires control of this laminated semiconductor structure at an atomic-layer level, and for this purpose, it is a common practice to process a substrate surface to a mirror finish. The semiconductor layers and the electrodes are formed parallel to each other on the substrate, and a light-propagating portion is formed so that light propagates through a semiconductor portion. The light-propagating portion is formed so that a semiconductor layer having a high refractive index is sandwiched between the substrate and an electrode, both of which have lower refractive indices. A waveguide is interposed between a p-type semiconductor layer-electrode interface and a substrate-electrode interface.

When light generated in the semiconductor layer enters with an angle of incidence not smaller than a critical angle with respect to interfaces with the electrodes or an interface with the substrate, the light laterally propagates while repeating total reflection within the semiconductor layer. As a result, light is trapped within the waveguide and cannot be extracted to outside efficiently. In addition, part of light is absorbed while laterally propagating with repeated total reflection within the semiconductor layer, resulting in lower external quantum efficiency.

A method of roughing a top surface and side faces of a light emitting diode chip has been proposed, but this causes damage on the semiconductor layer and results in cracks and/or other trouble. This leads to partial breakage of a p-n junction and reduction in an effective light emitting region.

Japanese Unexamined Patent Publication (Kokai) No. 11-274568 proposes a method of increasing external quantum efficiency by creating a recess or protrusion on a surface of a substrate so that light generated in a light emitting region is scattered. This method employs a mechanical process or etching for randomly roughing a surface of a sapphire substrate of a GaN-based LED comprising the sapphire substrate, an n-type GaN layer, a p-type GaN layer and a transparent electrode that are laminated in this order. This process is supposed to scatter light incident on the sapphire substrate so as to increase the external quantum efficiency.

SUMMARY OF THE INVENTION

However, when a recess or protrusion having insufficient accuracy due to fine structure thereof is formed on a substrate surface without controlling a shape, the recess or protrusion may have significant notches formed on a side face thereof, resulting in a rugged circumference (FIG. 14). A GaN layer grown on such a substrate surface is likely to have pits and/or voids, which in turn make it easier for cracks to occur during regrowth of GaN. This results in lower crystallinity of GaN which decreases efficiency of light emission (internal quantum efficiency), and thus external quantum efficiency decreases contrary to an intention. These cracks also lower reliability of this semiconductor device. Influence of lowering crystallinity of the semiconductor is not limited to a light emitting device such as a light emitting diode, but adversely affects other semiconductor devices such as a light sensor and electronic devices.

When a recess or protrusion is formed on a substrate surface whereon a semiconductor is to be grown, the semiconductor may grow with anomaly that may result in various problems. For example, such problems may result as deterioration of surface morphology caused by pits formed in a semiconductor layer surface and the like; occurrence of voids caused by insufficient semiconductor growth without filling the recess; threading dislocation and other crystalline defects caused in the semiconductor layer by defective growth of the semiconductor; or occurrence of a partial abnormal growth in a wafer surface. Undesirable surface morphology due to pits or other like structure formed in the surface, or poor crystallinity due to crystal defects, lead to an increase in electrostatic discharge damage due to leakage current, or decreased efficiency of light emission due to subsequently deteriorated crystallinity of an active layer or the like, which may result in unsatisfactory properties of a semiconductor device. Voids caused by the recess or protrusion may cause poor crystallinity and/or pits and may also hamper an optical effect of the recess or protrusion in the substrate. When a partial abnormal growth occurs in a wafer, a lower yield of device production results.

In consideration of the problems described above, an object of the present invention is to provide a semiconductor device characterized by high reliability including electrostatic discharge tolerance, better crystallinity and high efficiency of light emission, by suppressing generation of pits and voids in a semiconductor layer due to formation of a recess or protrusion on a substrate surface. Another object of the present invention is to provide a semiconductor device that can be manufactured with a high yield of production while achieving stable external quantum efficiency, and a method of manufacturing the same.

The semiconductor device of the present invention comprises a substrate having a recess and/or protrusion formed in and/or on a surface thereof and semiconductor layers formed, from materials different from that of the substrate, on this substrate surface, wherein a side face of the recess and/or protrusion includes at least two faces of different angles of inclination. The expression "includes at least two faces of different angles of inclination" means that the side face of the recess and/or protrusion is constituted from at least two sloped surfaces of different angles of inclination with respect to a bottom of the recess and/or protrusion. FIG. 5A shows an example of a cross section of the protrusion, in which case the side face of the protrusion includes two sloped surfaces having different angles of inclination $\theta_1$ and $\theta_2$. A number of sloped surfaces is not limited to two, and may be larger. That is, angles of inclination are not limited to $\theta_1$ and $\theta_2$, and n kinds of angles of inclination up to $\theta_n$ (n is an integer) may be provided.

The protrusion formed on the substrate surface preferably has a convex side face (that swells outwardly) as shown in FIG. 5A and FIG. 15. In case a recess is formed in the substrate surface, it is preferable that an inner surface of the recess protrudes toward an interior of the recess. This is because, for example in a case of a protrusion as shown in FIG. 17A and FIG. 17B, after a semiconductor layer has grown to an apex of a side face of the protrusion, the semiconductor layer grown from a top of the protrusion and a layer grown from a valley between adjacent protrusions join in such a manner that decreases the inclination angle of the side face of the protrusion, so that a joint can be formed smoothly. This enables to be suppressed occurrence of abnormal crystal growth such as voids and pits, and deterioration of crystallinity. This protruding (swelling) shape of the side face of the recess or the protrusion includes not only a beak-shaped protrusion such as shown in FIG. 5A, but also a convex curved surface as shown in FIG. 15. The protruding (swelling) shape of the side face refers to such a shape as illustrated by a sectional view of FIG. 15, where the side face is on an outside of a straight line that connects an edge of the top face and an edge of a base (or, in the case of a recess, the side face is on an inside of a straight line that connects an edge of a surface that surrounds a top opening and an edge of a bottom). In other words, in the case of the protrusion, a cross section of the protrusion is wider than a normal trapezoid. In the case of recess, a cross section of the recess is narrower than a normal inverted trapezoid. According to the present invention, a plurality of protruding portions may be provided on the side face of the protrusion or recess. It is preferable, however, that the side face of the recess or protrusion has a single protruding portion as shown in FIG. 5A and FIG. 15, to ensure stable growth of a semiconductor on the substrate.

As mentioned previously, recesses or protrusions are preferably formed with high density in order to achieve a high efficiency of extracting light. That is, it is preferable to form small recesses or protrusions at small intervals. However, as the recesses or protrusions become smaller, it becomes difficult to form satisfactory recesses or protrusions due to a limitation of machining accuracy, and notches are likely to be formed on side faces of the recesses or protrusions. In case side face 21 of the recess or protrusion has a constant angle of inclination as shown in FIG. 4B and FIG. 4C, notches 24 formed along this sloped side face 21 reach a top face of protrusion 20. This results in a rugged circumference of the top face of the protrusion 20 as the notches cut into a circumference of the top face. Such notches are not formed regularly in a substrate surface, but are formed with irregular shapes and sizes. Therefore, occurrence of pits and voids cannot be suppressed simply by controlling conditions of growing semiconductor layers.

In contrast, at least two sloped surfaces 22, 23 of different angles of inclination are formed on the side face of the recess and/or protrusion as shown in FIG. 4A according to the present invention. Thus, the notches 24 generated in lower sloped surface 22 are less likely to reach the top surface of the protrusion 20. In other words, notches down the slope are formed only on a lower first sloped surface among the first and second sloped surfaces 22, 23. The notches extend to reach a boundary of the second sloped surface 23, but do not extend into the second sloped surface. Consequently, upper second sloped surface 23 is free from notches running along the slope, resulting in smaller roughness of the sloped surface. Abnormal morphology such as pits can be suppressed by growing a semiconductor layer on the surface having such recess and/or protrusion. Forming the recess and/or protrusion on the substrate surface leads to no significant increase in dislocations formed in the semiconductor layer. This is supposedly because surface roughness of the upper sloped surface is made smaller than that of the lower sloped surface, and a circumference of the top surface of the protrusion is formed smoothly. The expression that "the circumference is formed smoothly" means that there are no substantial notches in the circumference.

In case the protrusion or recess has a curved side face, it is supposed that a semiconductor growing from a valley between protrusions, or from a bottom of a recess, has smoother and smaller changes in a shape of a growing region, thus resulting in satisfactory growth. Notches formed on the side face of the recess or the protrusion can also be reduced by forming the protrusion or recess with the curved side face.

It is preferable to form at least a first sloped surface and a second sloped surface, from the bottom of the substrate, on the side face of the protrusion with angle of inclination $\theta_1$ of the first sloped surface with respect to the bottom of the recess and/or protrusion, and angle of inclination $\theta_2$ of the second sloped surface with respect to the bottom of the recess and/or protrusion, satisfying the relation $\theta_1 > \theta_2$. Propagation of notches generated on the side face of the protrusion from the first sloped surface to the second sloped surface can be prevented by such a constitution of the sloped surfaces. It is preferable to make the first angle of inclination $\theta_1$ larger since it decreases a depth and size of notches formed in the first sloped surface. The same applies to a case where a recess is formed.

It is preferable to form at least a first sloped surface 22 and a second sloped surface 23, from the bottom of the substrate, on a side face of the protrusion with surface roughness $Ra_1$ of the first sloped surface 22 and surface roughness $Ra_2$ of the second sloped surface 23 satisfying the relation $Ra_1 > Ra_2$. Generation of voids and the like can be greatly reduced when growing a semiconductor by making the surface roughness $Ra_2$ of the second sloped surface smaller. It is supposed that generation of voids is suppressed because variations in a semiconductor growth rate between protrusions are suppressed, and a junction between semiconductors is formed at a constant point. In case the side face of the protrusion is formed from a single sloped surface as shown in FIG. 14, surface roughness $Ra_3$ of the side face becomes larger than the surface roughness $Ra_1$ or $Ra_2$ of at least one of the sloped surfaces in the case of forming two sloped surfaces as described above. Moreover, since this large surface roughness continues to a top surface of the protrusion, occurrence of voids cannot be avoided even when conditions of growing a semiconductor are controlled, thus resulting in lower output power. Surface roughness $Ra_2$ of the second sloped surface is preferably at most 0.1 µm, more preferably at most 0.01 µm and most preferably at most 0.005 µm.

As mentioned above, if notches formed on the side face of the recess and/or protrusion grow upward along the slope to the top surface of the recess and/or protrusion, crystallinity of a semiconductor to be grown in a subsequent process becomes lower. If notches formed on the first sloped surface do not grow into the second sloped surface, however, good crystallinity of the semiconductor can be achieved. This is because stress generated when growing the semiconductor is relaxed by the first sloped surface where the notches are generated, and generation of voids is suppressed by the second sloped surface where notches are not generated.

Either a recess or protrusion may be formed in or on the substrate surface, and a combination of a recess and protrusion may also be formed. But it is preferable to form protrusions rather than recesses, since this makes it easier to grow a semiconductor layer without voids. When there are voids in a semiconductor layer around a recess or a protrusion, crystallinity of the semiconductor layer becomes lower and a function of the recess or protrusion to scatter or diffract light is impeded, resulting in lower output power of the light emitting device. In order to prevent defects from growing in the semiconductor layer, it is preferable to make the second sloped surface provided on a side face of the recess and/or protrusion flat.

[Plan-View Shape of Protrusion (Recess)]

In order to prevent defects from developing in the semiconductor layer, it is preferable to make the second sloped surface on the side face of the recess and/or protrusion flat. It is also preferable that the recess and/or protrusion have such a shape that is constituted from straight line segments which cross a plane substantially parallel to a stable growth plane of the semiconductor layer, as viewed from above the recess and/or protrusion. The "straight line segments which cross a plane substantially parallel to a stable growth plane as viewed from above the substrate" means straight lines that are not parallel to an intersection of the substrate surface and the stable growth plane, and is inclined from this line of intersection. The stable growth plane refers to facet surfaces formed as relatively smooth surfaces during growth of a semiconductor on the substrate. The stable growth plane generally appears as a facet in the course of growth. In a case of a gallium nitride semiconductor, for example, any plane (particularly an M-plane) parallel to an A-axis in the substrate surface is the stable growth plane. Therefore, it is preferable to form the recess or protrusion in a polygonal shape constituted from sides (=straight line segments) that are not parallel to a plane parallel to the A-axis, namely straight line segments that are not parallel to the A-axis. This is because, when recesses and/or protrusions are formed in a shape consisting of straight line segments that are substantially parallel to the stable growth plane of the semiconductor layer, crystal defects are likely to occur in a portion when growing a semiconductor layer. Crystal defects in a semiconductor layer decrease internal quantum efficiency, and eventually decreases external quantum efficiency. Here A-axis refers to a direction normal to an A plane. In case the A-axis is inclined from the substrate surface, an angle from the projection of the A-axis onto the substrate surface may be considered. A straight line that is not parallel to a plane parallel to the A-axis refers to a straight line that is not parallel to the A-axis or to the projection of the A-axis onto the substrate surface. A plane that is parallel to a plane parallel to the A-axis refers to a plane of which intersection with the substrate surface is a straight line that is parallel to the A-axis or to the projection of the A-axis onto the substrate surface.

A configuration in plan view of the recess and/or protrusion viewed from above the substrate may be a circle, triangle, parallelogram, hexagon or the like. Occurrence of pits and other defects can be suppressed by forming the recess or protrusion as a polygon such as a triangle, parallelogram or hexagon. More preferably, the recess or protrusion is formed as an equilateral triangle, rhombus or equilateral hexagon. Occurrence of pits can be significantly suppressed and the second sloped surface can be easily formed when the recess or protrusion is formed as circles. This also makes it possible to increase density of protrusions, namely increase a number of protrusions in a unit area, and increase a length and surface area of a side face, thereby increasing an effect of the protrusion to extract light and increasing output power when it is used as a light emitting element.

In this specification, to form the recess or protrusion as a polygon or circle means that the recess or protrusion has a polygonal or circular shape when viewed from above the substrate. When the recess or protrusion is formed to have a polygonal shape in plan view, the shape may not be an exact polygon in accordance with a geometrical meaning, and may be rounded at edges for reasons associated with a manufacturing process.

The recesses and/or protrusions are preferably formed in a repetitive pattern of the same shape, such as the pattern of a plurality of protrusions shown in FIGS. 7A-7H. While a single recess or protrusion may serve a purpose, efficiency to scatter or diffract light can be improved and external quantum efficiency can be improved further by forming the recess and/or protrusion in a repetitive pattern. Even when the recess and/or protrusion is formed in a repetitive pattern, occurrence of crystal defects due to the recess or protrusion can be suppressed by having at least the first and second sloped surfaces, more preferably by having swelled side faces, further preferably by having curved and swelled side faces of protrusions or recesses, so an entire surface of the substrate can be used as a light emitting surface.

[Size and Spacing of Recesses/Protrusions]

Depth of the recess or height of the protrusion is preferably at least 100 Å, and more preferably in a range from 1000 to 10000 Å. With a wavelength of emitted light (206 nm to 632 nm in a case of a light emission layer made of AlGaInN-based material) denoted as $\lambda$, sufficient scattering or diffraction of light cannot be achieved unless the depth or height is at least $\lambda/4$. Specifically, since light propagates within the semiconductor layer on the substrate as described above, the depth or height is preferably at least $\lambda/4n$, where n is a refractive index of a medium of propagation. On the other hand, if depth of the recess or height of the protrusion goes beyond this range, it becomes necessary to increase a thickness of the semiconductor layer, namely an underneath layer for structure of the element, required for depositing over the recesses or protrusions to form a flat surface. When a laminated structure is formed without forming a flat surface over the recesses or protrusions of the substrate, it becomes difficult for current to flow along the layer, resulting in lower efficiency of light emission.

A size of the recess and/or protrusion viewed from above the substrate, or length La of one of the sides that constitute a base of the recess and/or the protrusion, is preferably at least $\lambda/4$, where $\lambda$ is a wavelength of light emitted in the semiconductor (370 nm to 460 nm). When the size of the recess and/or the protrusion is smaller than $\lambda/4$, sufficient scattering or diffraction of light cannot be achieved. Here, $\lambda/4$ translates into $\lambda/4n$, where n is the refractive index of the semiconductor layer that serves as the medium of propagation for the emitted light. Length $L_b$ of one of the sides that constitute a top face of the recess and/or the protrusion is preferably at least 1.5 µm. Forming the recess or the protrusion of such a size makes it possible to suppress occurrence of voids during semiconductor growth. It is more preferable to set the ratio $L_t/L_b$ of length ($L_b$) of a bottom of the recess and/or protrusion to length ($L_t$) of a top surface of the recess and/or protrusion in a range of $1<L_t/L_b<2$, and more preferably $1.1<L_t/L_b<1.8$. This constitution makes it possible to suppress the occurrence of voids more effectively and increase output power by as much as at least 10%.

In order to achieve sufficient scattering or diffraction of light, a distance between recesses or between protrusions as viewed from above the substrate is preferably at least λ/4, similarly to that described above. For example, the distance between the recesses or between the protrusions is preferably in a range from 0.5 μm to 5 μm inclusive, and more preferably from 1 μm to 3 μm inclusive. When the distance is within such a range, a semiconductor layer can be grown efficiently and, consequently, efficiency of scattering or diffraction can be improved. The distance between the recesses or between the protrusions refers to a minimum distance between adjacent recesses or protrusions.

[Sectional Shape of Recess/Protrusion]

A cross sectional shape of the recess or protrusion is preferably a trapezoid having a side face that consists of at least two faces of different angles of inclination in the case of protrusion as shown in FIG. 5A, or a trapezoid having a curved side face that consists of first and second angles of inclination $\theta_1$ and $\theta_2$ as shown in FIG. 15. In the case of a recess, the recess preferably has a shape of an inverted trapezoid having a side face similar to that described above. Such a cross sectional shape makes it possible to further improve efficiency of scattering or diffraction of light. The cross sectional shape of the recess or protrusion may not be an exact trapezoid or inverted trapezoid in accordance with a geometrical meaning, and may be rounded at edges for reasons associated with a manufacturing process.

In case at least the first sloped surface and the second sloped surface, in this order from the bottom of the substrate, are formed on the side face of the protrusion with angle of inclination $\theta_1$ of the first sloped surface with respect to the bottom of the recess and/or protrusion, and angle of inclination $\theta_2$ of the second sloped surface with respect to the bottom of the recess and/or protrusion, output power due to scattering or diffraction is improved when angle of inclination $\theta_1$ is larger than 30° and smaller than 90°. When the angle of inclination $\theta_1$ of the recess or protrusion is too large, efficiency of scattering or diffraction decreases contrary to expectations, and pits are more likely to occur in a semiconductor layer. Thus, angle of inclination $\theta_1$ is preferably in a range from 45° to 80° inclusive, and preferably in a range from 50° to 70° inclusive. Angle of inclination $\theta_2$ is preferably in a range from 10° to 30° inclusive. Forming the recess or protrusion with angles in such ranges on the substrate surface enables to be suppressed occurrence of pits. Angle of inclination $\theta_3$ of the second sloped surface with respect to the top surface of the recess and/or protrusion is preferably at least 90°.

In case the protrusion has a convex side face so that a width of the cross section increases at a middle as shown in FIG. 5A or FIG. 15, it is preferable that inclination angle $\theta_m$ between a line connecting an edge of the bottom and an edge of the top face of the protrusion and a bottom plane of the protrusion is within a range from 20 to 80°, more preferably from 30 to 60°, as shown in FIG. 15. If this inclination angle is too large, a light reflecting surface (side face of the protrusion) occupies a smaller proportion of the substrate surface, resulting in lower effect of extracting light. If the inclination angle is too small as shown in FIGS. 17A, 17B, a semiconductor grown from a valley between adjacent protrusions joins with a semiconductor grown from the top of the protrusions in such a manner as the former creeps below the latter in a larger area, leading to occurrence of defective growth and/or voids. In the case of a recess, a supplement of inclination angle $\theta_m$ between a line connecting an edge of a bottom and an edge of a top face of the recess and a bottom plane of the recess is preferably within the range described above.

[Types of Substrate and Semiconductor]

According to the present invention, there are no limitations to kinds of materials used to make the substrate and semiconductor. The semiconductor formed on the substrate surface may be a semiconductor based on a Group III-V element or a semiconductor based on a Group II-VI element. Semiconductors based on Group III-V elements include nitride semiconductors, among which a GaN-based semiconductor, in particular, is preferably used. A stable growth plane of GaN-based semiconductor is generally M-plane {1-100} of a hexagonal crystal system. The notation {1-100} represents all of (1-100), (01-10), (-1010), etc. An M-plane is one of planes that are parallel to the A-axis in a substrate surface. Other planes that include the A-axis of the GaN-based semiconductor in the substrate surface, namely planes other than the M-plane, such as facet of {1-101} plane may also become the stable growth plane, depending on a growing condition.

As for the substrate, a sapphire substrate, a Si substrate, a SiC substrate or a spinel substrate can be used. For example, a sapphire substrate having C plane (0001) as a principal plane can be used. In this case, the M-plane that is the stable growth plane of a GaN-based semiconductor layer is a plane parallel to A plane {11-20} of the sapphire substrate. The A plane {11-20} represents all of (11-20), (1-210), (-2110), etc.

When a nitride semiconductor is grown on a C plane of a sapphire substrate, for example, crystal growth begins at hexagonal spots enclosed by planes that include an A-axis of the nitride semiconductor, like islands, and the islands eventually join with each other to form a homogeneous semiconductor layer. Therefore, it is preferable to form a recess or protrusion in such a planar configuration as a polygon (triangle, hexagon, and the like) that is constituted from sides which are perpendicular to straight lines connecting a center and vertices of an equilateral hexagon that is defined by the A-axis of the nitride semiconductor as its sides. A side face of the recess and/or the protrusion is formed so as to comprise at least two sloped surfaces, in a protruding shape having at least two inclination angles or in a convex curved surface. The sapphire substrate having the recess or protrusion formed thereon allows to be grown a nitride semiconductor having a flat surface and high crystallinity on a surface thereof. [Structure of Light Emitting Device Having Substrate with Recess/Protrusion]

The present invention, when applied to a semiconductor light emitting device, can provide a light emitting device having high efficiency of extracting light. In this case, while an ohmic electrode 14 formed on the light extracting surface of the semiconductor light emitting device may be formed on substantially the entire surface of the semiconductor layer 13 as shown in FIG. 9A and FIG. 9B, it is preferable to form the ohmic electrode in such a shape that has through holes 18. When a semiconductor layer is formed on the substrate having the recess or protrusion formed thereon and the electrode having the holes are formed thereon over the entire surface, the efficiency of extracting light is greatly improved by the mutually enhancing effects of both features.

A reason for the above is as described below. When a transparent electrode is formed over an entire surface of a semiconductor layer, part of light directed upward through scattering or diffraction by a recess or protrusion on a substrate surface is absorbed by the transparent electrode, resulting in lower intensity of optical output. When an opening is formed in a transparent electrode, or an opening is formed in an opaque electrode having high reflectivity, light directed upward through scattering or diffraction can be extracted to outside efficiently without being absorbed by the electrode, resulting in improved efficiency of extracting light. It is preferable that at least one recess or protrusion, that is formed on the substrate surface, is included in opening 18 of the electrode.

In the case of a semiconductor device that employs a nitride semiconductor, an ohmic electrode formed on a p-type semiconductor may be made of an alloy that includes at least one kind selected from among a group consisting of Ni, Pd, Co, Fe, Ti, Cu, Rh, Ir, Au, Ru, V, W, Zr, Mo, Ta, Pt, Ag, and an oxide or nitride of these elements.

Electrically conductive metal oxides (oxide semiconductors) such as indium tin oxide (ITO), ZnO, $In_2O_3$ and $SnO_2$ may also be used. Moreover, an alloy layer or a multi-layer film that includes one of the above can also be used. A translucent electrode is preferably made of ITO film in a visible light region. A reflective electrode is preferably made of Al, Ag or Rh for improving efficiency of extracting light and other reasons.

The semiconductor device of the present invention has an effect of improving crystallinity of a light emitting region (active layer) and increasing output power by forming a recess or protrusion that scatters or diffracts light in an interface between a semiconductor layer and a substrate instead of an interface between the semiconductor layer and an electrode. According to the present invention, light is scattered or diffracted by the recess and/or protrusion and is extracted efficiently upward from the semiconductor layer or downward from the substrate, resulting in greatly improved external quantum efficiency, in contrast to a flat substrate of the prior art in which light is transmitted laterally. According to the present invention, first, intensity of light directed upward or downward from the substrate is increased by scattering or diffraction by the recess or protrusion, and accordingly, luminance of a light emission surface of the light emitting device viewed squarely in front thereof (front brightness) is increased. Second, light transmitted along the semiconductor layer is decreased by an effect of scattering or diffraction by the recess or protrusion, thereby reducing absorption loss due to transmission, and increasing optical output.

In addition, according to the present invention, the recesses and/or protrusions are formed to have a side face comprising at least two sloped surfaces, preferably with protruding curved surfaces, on a substrate surface, so as to suppress formation of notches on the side face of each recess and/or the protrusion (FIG. 12, FIG. 13). As a result, a space surrounding each recess or protrusion can be completely filled with a semiconductor layer without causing voids. Thus, high external quantum efficiency is achieved and high output power can be maintained stably. When the recess or the protrusion is formed of a circular shape, occurrence of pits can be greatly reduced. This improves yield of production.

[Method of Manufacturing Substrate with Recess/Protrusion]

A method of manufacturing a substrate used in the light emitting device will be described below. While protrusions are formed in the example described below, the same method can be applied to a case of forming recesses.

First, an example shown in FIGS. 2A through 2D will be described. In this example, protrusions are formed by etching in two steps. As shown in FIGS. 2A and 2B, a protective film 25 of a specified shape is formed as an etching mask on a substrate. Then as shown in FIG. 2C, the substrate is etched so as to form projections 20 (first step). Then as shown in FIG. 2D, after removing the protective film 25 as a whole, the substrate is etched further so as to form protrusions 20 having two sloped surfaces (second step).

Now an example shown in FIGS. 18A through 18D will be described. In this example, protrusions are formed by etching in three steps. As shown in FIG. 18A, protective film 25 of a specified shape is formed as an etching mask on a substrate. Then, the substrate is etched so as to form projections 20 as shown in FIG. 18B (first step). In the first step, a part of the protective film 25 is etched to reduce an area thereof. Then the substrate is etched so as to form protrusions 20 having two sloped surfaces while leaving the protective film or after removing the protective film as a whole (second step). In the second step, etching is performed by exposing at least part or whole of top face 20t of each protrusion, a side face of the protrusion and a portion between protrusions (in other words, a recess).

As can be seen from FIG. 18B (or FIG. 2C), the inclination angle $\grave{e}_{m1}$ of the sloped surface of the protrusion 20 formed in the first step is larger than the inclination angle $\grave{e}_{m2}$ of the sloped surface of the protrusion 20 as a whole formed in the second step ($\theta_{m1} > \theta_{m2}$). Here, the inclination angle $\theta_{m2}$ of the sloped surface of the protrusion 20 as a whole formed in the second step means the inclination angle between the line connecting the edge of the bottom and the edge of the top face of the protrusion and the bottom face of the protrusion.

FIG. 18E shows a partially enlarged view of a boxed part by a dotted line in FIG. 18C. As shown in FIG. 18E, after the second step, there may be a case where a relatively sharp V-shaped notch 27a is formed at an edge of the first sloped surface 22 of the larger inclination angle on the base, namely on a periphery of valley 20b2 between the protrusions (periphery of bottom 20b2 of the recess, in the case of recess). This is because the notch is formed to extend along the first sloped surface 22, and the first sloped surface 22 has a greater inclination angle than the second sloped surface 23, and therefore a joint of the first sloped surface 22 and flat surface 20b2 of the substrate is etched with preference.

Then as shown in FIG. 18D, in order to integrate the two side faces 22 and 23 of the protrusion into a single smooth and convex curved surface 26, etching is performed while exposing at least part or an entirety of the top face 20t of the protrusion, the side face of the protrusion and the portion between the protrusions (in other words, a recess) (third step). This results in formation of smooth curved side face 26 of the protrusion 20 as shown in FIG. 18D. This curved surface 26 has the first inclination angle $\theta_1$ on the bottom face side and the second inclination angle $\theta_2$ on the top face side. FIG. 18F shows a partially enlarged view of a boxed part by a dotted line in FIG. 18D. As described above, there may be a case where notch 27a is formed on the periphery of the valley $20b_2$ between the protrusions 20 in the second step. The notch 27a may lead to abnormal growth of a semiconductor. After the third step, however, the notch 27a is smoothed into smooth notch 27b as shown in FIG. 18F. Thus abnormal growth of the semiconductor is suppressed.

In the third step, etching is performed while exposing a part of the top face 20t of the protrusion, the side face of the protrusion and the portion between the protrusions after at least the first and second sloped surfaces 22, 23 have been formed on the side face of the protrusion 20, so as to form the side face of the protrusion 20 into a convex surface 26. At this time, side face 26 of the protrusion 20 is preferably formed in such a configuration as the inclination angle $\theta_2$ on the top face side is smaller than the inclination angle $\theta_1$ on the bottom side ($\theta_1 > \theta_2$). Also, it is preferable to make inclination angle $\theta_{m3}$ of an entire side face of the protrusion 20 smaller than the inclination angle $\theta_{m2}$ of the sloped surface of the protrusion 20 formed after the second step ($\theta_{m2} > \theta_{m3}$), as shown in FIG.

18E and FIG. 18F. Making the inclination angle $\theta_{m3}$ smaller is advantageous for making the notch 27a smoother.

The inclination angle $\theta_m$ of the entire side face of the protrusion 20 can be made progressively smaller ($\theta_{m1} > \theta_{m2} > \theta_{m3}$) through three etching steps of the first through third steps as described above. In the side face of the protrusion thus obtained, the inclination angle $\theta_2$ on the top face side becomes smaller than the inclination angle $\theta_1$ on the bottom side. These are preferable because the side face of the protrusion having such a configuration further suppresses occurrence of voids, crystalline defects and surface pits in a semiconductor crystal that is grown over the protrusions and provides better properties of the semiconductor device.

While the above description has dealt with inclination angle $\theta$ of the side face of the protrusion 20, discussion may also be based on a ratio of length $L_t$ of the top face of the protrusion and the length $L_b$ of the bottom of the protrusion. Ratio of bottom length to the length of top face ($L_{b1}/L_{t1}$) in the first step is preferably smaller than the ratio of lengths in the second step ($L_{b2}/L_{t2}$) (($L_{b1}/L_{t1}$)<($L_{b2}/L_{t2}$)). Similarly, relationship (($L_{b2}/L_{t2}$)<($L_{b3}/L_{t3}$)) preferably holds between the second step and the third step. This results in larger spacing between top faces of the protrusions, so as to allow satisfactory crystal growth of the semiconductor in a space between the protrusions, resulting in better crystal growth of a semiconductor.

The multi-step etching process described above achieves a smooth side face of a recess or protrusion. In the first step, rough side face 22a having notches formed thereon is likely to be formed because of accuracies of etching and masking (FIG. 4B, FIG. 4C). The subsequent second step and third step of etching are performed with at least a part of the top face 20t of the protrusion exposed, and therefore the notches 24 formed on the side face of the protrusion are smoothed. For example, in the second step, an edge of the top face 20t of the protrusion 20 and corners of the notch 24 formed on the side face of the protrusion 20 are etched with preference. As a result, sharp edges are rounded as if chamfered. Thus, as shown in FIG. 4A and FIG. 5A, the second sloped surface 23 is formed on the side face of the protrusion 20 and, at the same time, the first sloped surface 22 is smoothed. At this time, as shown in FIG. 2D and FIG. 18F, the inclination angle $\theta_m$ of the entire side face of the protrusion also decreases. Further in the third step, an angular joint between the first sloped surface 22 and the second sloped surface 23 is rounded, and notch 27a formed on the periphery of the base of the protrusion 20 in the second step is smoothed.

While the example described above dealt with a case where the protective film 25 is removed during the first step or the second step, timing of removing the protective film 25 can be selected as required. It is preferable to remove the protective film 25 simultaneously during an etching process to form a protrusion, since it eliminates a separate process of removing the protective film. In case the protective film 25 is left to remain in the first step, this remaining protective film 25 makes it easier to form the second sloped surface in a second etching step. The protective film 25 left to remain in the first step can also protect the top face 20t of the protrusion during the second step. Further in the second step, the protective film 25 may be left to remain so as to be removed in a third etching step. The protective film may further be left to remain in the third step. In the first to third steps, the protective film may also be left in a shape that is suitable for a respective step in order to obtain a desired shape of the protrusion or recess (particularly a side face shape).

The side face of the protrusion 20 is formed preferably in a shape protruding (swelling) outwardly as shown in FIGS. 2D, 4A, 5A, 15 and 18C. For example, the side face of the protrusion 20 is formed from the first sloped surface 22 on the bottom side and the second sloped surface 23 on the top face side. More preferably, such a side face 26 is formed that consists of the first sloped surface 22 and the second sloped surface 23 which are connected smoothly as shown in FIG. 18D.

In the manufacturing method described above, a plan-view configuration of the protrusion 20 may be selected as required, such as triangle, polygon, circle or the like. In case the plan-view configuration of the protrusion 20 has a sharp corner, a significant change in the shape can be caused during the multi-step etching operation, leading to significant variability in shapes of the protrusions among wafers or within a wafer, resulting in lower yield of production. The plan-view configuration of the protrusion 20 having a sharp corner has a disadvantage also with respect to crystal growth. That is, a nitride semiconductor grown on top face 20t of a protrusion of the substrate has hexagonal crystal structure. In case the plan-view configuration of the protrusion is a triangle as shown in FIG. 19D, a gap is produced between the hexagonal semiconductor crystal and the triangular top face of the protrusion, thus making the semiconductor crystal likely to grow unevenly. Uneven growth of the semiconductor crystal increases a chance of abnormal growth such as pits when islands of a semiconductor crystal join with each other to form a layer. In case the plan-view configuration of the protrusion is a circle as shown in FIGS. 19A through 19C, on the other hand, a gap between the hexagonal semiconductor crystal and the edge of the top face of the protrusion becomes smaller, thus making segregation of the semiconductor crystal less likely to occur. As a result, a semiconductor can be grown with abnormal growth, such as pits, being suppressed. Therefore, it is preferable that the plan-view configuration of the protrusion 20 (particularly the top face) does not have sharp corners. The shape is, for example, a polygon having vertices of right angles or obtuse angles (for example, a polygon having at least four vertices), preferably a polygon having rounded vertices, more preferably an ellipse, and most preferably a circle.

[Arrangement of Recesses/Protrusions]

FIGS. 19A through 19D show examples of an arrangement of protrusions. The arrangement of the protrusions is preferably as follows. A circle 31 sandwiched between adjacent protrusions 20 and circumscribed with peripheries of bases of these protrusions 20 is referred to as a first circle. A circle 32 that is circumscribed with peripheries of bases of at least three protrusions 20, and preferably has a largest diameter in a region between the protrusions 20 is referred to as a second circle. A diameter of second circle 32 is larger than that of first circle 31. A circle 33 sandwiched between adjacent protrusions 20 and circumscribed with peripheries of top faces of these protrusions 20 is referred to as a third circle. The protrusions 20 are preferably arranged so that a diameter of third circle 33 becomes larger than that of the second circle 32.

In the example shown in FIG. 19A, for example, circles of which diameters are shortest line segments that connect the bases of two protrusions 20 are referred to as the first circle 31, and shortest line segments that connect the bases of two top faces are referred to as the third circle 33. In a region surrounded by three protrusions 20, a circle that is circumscribed with the peripheries of the bases of the three protrusions 20, and has a largest diameter in the region between the protrusions is taken as the second circle 32. Diameters of the first circle $R_1$, the second circle $R_2$ and the third circle $R_3$ satisfy the relation $R_3>R_2>R_1$. Crystal quality will be better when this relation is satisfied.

FIG. 19B shows a semiconductor crystal grown to a height halfway up the protrusion 20 on a substrate 10 of FIG. 19A. Semiconductor crystal 42 grown from a region between the protrusions 20 and semiconductor crystal 41 grown from the top face 20t of the protrusion are shown. As can be seen from FIG. 19B, since the protrusions are disposed at a distance from each other, islands of crystal 41 on the top faces of the protrusion grow in a direction of thickness and in a lateral direction as well so as to approach each other. Therefore, the islands of semiconductor crystal 41 growing from the top faces of the protrusions eventually join with each other as growth proceeds, as indicated by growth prediction circles of dashed lines in FIG. 19D. On the other hand, the semiconductor crystal 42 growing from the region between the protrusions 20 grows in a direction of thickness. If the islands of semiconductor crystal 41 growing from the top faces of the protrusions join with each other before thickness of the semiconductor crystal 42 reaches the height of the protrusion, voids are generated. Therefore, occurrence of voids can be suppressed by increasing a distance between protrusions 20. However, in order to ensure an effect of the substrate with recesses/protrusions to extract light, it is preferable to dispose the protrusions 20 as dense as possible. Therefore, it is advantageous to prevent voids and other crystalline defects from occurring while increasing density of the protrusions.

According to the present invention, protrusions having inclined side faces are provided. Thus, a surface area of the semiconductor crystal 42 growing from the region between the protrusions increases as thickness thereof increases. Also, an area surrounded by the top faces of the protrusions increases. The two conditions described above (high density of protrusions and large distance between protrusions) can be satisfied at the same time. Particularly as shown in FIGS. 17A and 17B, when the side face of the protrusion is formed to protrude outwardly, semiconductor crystal 41 grown from the top face of the protrusion and semiconductor crystal 42 grown from the region between the protrusions grow favorably, and it is made possible to prevent occurrence of abnormal growth and voids. FIGS. 17A and 17B are schematic sectional views showing a semiconductor crystal grown halfway up the protrusion 20 on the substrate, showing a part of the cross section of FIG. 19B.

In FIGS. 19B through 19D, the crystal 41 grown on the top face 20t of the protrusion is indicated with a hexagon, in order to illustrate a typical form of a nitride semiconductor. The present invention can be applied to a case where the crystal grows in other forms. In particular, the present invention can be preferably applied to a system where the crystal grows relatively isotropically.

FIG. 19C shows a case where the protrusions are disposed in an arrangement different from that of FIG. 19A. FIG. 19C shows the semiconductor crystal that has been grown halfway up the protrusion 20, similarly to FIG. 19B. In the example shown in FIG. 19A, axes 51 and 52 that connect the centers of adjacent protrusions 20 intersect with each other at about 60°, while the protrusions are located at substantially equal spacing on vertices of equilateral triangles. Arrangement of the protrusions in FIG. 19B is a periodically repeated pattern of parallelogram (dashed line 53 in the drawing) as a unit in the directions of the axes 51, 52. In FIG. 19C, axes 51 and 52 that connect the centers of adjacent protrusions 20 intersect with each other perpendicularly, while the protrusions are located at substantially equal spacing on vertices of squares. Arrangement of the protrusions in FIG. 19C is a periodically repeated pattern of square (dashed line 53 in the drawing) as a unit in the directions of the axes 51, 52.

In FIG. 19C, when circles of which diameters are shortest line segments that connect bases and top faces of two protrusions 20 are taken as first circle 31 and the third circle 33, respectively, the first circle 31 and the third circle 33 are concentric with a center located at a middle point of a line segment that connects centers of the two protrusions. A circle (second circle 32) that has a larger diameter in a region between the protrusions is a circle that is circumscribed with peripheries of bases of four protrusions. In FIG. 19C, too, diameters $R_1$, $R_2$ and $R_3$ of the first circle, the second circle and the third circle, respectively, satisfy the relation $R_3>R_2>R_1$.

In FIG. 19C, with a circle that is circumscribed with the peripheries of the bases of the four protrusions taken as the second circle 32, the protrusions may also be arranged so as to satisfy the relation $R_3>R_2>R_1$. This improves a quality of crystal growth.

The embodiments shown in FIG. 19B(A) and FIG. 19C have common features as follows. First, consider a perpendicular bisector of a line segment that connects centers of two protrusions 20 that are circumscribed with the second circle 32 having a larger diameter. Then centers of the first, second and third circles lie on the perpendicular bisector. Second, the second circle 32 intersects with the third circle 33 that is interposed by the protrusions 20 that are circumscribed with the second circle 32. An arrangement having these two features is preferable because it causes favorable changes in an area and in shape of crystal 42 growing from the region between the protrusions in the course of growth, thus enabling to be obtained a light emitting element having excellent crystallinity.

FIG. 19D shows an example where protrusions 20 having a triangular shape in plan view are arranged. In FIG. 19D, axes 51 and 52 of a periodical structure of protrusions intersect with each other at about 120°. A unit of the periodical structure is a rhombic cell indicated by dashed line 43. Sides that constitute each protrusion 20 are parallel to sides that constitute adjacent protrusions 20, with narrow paths formed between adjacent sides. There are first circle 31 and third circle 33 on the path. Circumscribed with six protrusions is second circle 32. In contrast to the arrangements shown in FIG. 19B and FIG. 19C, the second circle 32 and the third circle 33 are spaced from each other. The first through third circles in overlapping relationship are selected as follows. First, of the plurality of protrusions that are circumscribed with the second circle, two adjacent ones are selected and the first circle and the third circle interposed by the two protrusions are considered. For the first circle 31 and the third circle 33, those which are located furthest from adjacent second circles 32 (in FIG. 19D, the second circles 32 located at both ends of the side of the triangle) are taken. In FIG. 19D, for example, the first circle 31 and the third circle 33 have centers located on a line segment that connects middle points of the sides of the protrusion. The same overlapping configuration applies also to the cases of FIG. 19A and FIG. 19C.

In FIG. 19D, diameters $R_1$, $R_2$ and $R_3$ of the first, second and third circles satisfy the relation $R_2=R_3$ and $R_2>R_1$. As shown in FIG. 19D, in case the first and third circles are included in the narrow path and the second circle and the third circle do not overlap each other, islands of semiconductor crystal 41 growing from the top faces of the protrusions may join with each other before semiconductor crystal 42 growing from a region between the protrusions reaches the top faces of the protrusions. If this happens, voids are likely to occur in region 44 enclosed by dashed line in FIG. 19D. Even if a diameter of the second circle 32 is increased for a purpose of preventing occurrence of voids, growth in the second circle 32 becomes faster than growth in the first circle 31, and this difference in growth rate within a plane may increase a chance of voids to occur, contrary to an intention. This is because, in case the second circle 32 and the third circle 33 do not overlap each other, growth of crystal in around a center of the narrow path (around a center of the first circle 31, region indicated by dashed line 44) tends to lag behind crystal growth in the second circle 32. As a result, the region enclosed by dashed line 44 in FIG. 19D can be blocked not only at the top by crystal 41 that has grown from the top face of the protrusion, but also on a side by a crystal grown from a region of the second circle 32. This may results in occurrence of voids.

Crystallinity of a semiconductor that grows on a substrate having recesses and/or protrusions depends also on an arrangement of the protrusions (or recesses) on a substrate surface. It is preferable to set a plan-view configuration and arrangement of the protrusions so that a narrow path is not formed between the protrusions as shown in FIG. 19A, 19C. By disposing the protrusions in such an arrangement as diameters of the first, second and third circles satisfy the relationships described above, and preferably the second circle and the third circle overlap each other, it is made possible to further improve crystallinity of a semiconductor and obtain a better semiconductor element.

While description in this specification is focused on a case of forming protrusions on a substrate, description is applicable to a case of forming recesses in a substrate as well. Those skilled in the art should be able to interpret the description in order to understand this variation.

BRIEF DESCRIPTION OF THE DRAWINGS

FIG. 4A is a perspective view showing an example of pattern of protrusions in an embodiment of the present invention, and FIGS. 4B and 4C are perspective views showing examples of pattern of protrusions in case the side face of protrusion consists of a single sloped surface of the same angle of inclination.

FIGS. 8A through 8C are diagrams showing variations of the configuration of p-side ohmic electrode.

FIGS. 9A through 9D are diagrams showing other variations of the configuration of p-side ohmic electrode.

FIGS. 18A through 18G are schematic sectional views showing manufacturing process for the substrate according to an embodiment of the present invention.

As described above, according to the present invention, undesirable light propagation in a light emitting device can be suppressed by forming recesses and/or protrusions in and/or on a substrate surface, which results in an improved light extracting efficiency. Also, occurrence of pits or voids due to the recesses and/or protrusions can be suppressed. Therefore, a high-performance semiconductor device can be provided.

DETAILED DESCRIPTION OF THE PREFERRED EMBODIMENTS

Figure 1:
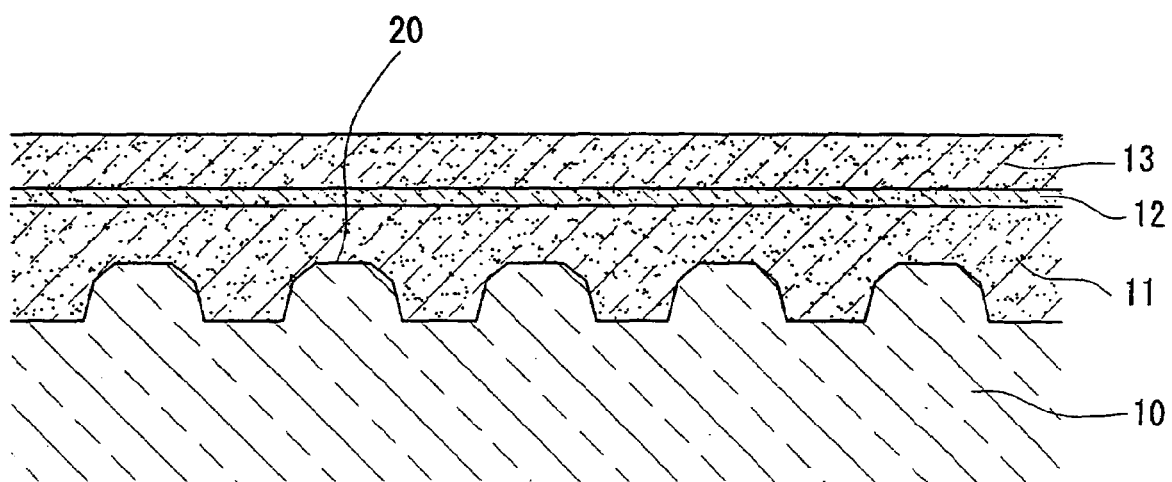
FIG. 1 is a cross sectional view showing an embodiment of a semiconductor device according to the present invention.

Now the present invention will be described in detail with reference to the accompanying drawings. FIG. 1 shows a preferred embodiment of a semiconductor device according to the present invention, wherein an n-type semiconductor layer 11, an active layer 12 and a p-type semiconductor layer 13 are formed successively on a substrate 10. The substrate 10 has protrusions 20 formed in a repetitive pattern on a surface thereof.

Height of protrusion 20 (depth of recess if a space between two protrusions is regarded as a recess) is preferably in a range from 0.1 μm to 2 μm inclusive. Length "a" of one side of the protrusion 20 if it is a polygon, or diameter of the protrusion if it is a circle, is preferably in a range from 1 μm to 10 μm inclusive. Distance between adjacent protrusions 20 is preferably in a range from 1 μm to 10 μm inclusive.

Figure 2A:
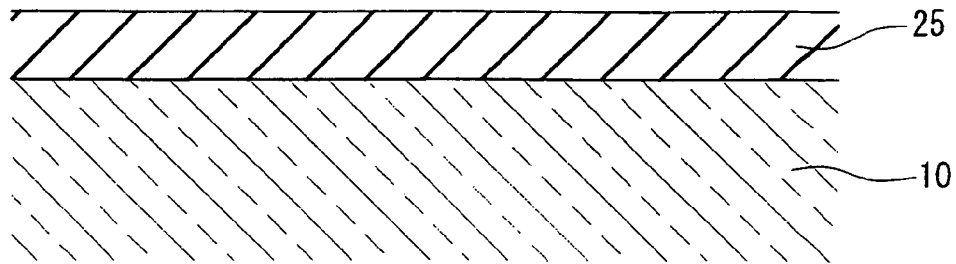
FIGS. 2A through 2E are diagrams showing a process of manufacturing the semiconductor device shown in FIG. 1.

A process of manufacturing the semiconductor device shown in FIG. 1 will now be described with reference to FIGS. 2A through 2E. First, as shown in FIG. 2A, a protective film 25 is formed as an etching mask on the substrate 10. The substrate 10 may be made of sapphire, Si, SiC or the like.

Figure 2B:
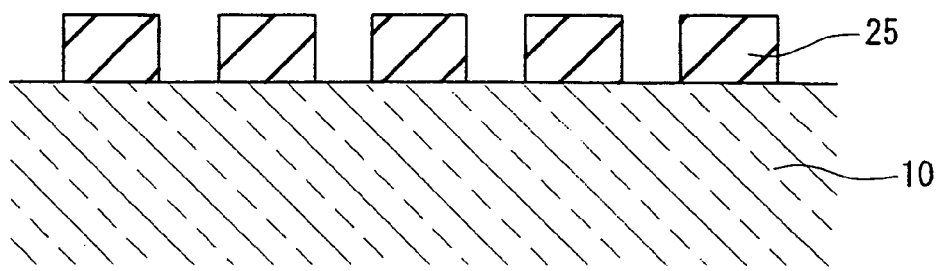
Figure 7A:
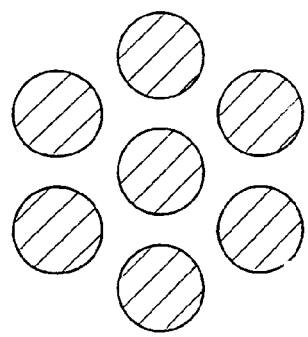
FIGS. 7A through 7H are perspective views showing other examples of pattern of recess or protrusion.
Figure 7B:
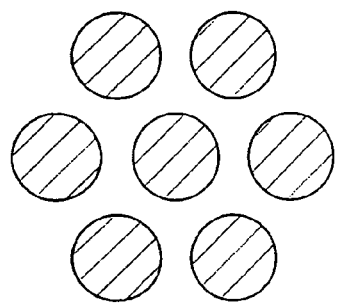
Figure 7C:
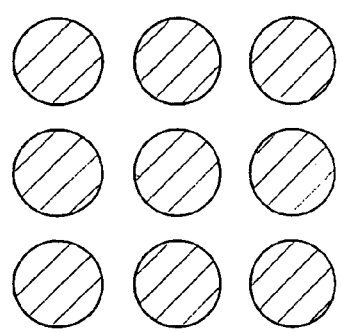
Figure 7D:
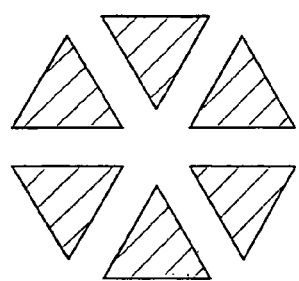
Figure 7E:
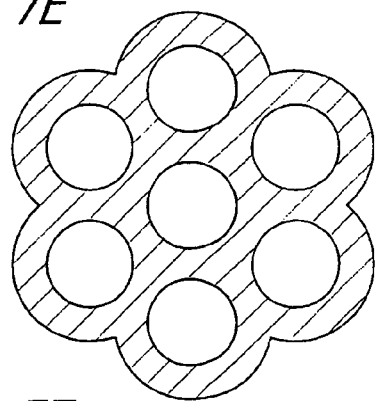
Figure 7F:
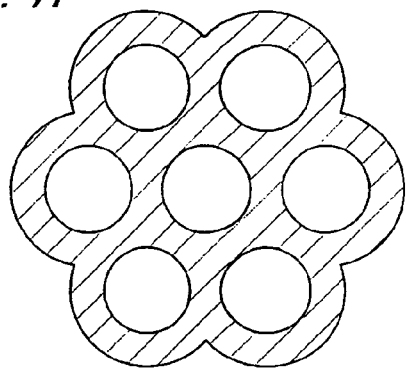
Figure 7G:
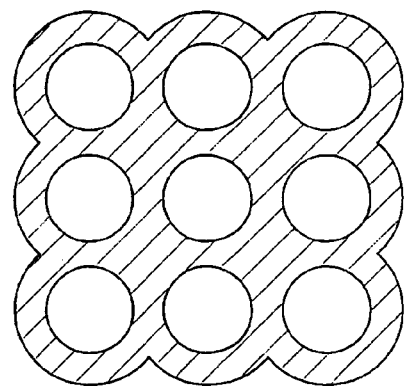
Figure 7H:
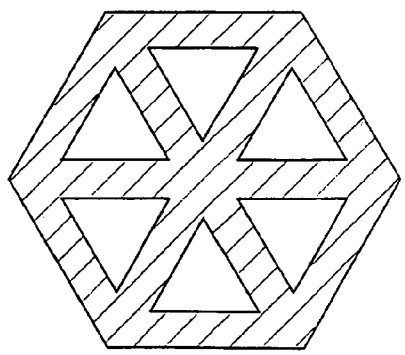

Then as shown in FIG. 2B, the protective film 25 is formed into a pattern. The pattern of the protective film 25 in plan view may be, for example, as shown in FIGS. 7A through 7H (hatching in FIGS. 7A through 7H indicates a region where the protective film is formed). FIGS. 7A through 7D show examples of the protective film when protrusions are formed on the substrate. When recesses are formed in the substrate, the protective film may be formed in the patterns shown in FIGS. 7E through 7H. When the recesses or the protrusions are formed in a circular or polygonal shape, it is preferable to arrange them in a hexagonal pattern in order to reduce pits. In the example shown in FIG. 2B, the protective film is formed in a circular pattern as shown in FIG. 7A.

Figure 2C:
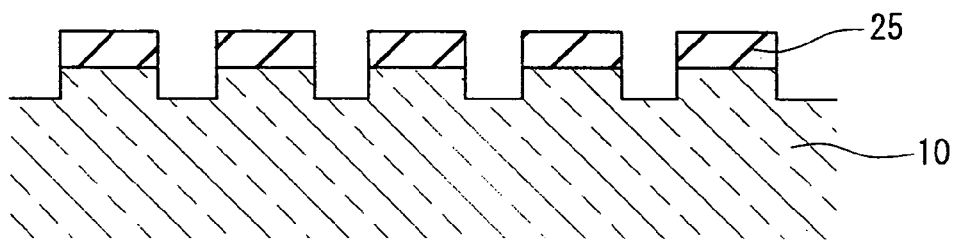

Then as shown in FIG. 2C, a portion of a surface of the substrate 10 exposed through the protective film 25 is etched. At this time, the protective film 25 is also etched to some extent. Either dry etching or wet etching may be employed in this etching process. Among these, dry etching is preferable. Specifically, gas phase etching, plasma etching, reactive plasma etching (such as RIE, magnetron RIE), ECR plasma etching, sputter etching, ion beam etching and photo-etching may be performed. Reactive ion etching (RIE), above all, is preferably used. For an etching gas, a $Cl_2$ compound or an F compound such as $Cl_2$, $SiCl_4$, $BCl_3$, HBr, $SF_6$, $CHF_3$, $C_4F_8$ or $CF_4$ can be used. An inert gas such as Ar may also be used. During first and second steps of etching, a gas having high selective etching capability for the substrate and the mask is preferably used, such as a mixture gas of $SiCl_4$ and $Cl_2$, in a case of a sapphire substrate and mask made of $SiO_2$. During a third step, a gas having selectivity different from that of the second step, preferably a gas having lower selectivity is used, for example $CF_4$, $CHF_3$ or Ar can be used. After etching the exposed portion of the surface of the substrate, the protective film is removed and the substrate is etched further. This results in formation of the protrusions 20 having two sloped surfaces in the surface of the substrate 10. Instead of this method, the protrusions 20 having two sloped surfaces may also be formed by continuing the etching after the protective film has been completely removed in the process shown in FIG. 2C. The protrusions 20 having two sloped surfaces may also be formed by changing an etching rate or apparatus amid the course. Recesses having two sloped surfaces may be formed by changing the etching rate or performing another method. For example, after etching the substrate to some extent, etching may be continued with a slower etching rate, so as to form recesses having two sloped surfaces.

Figure 2D:
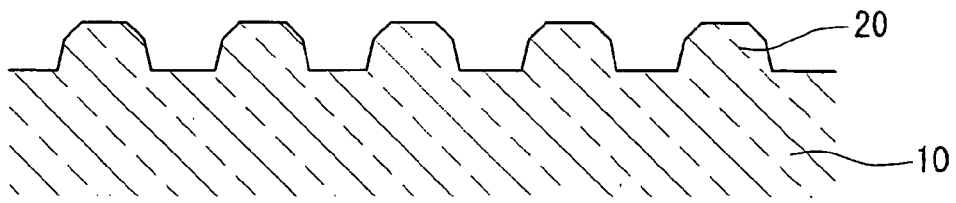
Figure 2E:
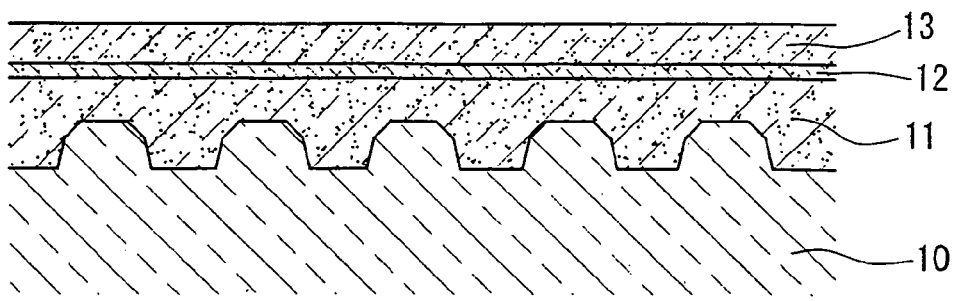

Then as shown in FIG. 2E, the n-type semiconductor layer 11, the active layer 12 and the p-type semiconductor layer 13 are formed successively one on another in this order on the substrate 10 whereon the protrusions 20 are formed in an ordered pattern.

Figure 14:
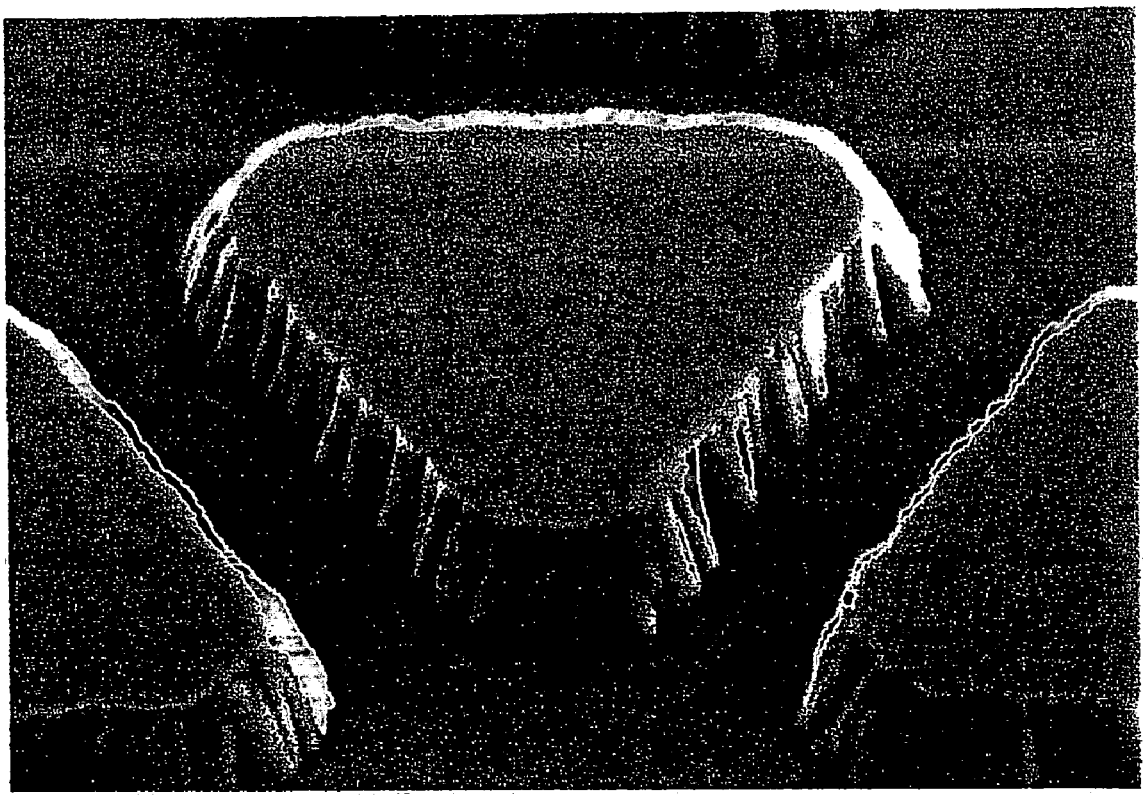
FIG. 14 is an SEM photograph of a protrusion.

Growth of a semiconductor, including a GaN semiconductor, on a substrate is significantly affected by a surface condition of the substrate. In case a side face (sloped surface) of a protrusion is formed in one step as shown in FIG. 5B, significant notches are formed in the side face of the protrusion along the slope as shown in an SEM photograph of FIG. 14. This situation is schematically shown in FIG. 4B and FIG. 4C. Presence of the notches increases a possibility of voids to be generated when growing the semiconductor. This is because not only surface roughness of the side face is different between adjacent protrusions 20, but also there is significant difference in the surface roughness within a single protrusion. In consequence, a semiconductor grows at different rates near the side face of the protrusion, fast at one point and slowly at another, so that the semiconductor grown at a fast growing point spreads over a slow growing point. As a result, voids can easily develop in the semiconductor.

Figure 5A:
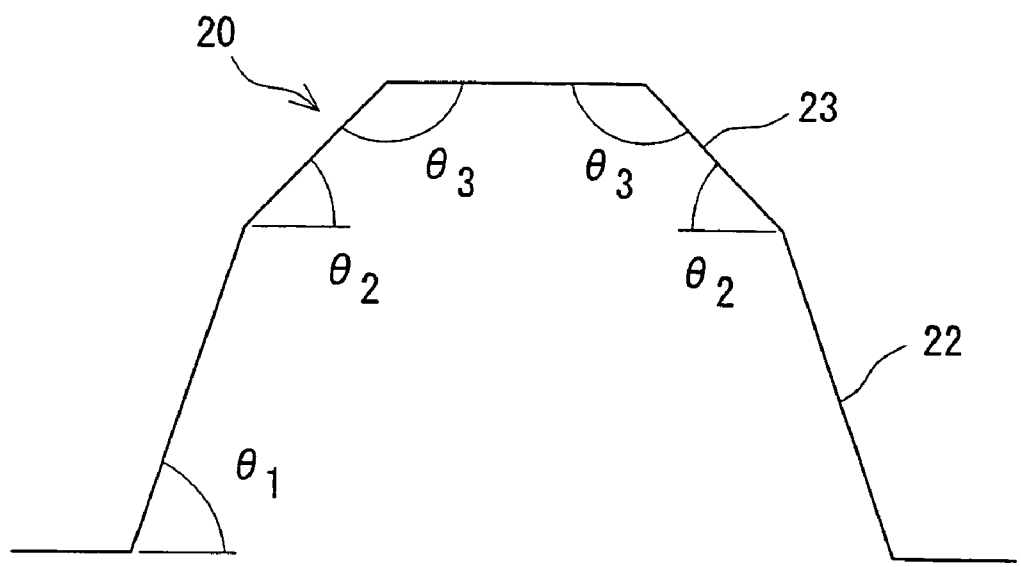
FIG. 5A is a sectional view showing an example of pattern of protrusions in an embodiment of the present invention.
Figure 5B:
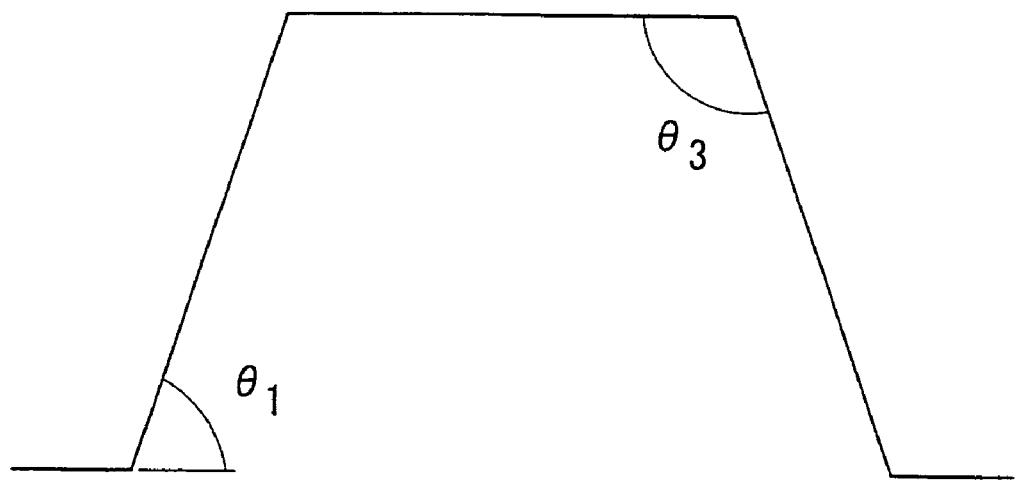
FIG. 5B is a sectional view showing an example of pattern in case the side face of protrusion consists of a single sloped surface of the same angle of inclination.
Figure 12:
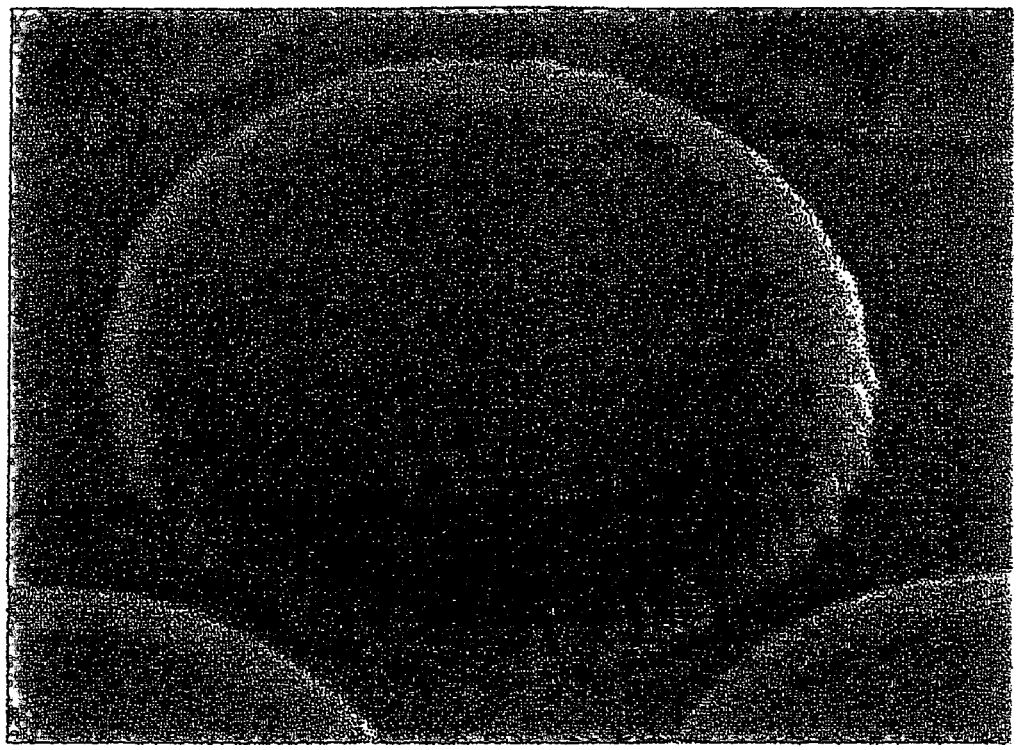
FIG. 12 is an SEM photograph of a protrusion according to an embodiment of the present invention.

In this embodiment, in contrast, the side face (sloped surface) of the protrusion is formed in two steps as shown in FIG. 5A. Therefore, while a first sloped surface 22 near the substrate includes some notches, a second sloped surface 23 located above is almost free from notches, as shown in FIG. 12. This situation is schematically shown in FIG. 4A, which is a perspective view showing the protrusion 20 schematically. The first sloped surface 22 and the second sloped surface 23 are formed in this order from a bottom of the substrate. Although the first sloped surface 22 includes some notches 24, the second sloped surface 23 is almost free from notches. Thus in this embodiment, generation of voids is suppressed by the second sloped surface 23 that is free from notches.

Then a device forming process is performed with an electrode formed, so as to finish an LED chip. Holes and electrons are injected from the n-type semiconductor layer 11 and the p-type semiconductor layer 13 into the active layer 12, where both charges recombine thereby to emit light. The light is extracted through the sapphire substrate 10 or the electrode formed on the p-type semiconductor layer 13.

Figure 3A:
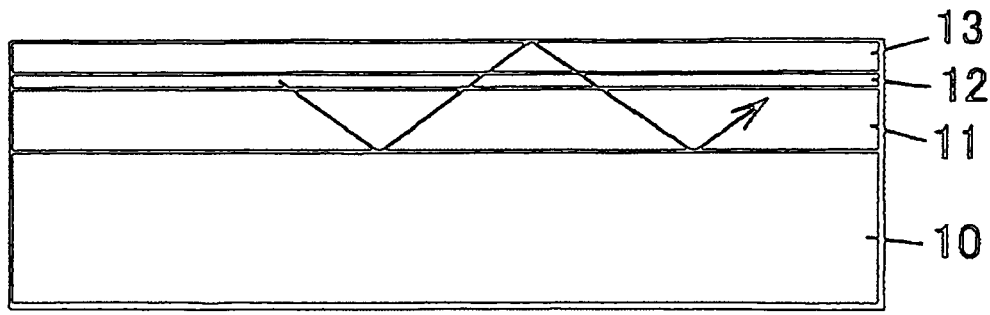
FIGS. 3A through 3D are diagrams schematically showing the propagation of light according to the present invention in comparison to the prior art.

In the case of a semiconductor light emitting device of the prior art having a flat substrate, as shown in FIG. 3A, light that is generated in the active layer 12 and is incident on an interface between the p-type semiconductor layer 13 and the electrode or on an interface between the n-type semiconductor layer 11 and the substrate 10, with an angle of incidence equal to or larger than a critical angle, is captured within a waveguide so as to propagate laterally.

Figure 3B:
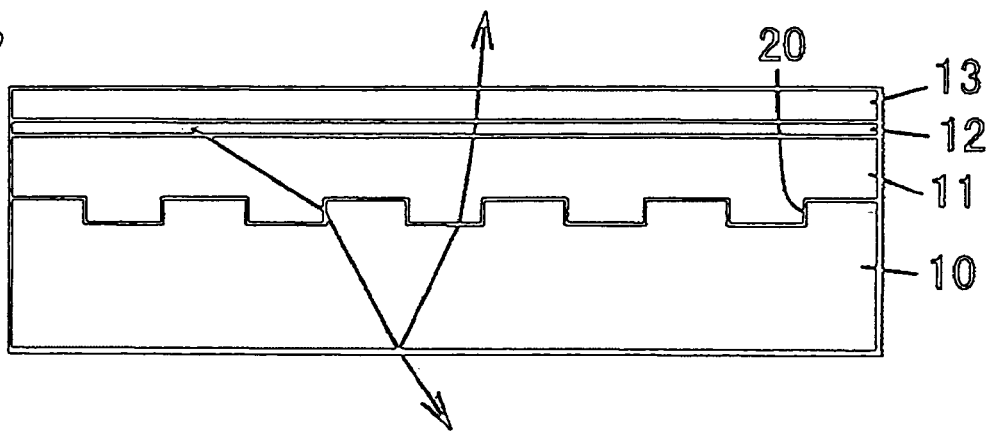
Figure 3C:
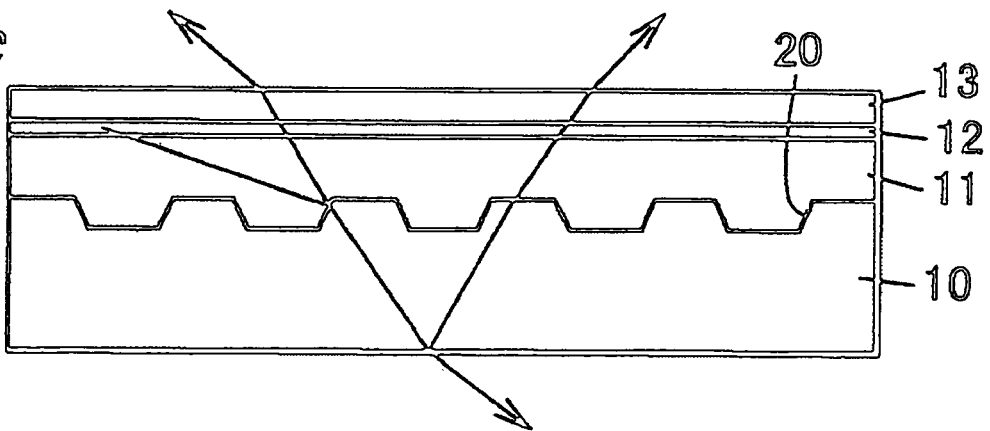
Figure 3D:
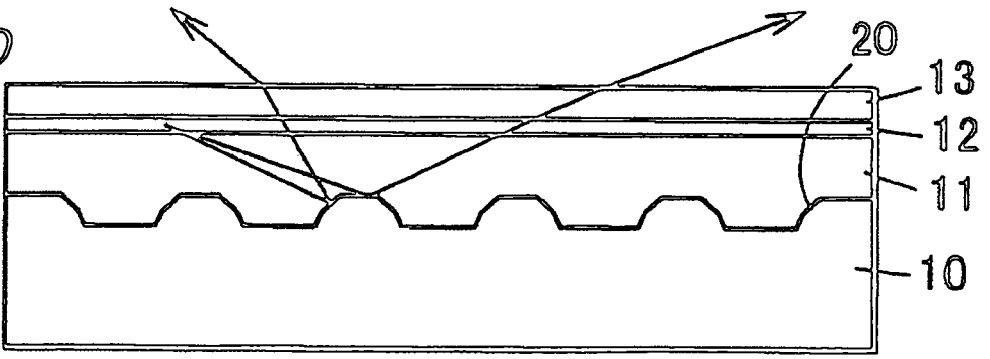

In case the protrusions 20 are formed on the surface of the substrate 10 as shown in FIG. 3B or FIG. 3C, light that is incident on the interface between the p-type semiconductor layer 13 and the electrode or on the interface between the n-type semiconductor layer 11 and the substrate 10, with an angle of incidence equal to or larger than the critical angle, is scattered or diffracted. Most of this scattered or diffracted light is incident on the interface between the p-type semiconductor layer 13 and the electrode or on the interface between the n-type semiconductor layer 11 and the substrate 10 with an angle of incidence smaller than the critical angle, and can be extracted outside. In case the side face of the protrusion 20 is formed from a sloped surface with a single angle of inclination as shown in FIG. 3B or FIG. 3C, however, voids are likely to be generated in the semiconductor layer 11. When voids are generated in the semiconductor layer, crystallinity of the semiconductor becomes lower and quantum efficiency decreases. In this embodiment, for this reason, the side face of the protrusion is formed from two sloped surfaces of different angles of inclination so as to suppress generation of voids, as shown in FIG. 3D. This constitution makes it possible to efficiently extract light that has been generated in the active layer and improve the crystallinity of the semiconductor, thereby providing a semiconductor device of higher output power.

In case a contact electrode provided on the p-type semiconductor layer 13 is a transparent electrode, the device is mounted face up but, in a case of a reflecting electrode, the device is mounted face down. The present invention is effective in either mode of mounting. Even in the case of the reflecting electrode, the device can be mounted face up when the electrode has an opening or notch. In this case, too, the present invention achieves a conspicuous effect.

The embodiment described above is an example where the protrusion 20 has a circular shape in plan view, although the protrusion 20 may also be formed in a polygonal shape. In case the substrate 10 is made of sapphire and the semiconductor 11 is made of GaN, the GaN grows with an offset angle of 30 degrees from a lattice of the sapphire substrate. Therefore, it is preferable to form the protrusion 20 on the sapphire substrate 10 in such a shape as follows. Shape of the protrusion 20 in plan view is a polygon that has sides substantially parallel to A planes (11-20), (1-210) and (-2110) of GaN and vertices in stable growth planes (1-100), (01-10) and (-1010) of GaN. This polygon does not have any side that is parallel to the stable growth planes (1-100), (01-10) and (-1010) of GaN, namely an M-plane. By forming the protrusion 20 of such a shape, it is possible to grow a flat GaN layer with high crystallinity.

Specifically, in case the protrusion 20 has a shape of an equilateral triangle in plan view, it is preferable to form the equilateral triangle from sides that cross (are not parallel to) the M-plane which is a stable growth plane of GaN, when viewed from above. It is more preferable to form the equilateral triangle from sides that are perpendicular to straight lines connecting a center and vertices of an equilateral hexagon that is defined by planes parallel to an A-axis (more specifically, by intersection lines between the planes and the substrate surface) of a nitride semiconductor as its sides; in other words, an equilateral hexagon that is defined by the A-axis of the nitride semiconductor as its sides. By forming the protrusion 20 of such a shape, it is made possible to grow a flat GaN layer that fills a surrounding of the protrusion 20 with high crystallinity.

This is supposedly because a growing rate of GaN becomes higher in a portion where GaN grown from a top face of the protrusion 20, and GaN grown on a flat surface where the protrusion 20 is not grown, join. While GaN is grown from the top face of the protrusion 20 in a hexagonal crystal structure consisting of sides that are parallel to the A-axis, the growing rate of GaN is higher near the side face of the protrusion 20 where GaN grown from the top face of the protrusion 20 and GaN grown on the flat surface join each other. As a result, growth of GaN near the side face of the protrusion 20 catches up to growth in other regions so that a flat GaN layer is obtained.

Figure 11A:
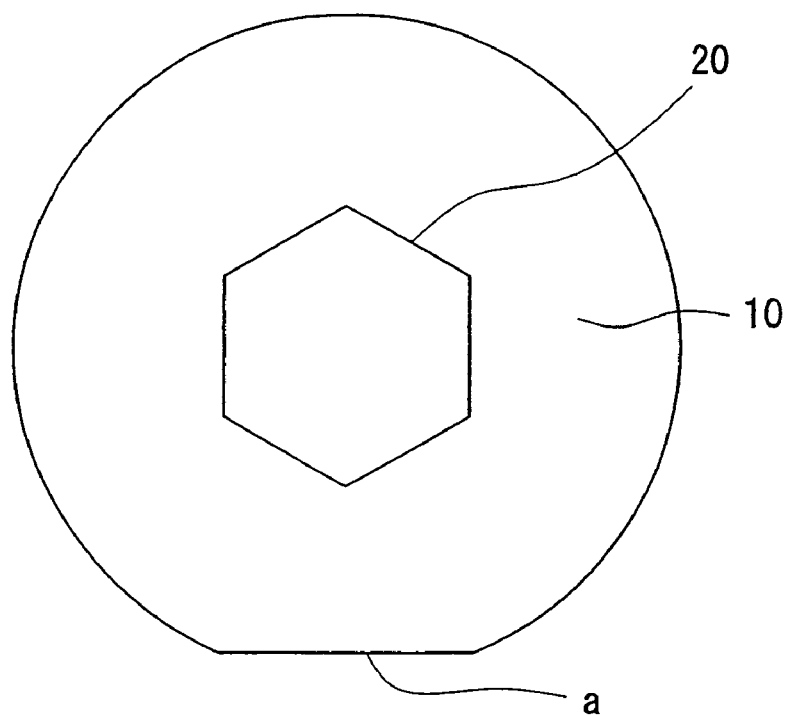
FIGS. 11A and 11B are schematic diagrams explanatory of the direction of arranging the recess or protrusion that are formed in hexagonal shape on a substrate.
Figure 11B:
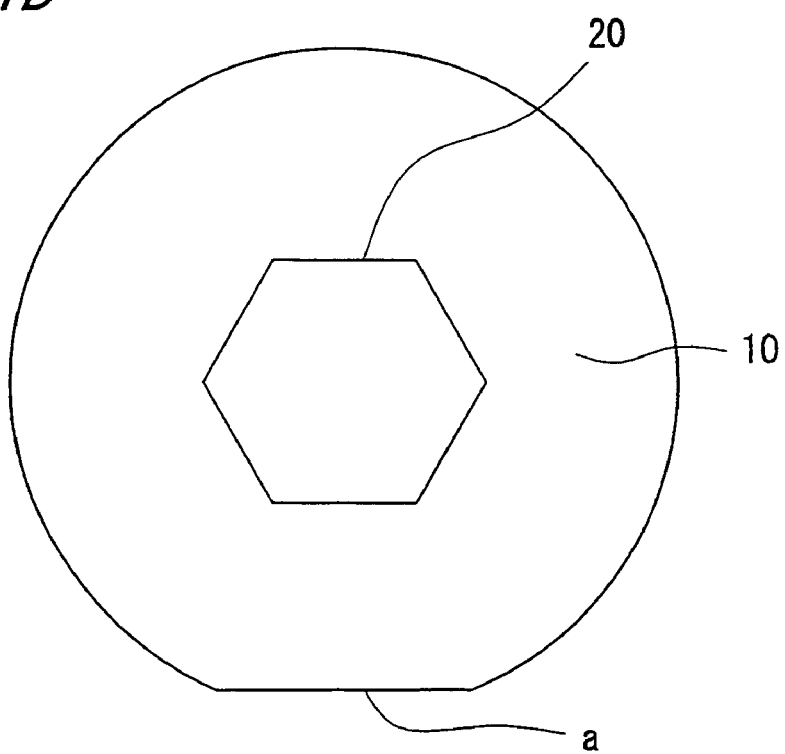

The protrusion 20 may also be formed to have an equilateral hexagonal shape. In this case, if orientation flat "a" of sapphire substrate 10 having principal plane in a C-face lies in an A face, for example, the equilateral hexagonal shape may be arranged in a direction shown in either FIG. 11A or FIG. 11B. In case GaN is grown on the C plane of the sapphire substrate as described previously, the A plane of the sapphire substrate and the M-plane of GaN become parallel to each other. Therefore, it is preferable to arrange a recess or protrusion of an equilateral hexagon as shown in FIG. 11A, in which case sides that constitute the equilateral hexagon cross at right angles to one of the M-planes that are stable growth planes of GaN, when viewed from above the substrate. In other words, this means that the equilateral hexagon is formed from sides that are perpendicular to straight lines that connect the center and vertices of an equilateral hexagon that is defined by M-planes of GaN as its sides, when viewed from above the substrate.

The above embodiments of the present invention will now be described in more detail below.

Embodiment 1

In a first embodiment of the present invention, the side face of the protrusion consists of at least two sloped surfaces (first sloped surface 22, second sloped surface 23) as shown in FIG. 4A and FIG. 5A. An inclination angle $\theta_2$ on a top face side of the protrusion is smaller than an inclination angle $\theta_1$ on a bottom side. The inclination angle $\theta$ is an angle between the side face and a bottom of the protrusion. In case recesses are formed in the substrate, an inner wall of each recess is also formed so that the inclination angle $\theta_2$ of an upper inner wall is larger than an inclination angle $\theta_1$ of a lower inner wall. The inclination angle $\theta_1$ of the inner wall is a complementary angle of angle $\Phi_i$ between the inner wall and a bottom surface of the recess.

$\theta_i = 180° - \Phi_i$ (i=1, 2)

When inclination angle $\theta_3$ is defined as an angle between the top face and the side face of the protrusion, in case the top face is substantially parallel to the substrate surface, angle $\Phi_2$ between the upper inner wall and the bottom surface of the recess is nearly equal to the inclination angle $\theta_3$ of the protrusion. Preferably, the first sloped surface 22 and the second sloped surface 23 are located at the bottom and top of the protrusion and/or the recess, respectively. This makes manufacturing easier, causes a semiconductor layer to grow favorably to near the protrusion and enables to be suppressed occurrence of pits and voids.

Embodiment 2

In a second embodiment of the invention, a side face of the protrusion is formed as a curved surface. In case an entire side face of the protrusion is formed of a single curved surface, a radius of curvature may be made larger on a top face side and smaller on a bottom side.

Alternatively, such a configuration may also be employed as the bottom side being flat, i.e., an upper side of the side face is curved and the lower side is flat. Moreover, a plurality of curved portions and a plurality of flat portions may be formed on the side face of the protrusion. For example, in a structure of the first embodiment where the first and second sloped surfaces are formed, the second sloped surface may be formed as a curved surface with the first sloped surface consisting of a substantially flat surface. A condition of the side face may be selected as required in accordance with substrate material, an etching condition, material of a semiconductor layer and other factors.

Figure 15:
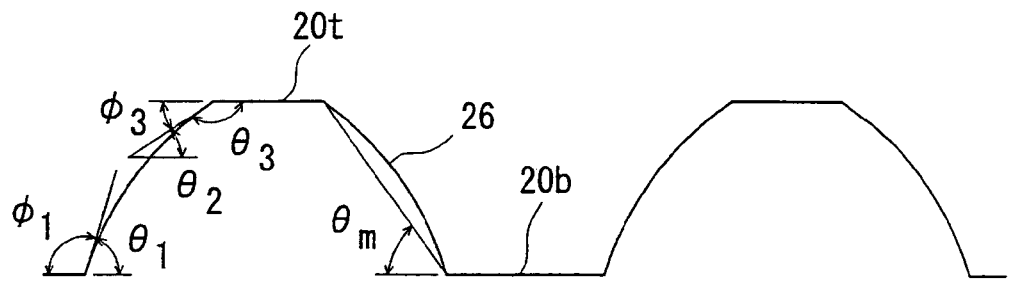
FIG. 15 is a schematic sectional view showing cross section of protrusion in an embodiment of the present invention.

It is preferable to form the entire side face as a curved surface and make inclination angle $\theta_2$ on the top face side of the protrusion smaller than inclination angle $\theta_1$ on the bottom side, as shown in FIG. 15. This configuration makes changes in a shape and surface area of a semiconductor layer growing on the substrate smoother. That is, a better crystal can be grown while suppressing occurrence of abnormal crystal growth. Inclination angle $\theta_m$ can be decreased when the side face is formed as a single curved surface rather than having a partially curved portion or a plurality of curved surfaces. If the inclination angle $\theta_m$ can be decreased, ratio of an area of the side face to an area of the substrate surface can be increased so as to achieve a higher efficiency of extracting light.

Embodiment 3

Structure of Light Emitting Device

Constitution of a semiconductor light emitting device according to the present invention will be described in detail. There are no specific requirements for a size and thickness of the substrate 10 which may be of any constitution as long as it allows epitaxial growth of a semiconductor thereon. The substrate used to grow a nitride semiconductor thereon may be made of an insulating material such as sapphire or spinel ($MgAl_2O_4$) having a principal plane as a C plane, R plane or A plane, or an oxide such as lithium niobate or neodymium gallate that forms a lattice junction with silicon carbide (6H, 4H, 3C), silicon, ZnS, ZnO, Si, GaAs, diamond, or oxide substrates such as lithium niobate or neodymium gallate, which can provide a good lattice match with a nitride semiconductor. A substrate made of a nitride semiconductor such as GaN or AlN may also be used provided that it is thick enough to form devices thereon (over several tens of micrometers). A substrate made of different material may be cut with an offset angle. If a C plane of sapphire is used, the offset angle is preferably in a range from 0.01° to 3.0°, and more preferably from 0.05° to 0.5°.

Figure 6:
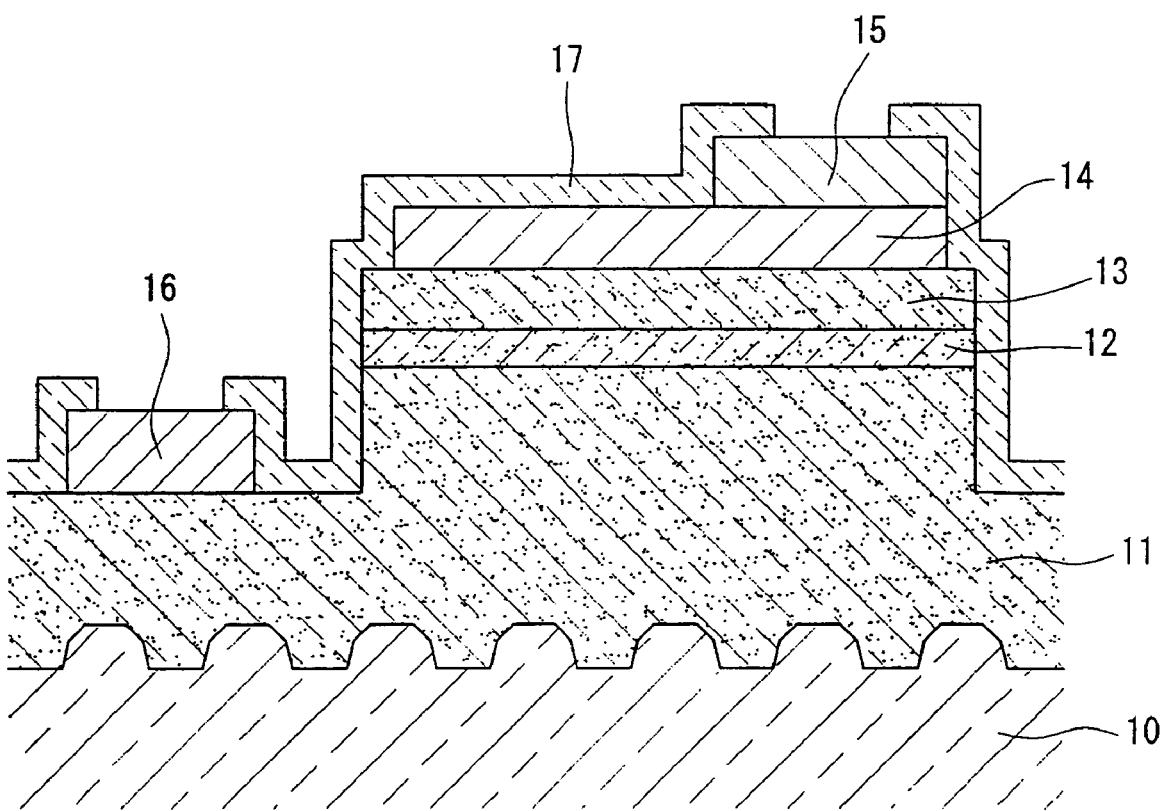
FIG. 6 is a cross sectional view showing a semiconductor device according to an embodiment of the present invention.
Figure 25A:
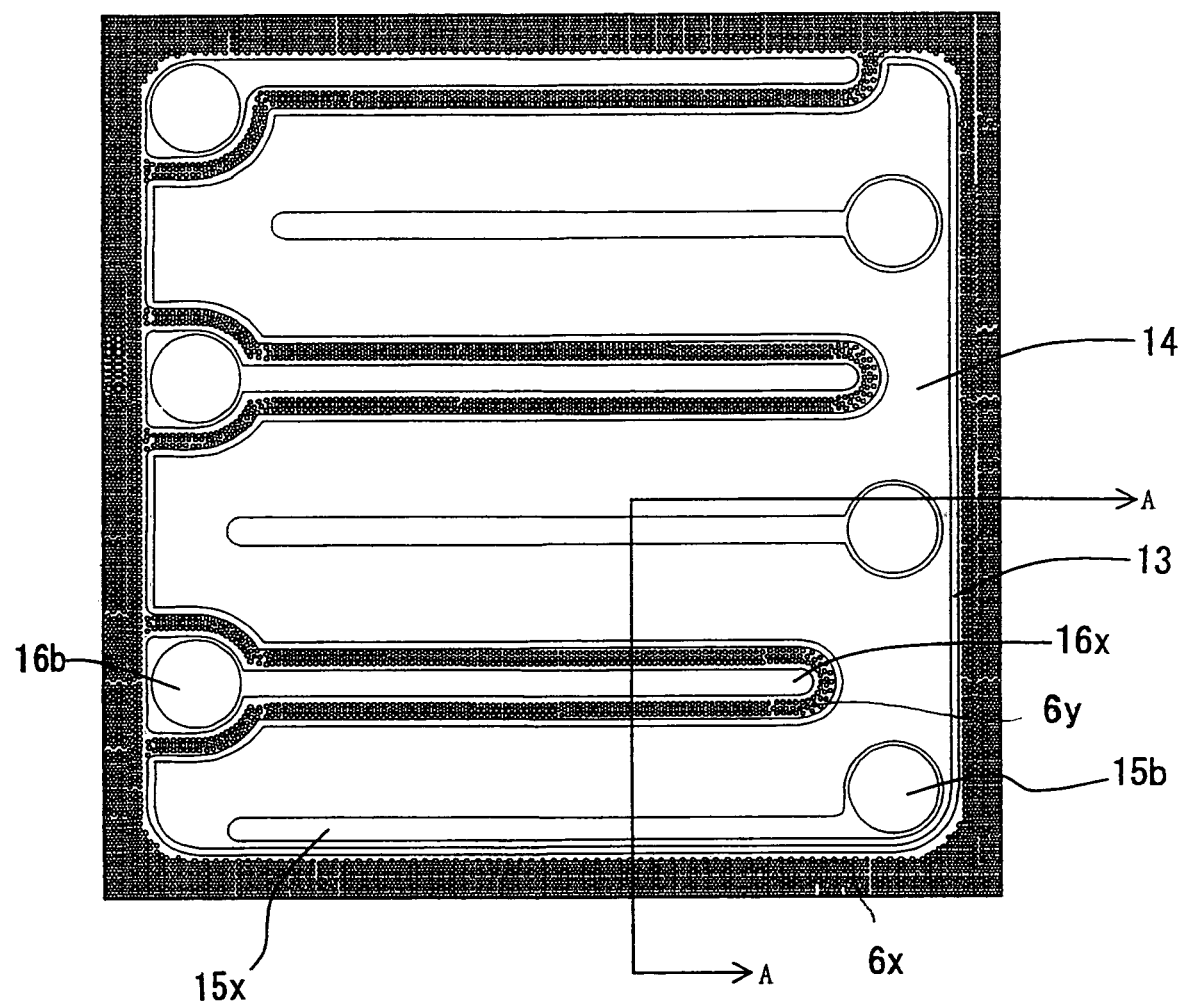
FIGS. 25A and 25B are a top view showing the light emitting device according to an embodiment of the present invention (FIG. 25A) and a partially sectional schematically view showing the structure thereof along line A-A (FIG. 25B).
Figure 25B:
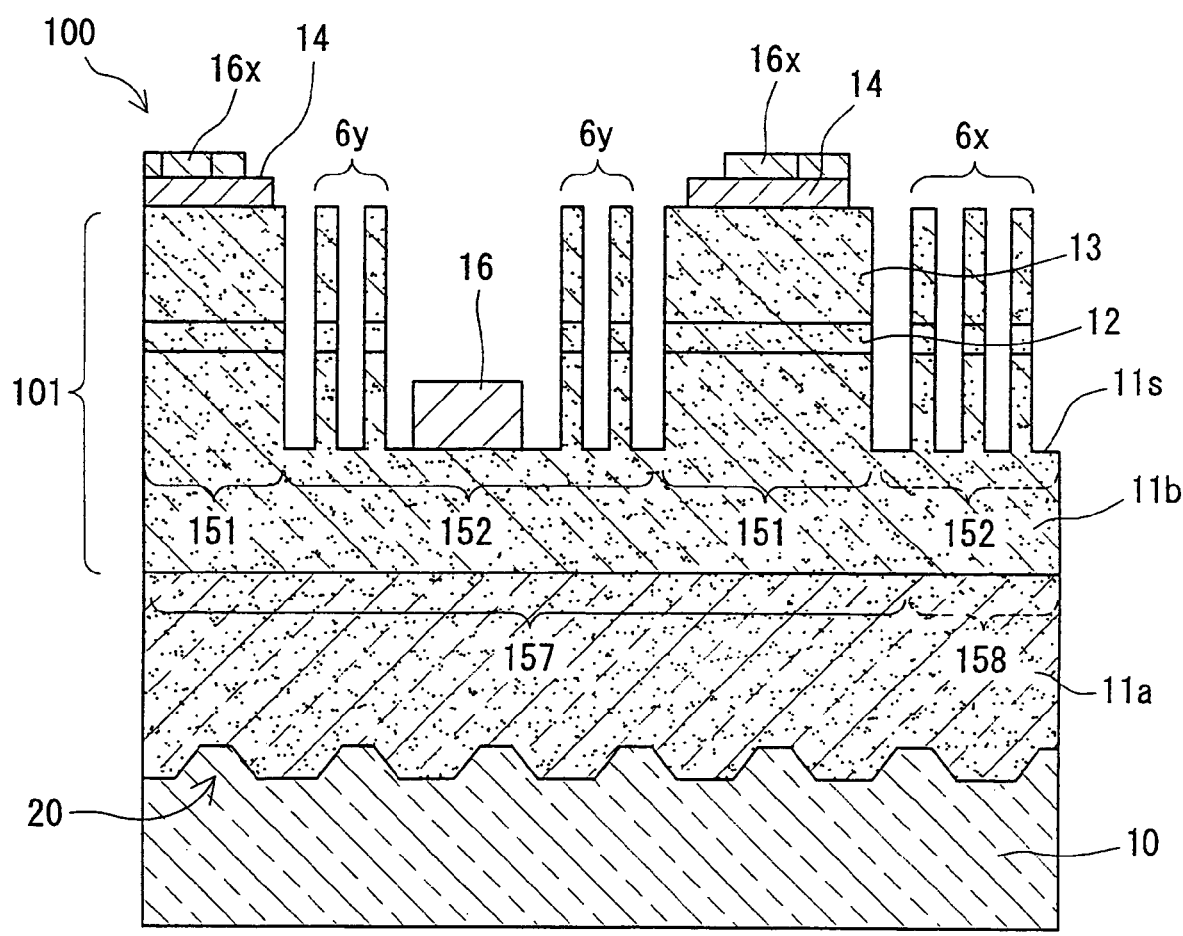

The semiconductor light emitting device according to the present invention may have such a structure as electrodes of different types of electrical conductivity are provided on the same side of the substrate as shown in FIG. 6, FIG. 25A and FIG. 25B. An electrically conductive substrate may also be used with electrodes for a first conductivity type layer and second conductivity type layer provided on opposite sides of the substrate, respectively.

In case a nitride semiconductor is used as the semiconductor, it is preferable to use a nitride semiconductor having a composition represented by a general formula $In_xAl_yGa_{1-x-y}N$ ($0 \leq x$, $0 \leq y$, $x+y \leq 1$). B, P or As may be included in the nitride semiconductor as a mixed crystal. The n-type nitride semiconductor 11 and the p-type nitride semiconductor 13 may be formed in either a single layer or multi-layer structure. The nitride semiconductor is doped with an n-type impurity or p-type impurity. As the n-type impurity, Group IV elements or Group VI elements such as Si, Ge, Sn, S, O, Ti, Zr may be used, and preferably Si, Ge or Sn is used and more preferably Si is used. While there is no restriction on the p-type impurity, Be, Zn, Mn, Cr, Mg or Ca may be used and Mg is preferably used. Thus, both types of a nitride semiconductor can be formed. The active layer 12 is preferably formed as a single quantum well (SQW) structure or multiple quantum well (MQW) structure.

The embodiments shown in FIG. 6 and FIGS. 25A-25B have such a structure that a light emitting element 101 is formed on the substrate 10, with electrodes 16, 14 provided on the layers 11, 13 of different conductivity types, respectively, of the light emitting element. While a device structure made by stacking the p-type layer 13 and the n-type layer 11 in a particular order is described as an example in this specification, an order of stacking these layers is not restricted to that described in the specification. The light emitting device may have any proper structure as long as it has at least a layer of first conductivity type 11 and a layer of second conductivity type 13. More preferably, the active layer 12 is provided between the layer of first conductivity type 11 and the layer of second conductivity type 13.

Alternatively, a base layer 11a that provides a base for element structure 101 may be formed between the substrate 10 and an n-type layer 11b of the layer of first conductivity type as shown in FIG. 25B.

Now a method of manufacturing the light emitting device shown in FIG. 6 will be described below.

It is preferable to form a buffer layer (not shown) before growing n-type nitride semiconductor 11 on substrate 10. The buffer layer is preferably made of a nitride semiconductor represented by a general formula $Al_aGa_{1-a}N$ ($0 \leq a \leq 0.8$), more preferably a nitride semiconductor represented by a general formula $Al_aGa_{1-a}N$ ($0 \leq a \leq 0.5$). Thickness of the buffer layer is preferably in a range from 0.002 to 0.5 µm, more preferably from 0.005 to 0.2 µm, and most preferably 0.01 to 0.02 µm. Semiconductor layers of better crystallinity can be formed on the substrate by making a thickness of the buffer layer smaller than a height of a protrusion (or depth of a recess) of the substrate. For example, a semiconductor layer of satisfactory crystal structure can be made with less voids, pits and dislocations. The buffer layer is grown at a temperature preferably in a range from 200 to 900° C., and more preferably from 400 to 800° C. This makes it possible to reduce dislocations and pits generated on a nitride semiconductor. An $Al_xGa_{1-x}N$ ($0 \leq x \leq 1$) layer may also be formed by an ELO (epitaxial lateral overgrowth) method on a substrate made of different material. The ELO (epitaxial lateral overgrowth) method is a process of growing a nitride semiconductor in a lateral direction so as to bend and converge a threading dislocation and decrease dislocations. The buffer layer may be formed as a multiple layer structure, which includes a low-temperature growth layer and a high-temperature growth layer. The high-temperature growth layer may be a GaN layer grown without doping or one that is doped with an n-type impurity. Thickness of the high-temperature growth layer is preferably at least 1 µm, and more preferably at least 3 µm. The high-temperature growth layer is grown at a temperature preferably in a range from 900 to 1100° C., and more preferably at least 1050° C.

Then the n-type semiconductor layer 11 is grown.

First, an n-type contact layer is grown. The n-type contact layer has such a composition that has band gap energy larger than that of the active layer, preferably $Al_jGa_{1-x}N$ ($0<j<0.3$). While there is no limitation to a thickness of the n-type contact layer, it is preferably at least 1 µm, and more preferably at least 3 µm. Then, an n-type cladding layer is grown. The n-type cladding layer includes Al. While there is no limitation to concentration of the n-type impurity, it is preferably in a range from $1\times10^{17}$ to $1\times10^{20}/cm^3$, more preferably from $1\times10^{18}$ to $1\times10^{19}/cm^3$. The n-type impurity may also be included with graded concentration. When an Al content is graded, the cladding layer can also perform a better function of carrier confinement.

The active layer 12 used in the present invention is preferably formed as a quantum well structure that consists of at least a well layer having a composition of $Al_aIn_bGa_{1-a-b}N$ ($0 \leq a \leq 1$, $0 \leq b \leq 1$, $a+b \leq 1$) and a barrier layer having a composition of $Al_cIn_dGa_{1-c-d}N$ ($0 \leq c \leq 1$, $0 \leq d \leq 1$, $c+d \leq 1$). Output power of the light emitting device can be made higher by forming the active layer from a nitride semiconductor without doping or while doping with an n-type impurity. It is more preferable that the well layer is grown without doping and the barrier layer is grown while doping with an n-type impurity in order to increase output power and light emission efficiency of the light emitting device. When Al is included in the well layer of the light emitting device, it is possible to emit light in a wavelength region where it is difficult to emit light with a conventional well layer made of InGaN, namely wavelengths near 365 nm, that corresponds to a band gap energy of GaN, and shorter.

Thickness of the well layer is preferably in a range from 1 nm to 30 nm inclusive, more preferably from 2 nm to 20 nm inclusive and most preferably from 3.5 nm to 20 nm inclusive. When smaller than 1 nm in thickness, this layer cannot satisfactorily function as the well layer. When the thickness is at least 2 nm, a relatively homogeneous layer can be obtained without fluctuation in thickness. When the thickness is at least 3.5 nm, output power can be increased further. This is because a thicker well layer allows for injection of more carriers so as to emit light with high efficiency and high internal quantum efficiency through recombination of carriers as in an LD driven with a high current, and this effect is remarkable particularly in a multiple quantum well structure. In a case of single quantum well structure, an effect of increasing output power similarly to the above can be achieved by setting the thickness to at least 5 nm. When the well layer is thicker than 30 nm, on the other hand, crystallinity of a quaternary mixed crystal of InAlGaN becomes lower, resulting in lower performance of the device. By setting the thickness of the well layer to at most 20 nm, it is possible to grow a crystal while suppressing occurrence of crystal defects. While there is no limitation to the number of well layers, it is preferable to provide at least four well layers which enables a thickness of the well layer to be at most 10 nm, while decreasing a thickness of the active layer. This is because the thicker the layers that constitute the active layer, the thicker the active layer and higher a value of Vf becomes. In a case of a multiple quantum well structure, it is preferable that at least one of a plurality of well layers is not thicker than 10 nm, and it is more preferable that all well layers are not thicker than 10 nm.

A barrier layer, similarly to the well layer, is preferably doped with an n-type impurity or undoped. In case the barrier layer is doped with an n-type impurity, concentration of the n-type impurity is preferably at least $5\times10^{16}/cm^3$. In a case of an LED, the impurity concentration is preferably in a range from $5\times10^{16}$ to $2\times10^{18}/cm^3$. In a case of a high output LED or LD, the impurity concentration is preferably in a range from $5\times10^{17}$ to $1\times10^{20}/cm^3$, and more preferably in a range from $1\times10^{18}$ to $5\times10^{19}/cm^3$. In this case, it is preferable that a well layer either does not substantially include an n-type impurity or is undoped. When the barrier layer is doped with an n-type impurity, either all barrier layers in the active layer may be doped, or some of the barrier layers may be doped while leaving others undoped. In case only some of the barrier layers are doped with an n-type impurity, it is preferable to dope the barrier layers that are located on an n-type layer side in the active layer. When an nth barrier layer Bn (n is a positive integer) from the n-type layer side is doped, for example, preferably the first through nth barrier layers are all doped with an impurity, and such a light emitting device can be made as electrons are efficiently injected into the active layer so as to achieve high efficiency of light emission and high internal quantum efficiency. With regard to the well layer, too, an effect similar to that of the barrier layer can be achieved by doping an mth well layer Wm (m is a positive integer) from the n-type layer side. Similar effects can also be achieved by doping both the barrier layer and the well layer.

Then a plurality of layers as described below are formed as the p-type nitride semiconductor layer 13 on the active layer 12. As for a p-type cladding layer, while there are no limitations to its composition as long as it has band gap energy larger than that of the active layer so as to be capable of confining a carrier within the active layer, the composition is preferably $Al_kGa_{1-k}N$ ($0 \leq k \leq 1$), and more preferably $Al_kGa_{1-k}N$ ($0<k<0.4$). While there is no limitation to thickness of the p-type cladding layer, it is preferably in a range from 0.01 to 0.3 µm, and more preferably from 0.04 to 0.2 µm. Concentration of a p-type impurity is preferably in a range from $1\times10^{18}$ to $1\times10^{21}/cm^3$, more preferably from $1\times10^{19}$ to $5\times10^{20}/cm^3$. The p-type impurity in the range described above enables it to decrease bulk resistivity without deteriorating crystallinity. The p-type cladding layer may be formed either as a single layer structure or a multiple layer structure (super lattice structure). In a case of the multiple layer structure, the p-type cladding layer may comprise a layer represented by $Al_kGa_{1-k}N$ described above and other nitride semiconductor layers having a band gap energy smaller than that of the former. The layer of smaller band gap energy may have a composition represented by $In_lGa_{1-l}N$ ($0 \leq l<1$) or $Al_mGa_{1-m}N$ ($0 \leq m<1$), similarly to the case of the n-type cladding layer. Thickness of each layer constituting the multiple layer structure in the case of super lattice structure is preferably at most 100 Å, more preferably at most 70 Å and most preferably in a range from 10 to 40 Å. In case the p-type cladding layer is formed as a multiple layer structure consisting of layers having larger band gap energy and layers having smaller band gap energy, the p-type impurity may be added to at least either the layers having larger band gap energy or the layers having smaller band gap energy. When both the layers having larger band gap energy and the layers having smaller band gap energy are doped, doses may be the same or different.

Then a p-type contact layer is formed on the p-type cladding layer. The p-type contact layer is preferably formed from a composition of $Al_fGa_{1-f}N$ ($0 \leq f<1$), and more preferably $Al_fGa_{1-f}N$ ($0 \leq f<0.3$) which enables it to achieve good ohmic contact with p-type electrode 14 that is an ohmic electrode. Concentration of the p-type impurity is preferably at least $1\times10^{17}/cm^3$. It is preferable that the p-type contact layer has such a graded composition as a p-type impurity concentration is higher and mix proportion of Al is lower on an electrically conductive substrate side. In this case, the composition may be graded either continuously or stepwise. For example, the p-type contact layer may be constituted from a first p-type contact layer that makes contact with the ohmic electrode and has high p-type impurity concentration and low Al content, and a second p-type contact layer that has low p-type impurity concentration and high Al content. The first p-type contact layer enables it to achieve good ohmic contact and the second p-type contact layer suppresses self-absorption of emitted light.

After forming nitride semiconductor layers on the substrate 10 in the process described above, a wafer is taken out of a reaction apparatus and is subjected to heat treatment at least 400° C. in an atmosphere that includes oxygen and/or nitrogen. This process removes hydrogen that is bonded in the p-type layer, so as to form the p-type nitride semiconductor layers that show p-type conductivity.

Then the p-type electrode 14 that achieves ohmic contact is formed on a surface of the p-type contact layer. The p-type electrode may be formed by a CVD process, sputtering, vapor deposition or the like. The p-type electrode is preferably formed from material described previously. Sheet resistance can be decreased by forming a multiple layer structure of at least two layers with a total thickness of at most 50000 Å, compared with a singular layer structure having a uniform thickness.

Figure 10A:
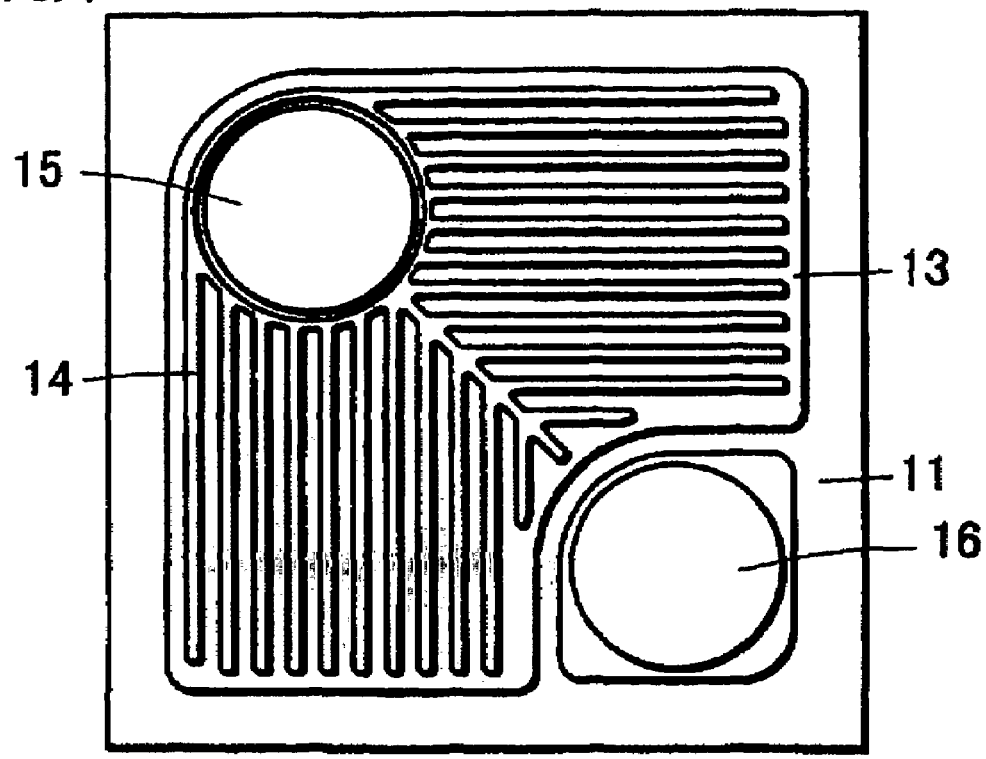
FIGS. 10A and 10B are diagrams showing further variations of the configuration of p-side ohmic electrode.

The p-type electrode may be formed in various shapes such as rectangular, stripes, square or lattice in plan view. For example, the p-type electrode 14 may be formed over the entire surface of the p-type semiconductor layer, then openings 18 are formed in dots as shown in FIG. 9A and FIG. 9B. The p-type electrode may also be formed in such shapes as rhombic, parallelogram, mesh, stripes or comb as shown in FIG. 9C and FIG. 9D. A branching shape such that a single stem branches into a plurality of portions as shown in FIG. 8A and FIG. 10A may also be employed. Plurality of branch electrodes that are electrically connected may be formed in stripes while the p-type electrode has openings 18 as shown FIG. 10B. Moreover, circular pattern may be employed. By using such a p-type electrode structure in combination with the substrate having the recess or protrusion formed thereon, the efficiency of extracting light can be further improved.

In a case of a p-type electrode having openings (through holes) 18 that reach a surface of the p-type semiconductor layer and are surrounded by electrodes, area S of a portion surrounded by an outermost periphery of the p-type electrode (total area of the electrode including the openings) and total length L of a circumference of the openings preferably satisfy a relation $L/S \geqq 0.024$ μm/μm². This enables to be made a semiconductor light emitting device that allows efficient emission of light from a surface of the p-type semiconductor layer and has a low value of Vf.

The openings preferably have substantially identical shapes, which makes it easier to form the openings and achieve uniform light emission in the surface. It is also preferable that each of the openings has substantially the same area, which also contributes to achieving uniform light emission in the surface.

The p-type electrode 14 is an ohmic electrode used for supplying current to the device through ohmic contact with a surface of p-type nitride semiconductor layer 13. In a nitride semiconductor device, it is a common practice to form a p-type pad electrode 15 for connection by wire bonding, besides the p-type electrode 14 for ohmic contact, and connect the p-type pad electrode 15 and the p-type electrode 14 that is an ohmic electrode. The p-type pad electrode 15 may be either provided on the p-side layer 13, or provided outside of the p-side layer 13 with metal wiring, for example, via an insulating film on the n-type layer 11 whereon n-type electrode 16 is formed. When the p-type pad electrode 15 is formed on the p-side layer 13, the p-type pad electrode 15 may partially overlap the p-type electrode 14, or the p-type pad electrode 15 may be formed on the p-type electrode 14. Since the p-type pad electrode 15 is provided for a purpose of packaging with wires, it may have any thickness as long as it does not damage the semiconductor device when mounting. In case light is extracted from a side where the p-type pad electrode 15 is formed, it is necessary to form the p-type pad electrode 15 as small as possible.

The p-type pad electrode 15 is preferably made of a material that bonds well. Specifically, Co, Fe, Rh, Ru, Ti, V, Cr, Zr, Nb, Mo, Hf, Ta, W, Re, Mn, Al, Zn, Pt, Au, Ru, Pd or Rh may be used. Preferably, at least one kind selected from among a group consisting of Ag, Al, Pt, Cu, Ni, Ti, Au and Rh, and an oxide, nitride and the like thereof, are used. More preferably, at least one kind selected from among a group consisting of Ag, Al and Pt is used. The p-type pad electrode may be made as a single layer, alloy or multiple layers.

The n-type electrode 16 is formed on the surface of the n-type contact layer. For the n-type electrode 16, in addition to the electrode described above, W/Al, Ti/Al, Ti/Al/Ni/Au, W/Al/W/Pt/Au or Al/Pt/Au or the like may be used. Thickness of the n-type electrode 16 is preferably in a range from 0.1 to 1.5 μm. The n-type electrode 16 serves as a pad electrode for bonding as well as making ohmic contact. The n-type electrode 16 may also be formed as two layers of a pad electrode for bonding and an ohmic electrode that makes ohmic contact with the n-side layer 11, which may be formed at the same time in substantially the same shape. An n-type electrode for ohmic contact and an n-type pad electrode may also be formed one on another in different processes in different shapes.

Forming an electrode on a nitride semiconductor layer and then applying heat treatment makes it possible to accelerate alloy formation, achieve good ohmic contact with the semiconductor layer, and decrease contact resistance between the semiconductor layer and the electrode. Temperature of heat treatment is preferably in a range from 200 to 1200° C., more preferably in a range from 300 to 900° C., and most preferably in a range from 450 to 650° C. It is preferable that ambient gas includes oxygen and/or nitrogen. The heat treatment may also be performed in an ambient gas that includes an inert gas such as Ar or in air atmosphere.

The semiconductor device of the present invention may have a protective film 17 formed from $SiO_2$, $ZrO_2$, $TiO_2$, $Al_2O_3$, or an oxide that includes at least one element selected from among a group consisting of V, Zr, Nb, Hf, Ta or SiN, BN, SiC, AlN, AlGaN, and the like. Continuously on a side face of the device nitride semiconductor layers are stacked. The protective film is preferably an insulating film, which enables to be made a semiconductor device of high reliability. When the insulating film is provided on a surface of the p-type layer where the electrode is not formed, it is possible to effectively suppress migration of the electrode.

Then the wafer is divided by scribing or dicing into chips of a nitride semiconductor device whereon electrodes are formed as shown in FIG. 6.

Figure 22A:
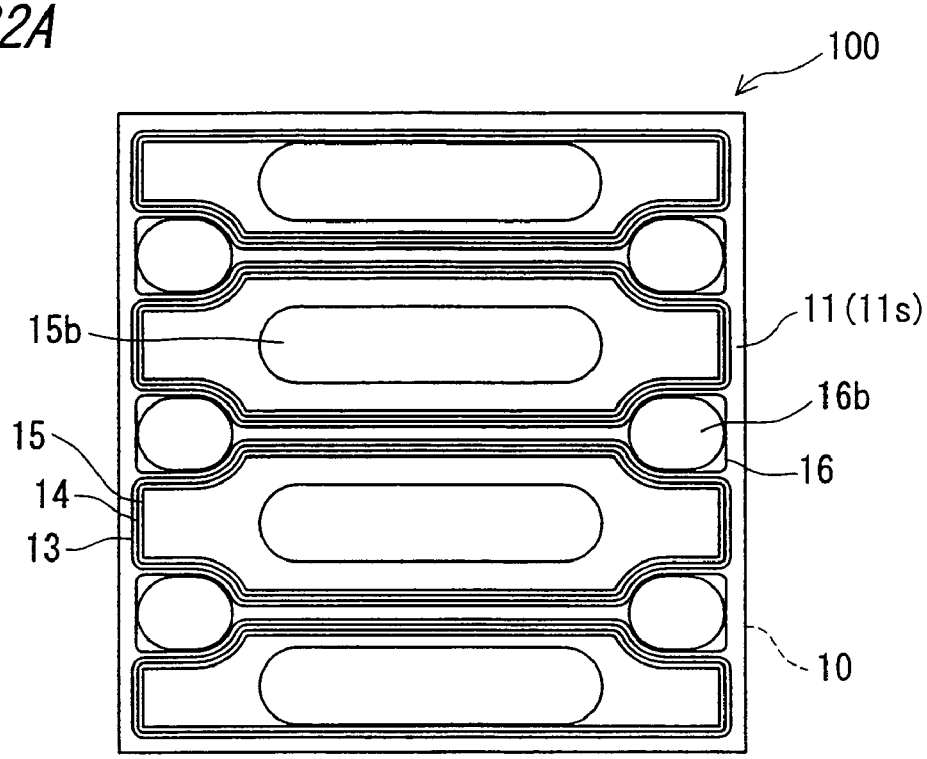
FIGS. 22A through 22C are a top view showing the structure of light emitting device according to an embodiment of the present invention (FIG. 22A), a sectional view showing the layer structure thereof (FIG. 22B) and a circuit diagram of the layer structure thereof (FIG. 22C).
Figure 22B:
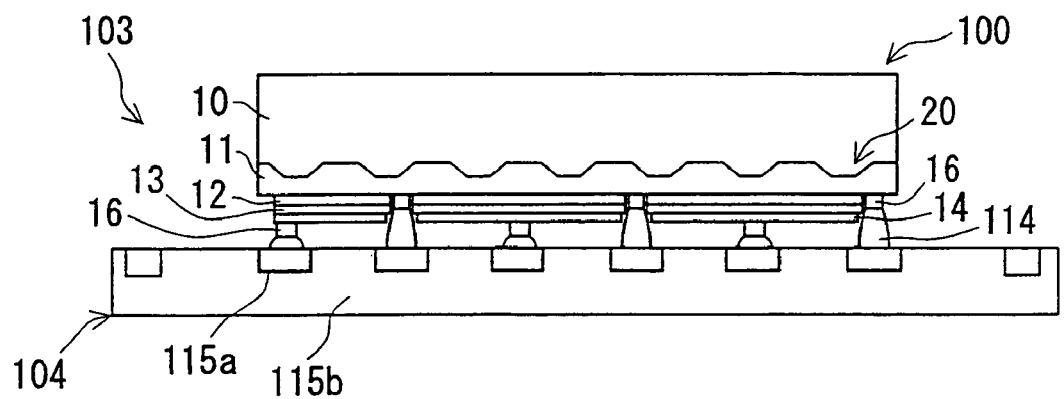

This embodiment has been described for a case where light is extracted from the surface of the nitride semiconductor layer where the electrode is formed, although light may also be extracted from the substrate side. In this case, the p-side pad electrode 15 is preferably formed in oval shape as shown in FIG. 8B. A metallization layer (bump) is formed on the p-side pad electrode 15, instead of wire, for the connection with external electrodes or the like, for face down mounting as shown in FIG. 22B. The metallization layer may be made of Ag, Au, Sn, In, Bi, Cu, Zn or the like. In the case of face down mounting, the pad electrode is heated and expands in volume which, together with the pressure applied, causes the material that makes the pad electrode likely to flow toward the side face. In the nitride semiconductor light emitting device of this embodiment, however, such trouble can be prevented since the electrode is alloyed as described above. The structure of this embodiment also has high heat dissipating characteristic and improved reliability.

With the semiconductor device of the present invention, in a case of a gallium nitride-based semiconductor light emitting device (which includes at least gallium and nitrogen), for example, white light can be emitted with high output power by applying a mixture of fluorescent material and a resin to a surface of the light emitting device whereon an electrode has been formed.

The light emitting element 100 of the present invention may have such a structure that is with the electrodes 14 and 16, one piece each, of the layers 11, 13 of the first and second conductivity types provided on the same side of the substrate, as shown in FIG. 8A, FIG. 8B, FIG. 9A, FIG. 9B and FIG. 10A. Alternatively, as shown in FIG. 8C, FIG. 10B, FIG. 22A and FIG. 25A, one or both of the electrodes 14, 16 of the layers 11, 13 of different conductivity types is formed in plurality in one light emitting device. As explained in FIG. 25B, structure of the light emitting element is such that a light emitting portion 151 having the layers 11, 13 of the first and second conductivity types and preferably the active layer 12 interposed therebetween, a non-light emitting portion 152, where the layer of first conductivity type is exposed and electrode is provided, are provided in the substrate surface. The electrodes 14, 16 of the layers 11, 13 of different conductivity types are provided in plurality, making pairs. The electrode 14 and 16 have extended portions 14*x* and 16*x*, respectively, so that the light emitting portion 151 is interposed by the extended portions 14*x* and 16*x*. The light emitting device can be divided into a functional part 157 which receives electric current and functions as the light emitting element and a non-functional part 158 that is mostly passive such as the portion surrounding the light emitting element.

The functional part 157 includes at least one light emitting portion 151 and the non-light emitting portion 152 where electrodes are formed. The non-functional part 158 consists mainly of the non-light emitting portion 152.

Figure 10B:
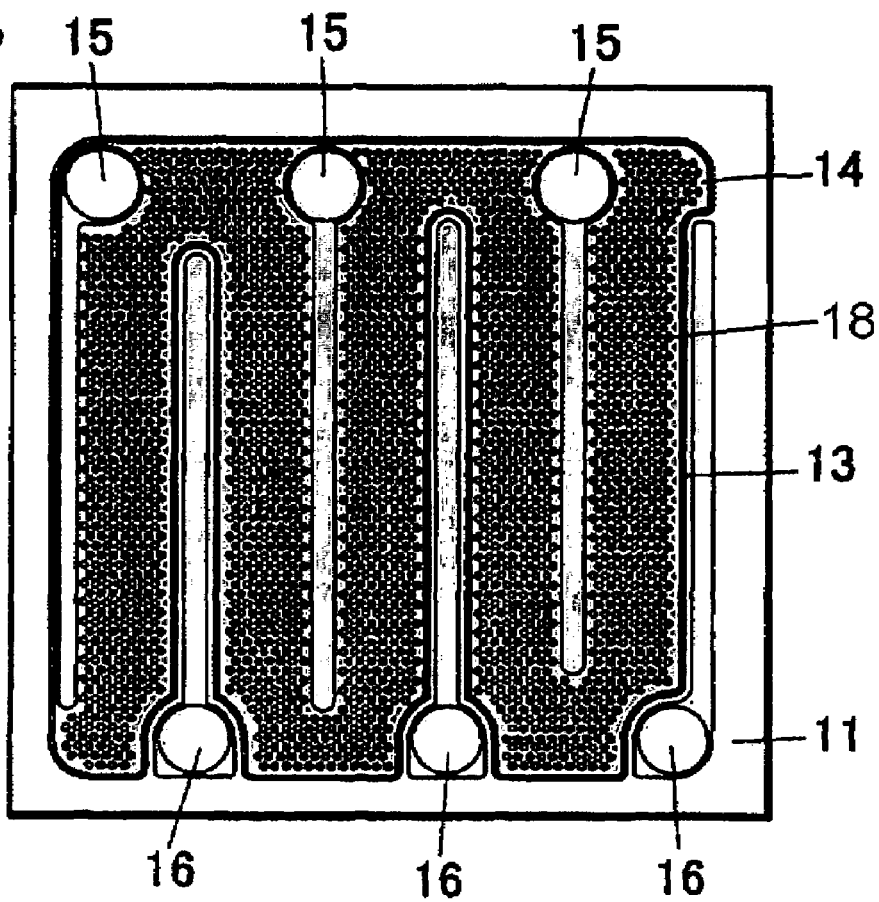

The light emitting device shown in FIGS. 8C, 10B and 25A has a plurality of light emitting portions 151 provided on the substrate, and the light emitting portions 151 are connected to each other, for example, as shown in FIGS. 25A and 25B. The electrodes 16 of the layer 11 of the first conductivity type, namely the electrode forming portions 152 are also provided in plurality. The light emitting device 100 shown in FIG. 22A, in contrast, has a plurality of light emitting portions 151, but the light emitting portions 151 are separate from each other. The plurality of electrodes of the electrode forming portion 152 are also provided separately. In this way, plurality of the light emitting portions may be provided while being separated from or connected to each other in the light emitting device 100 (or functional portion 157).

According to the present invention, as shown in FIG. 25B, transverse propagation of light in the element 101, particularly in the layer 11 of the first conductivity type that constitutes the light emitting portion 151 is suppressed by the recess or protrusion 20 formed on the surface of the substrate 10, thus enabling it to extract light efficiently. Particularly in a region where the layer of the first conductivity type is exposed, since a strong optical waveguide is formed by air (or a protective film), the layer of the first conductivity type and substrate, transverse propagation of light is likely to occur. Even in such a region, transverse propagation of light can be changed into longitudinal direction by providing the recesses or protrusions 20 on the substrate, so as to extract light efficiently in the direction perpendicular to the substrate surface (on the side where the element is formed, or on the opposite side where the substrate is exposed).

A light propagating region exists on the substrate side from exposed portion 11s of the layer of the first conductivity type, also in the non-functional portion 158. Therefore, light propagation loss can be reduced also in the non-functional portion 158 by providing the recesses or protrusions 20 on the substrate.

In a case of a light emitting device that emits light from an electrode forming surface thereof, an electrode 14 that is permeable to light is provided by virtue of translucent material or an opening in the light emitting portion 151. Even in such a case, electrode 16 and a pad 16b of the layer 11 of the first conductivity type, or a pad electrode 15 and a pad 15b of the layer of the second conductivity type are not transparent in most cases. When this is the case, light is extracted from a region where the non-transparent electrode is not formed. Therefore, it is particularly preferable that recesses or protrusions are provided on the substrate in a region where the non-transparent electrode is not formed (for example, a region of the non-light emitting portion 152 where the non-transparent electrode is not formed). When light is extracted from the electrode forming surface, while it is important that the electrode 14 formed on the light emitting portion 151 is permeable to light, other electrodes may also be made permeable to light. For example, the electrode 16 of the layer 11 of the first conductivity type and also the pad electrodes may be made permeable to light.

In the light emitting device that has large area and a plurality of light emitting portions as shown in FIGS. 8C, 10B, 22A and 25A, distribution of light intensity within plane is likely to occur. For example, there occurs difference in light intensity in the light emitting portions 151, the non-functional portion 152 where the electrode 16 is formed and the non-functional portion 158 around the element. Difference in light intensity may also occur among the non-functional portions 152. As a result, light intensity is likely to be distributed unevenly throughout the chip. In the light emitting device of the present invention, uneven distribution of light intensity is mitigated by forming the protrusions 20 on the substrate surface. When the chip area increases, the region where the layer of the first conductivity type increases, and therefore propagation and loss of light tend to increase. This problem is also improved by forming the recesses or protrusions on the substrate surface. Thus the present invention is preferably applied to a light emitting device that has large area and a plurality of light emitting portions.

In a case of a light emitting device that emits light from a back of a substrate, it is preferable to form recesses or protrusions over an entire surface of the substrate. In case an electrode forming surface of light emitting device 100 is connected to a base 104 (or element mounting surface or the like) as shown in FIG. 22B, for example, light can be extracted satisfactorily from a back surface of the substrate 10 by providing protrusions 20 over an entire surface of the substrate 10.

In the light emitting device of the present invention, recess and protrusion section 6x, 6y that functions as a light extracting and light reflecting portion may be provided on the electrode forming surface as shown in FIG. 25B. Specifically, the recess and protrusion section 6x, 6y is formed on a surface of the semiconductor layer 101 outside the light emitting portion 151, preferably along the side face of the light emitting portion 151. The recess and protrusion section 6x, 6y can be formed by partial etching of the semiconductor layer 101. For example, the n-type layer 11 that becomes the electrode 16 forming surface by etching, and the recess and protrusion section 6x, 6y may be formed at the same time. The light emitting device 100 shown in FIG. 25A is a variation of the light emitting element shown in FIG. 10B where recess or protrusion 6 is provided. Sectional view of FIG. 25B schematically shows a section along line A-A of the light emitting device shown in FIG. 25A.

As shown in FIG. 25B, the recess and protrusion section 6x is provided in a non-current injected portion 158 (non-functional portion) along the periphery of the light emitting device. The recess and protrusion section 6y, on the other hand, is provided in a functional portion (current injected portion) 157 between the electrode 16 of the layer of the first conductivity type and the light emitting portion 151. More specifically, the recess and protrusion section 6y is provided in the light emitting device (functional portion 157) along the side face of the light emitting portion 151 that is provided in singularity or plurality, between the electrode 16 and the light emitting portion 151.

The recess and protrusion section 6x reflects light that emerges from the light emitting device mainly sideways, namely light that propagates horizontally from the light emitting portion 151, and directs the light in a vertical direction, namely in a direction substantially perpendicular to the electrode forming surface. This increases a component of light perpendicular to the electrode forming surface. The recess and protrusion section 6y that is provided in the functional portion 157, on the other hand, has a function to prevent light from being absorbed by the electrode 16 or being entrapped in another light emitting portion that is adjacent thereto, in addition to a function similar to that of the recess and protrusion section 6x. As a result, extraction loss of light can be reduced and efficiency of light emission can be improved.

In the light emitting device of the present invention, it is preferable to provide the recess and protrusion section 6y between the light emitting portion 151 and the electrode 16, and provide the protrusions 20 on the substrate surface that overlaps thereon. Particularly, in case the electrode 16 that is provided in a part of the non-light emitting portion 152 shields light emitted from adjacent light emitting portion 151, light can be effectively extracted by cooperation of the recess and protrusion section 6y and the protrusions 20 to an exterior of the device, especially in a direction perpendicular to the electrode forming surface. The recess and protrusion section 6y also has a favorable effect on light propagating from a substrate side. That is, the recess and protrusion section 6y provided on the electrode forming portion 152 makes it difficult for light propagating from the substrate side to propagate toward the side face of the light emitting portion, thereby suppressing light loss due to the electrode and the light emitting portion.

A side face of the recess and protrusion section 6x, 6y may also be formed in a shape similar to that of the side face of the protrusion 20 provided on the substrate surface. In this case, a method similar to that of forming the protrusions 20 on the substrate may be employed. The recess and protrusion section 6x, 6y formed on the semiconductor layer 101 has a function of extracting light that propagates in a layer, and a function to advantageously reflect light that is extracted from the light emitting portion 151 located nearby to an exterior. When the recess and protrusion section 6x, 6y is formed in a shape similar to that of the side face of the protrusion provided on the substrate surface, a contact area of a bottom of the recess or protrusion and an interior portion of the element increases, thereby enabling more light to be extracted from inside of the element. Moreover, since an inclination angle of the side face of the recess and protrusion section 6x, 6y becomes smaller on a top face side, it is made possible to advantageously reflect light, that propagates from adjacent light emitting portion 151, in a direction perpendicular to the substrate surface.

In case a plurality of light emitting portions having complicated shape and/or structure are provided as shown in FIGS. 8C, 10B, 22A and 25A, greater loss occurs when extracting light. The loss can be decreased by forming the functional recess and protrusion section shown as 6x, 6y. Also in a light emitting device where the light intensity is unevenly concentrated in a particular direction, uneven distribution of light can be improved by providing the protrusions 20 on the substrate and the recess and protrusion section on the semiconductor layer, so that the light emitting device having high directivity can be obtained. It is preferable to provide the recess and protrusion section like so as to surround the light emitting portion 151 in the functional portion 157 of the light emitting device as shown in FIG. 25B. It is also preferable to provide the recess and protrusion section 6x, 6y so as to surround the electrode 16 that is provided in conjunction with the light emitting portion 151. It is more preferable to provide the recess and protrusion section 6x, 6y on substantially the entire periphery. Particularly in case the light emitting portion is surrounded by other light emitting portions as shown in FIG. 25A, light tends to be trapped as the light emitting portion is surrounded by the adjacent light emitting portions. This loss can also be mitigated by the recess and protrusion section 6x, 6y. Most preferably, as shown in FIGS. 25A, 25B, the recess and protrusion section 6x, 6y is provided so as to surround the light emitting portion 151 on almost the entire periphery, and also surround the electrode 16 on almost the entire periphery thereof.

As described previously, the recess and protrusion section 6x, 6y may be formed at the same time when the electrode forming surface 11s of the layer 11 of first conductivity type is exposed by etching. This provides an advantage with respect to a manufacturing process, since the recess and protrusion section 6x, 6y separated from a current injection electrode (for example, 14) and the light emitting portion 151 can be easily formed.

Bottom of the recess and protrusion section 6x, 6y may or may not correspond to the electrode forming surface 11s. For example, when the bottom of the recess and protrusion section 6x, 6y is located in the layer 11b of first conductivity type that is deeper than the electrode forming surface, light that propagates horizontally in the base layer 11a and light reflected from the substrate 10 can be extracted efficiently. It is particularly preferable that the recess and protrusion section 6x, 6y penetrates the layer 11b of first conductivity type and reaches the base layer 11a, namely reaches the depth where the non-functional portion is partly provided, and more preferably the recess and protrusion section 6x, 6y is formed at such a depth where the substrate is exposed. This makes it possible to isolate the layer 11b of first conductivity type and the base layer 11a, so that light propagating therein can be extracted efficiently. At this time, if the recess and protrusion section 6x, 6y is provided in the element 157 at the depth where the layer 11b of first conductivity type is partially or entirely removed, current diffusion path is interrupted. Therefore, it is preferable to divide the recess and protrusion section 6y in a plurality of regions in order to secure the current diffusion path. By providing the recess and protrusion section 6y in a fragmentary condition when viewed from above, the region between the portions of the recess and protrusion section 6y can be made the current diffusion path.

Various plan-view configurations and arrangements of the recess and protrusion section 6x, 6y may be employed similarly to the protrusions of the substrate. FIG. 25A shows triangular arrangement of circles similar to that of the protrusions shown in FIG. 19A. Light that has propagated horizontally in the device emerges from the side faces of the device in various directions. Therefore, it is preferable to provide the recess and protrusion section 6x, 6y so as to effectively obstruct the emergence of light in all directions from the side faces of the light emitting device. Specifically, it is preferable to provide the recess and protrusion section 6x, 6y periodically in two rows, more preferably three rows or more along the side face of the light emitting element as shown in FIG. 25A. Moreover, it is preferable to make the plan-view configuration of the recess and protrusion section 6x, 6y in substantially circular or oval shape so as to advantageously reflect light incident in various directions. Among the side faces of the recess and protrusion section 6x, 6y, the side face that faces the light emitting element is preferably a curved surface.

Embodiment 4

Light Emitting Device)

A fourth embodiment is an element stack 103 comprising light emitting element 100 mounted on a stack base 104 on an electrode forming surface thereof. Also, a light emitting device made by packaging the light emitting element 100 or the element stack 103 will be described.

(Element Stack)

FIG. 22B is a schematic sectional view of the element stack 103. A base 104 has a plurality of connection electrodes (not shown) each corresponding to electrodes 14, 16 of the light emitting element 100, while being electrically insulated from each other. The electrodes and light emitting structure that are separated from each other on a light emitting element side may also be electrically connected with each other by electrodes of base 104 side.

Figure 22C:
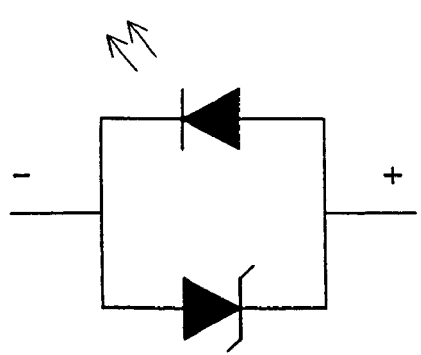
Figure 24:
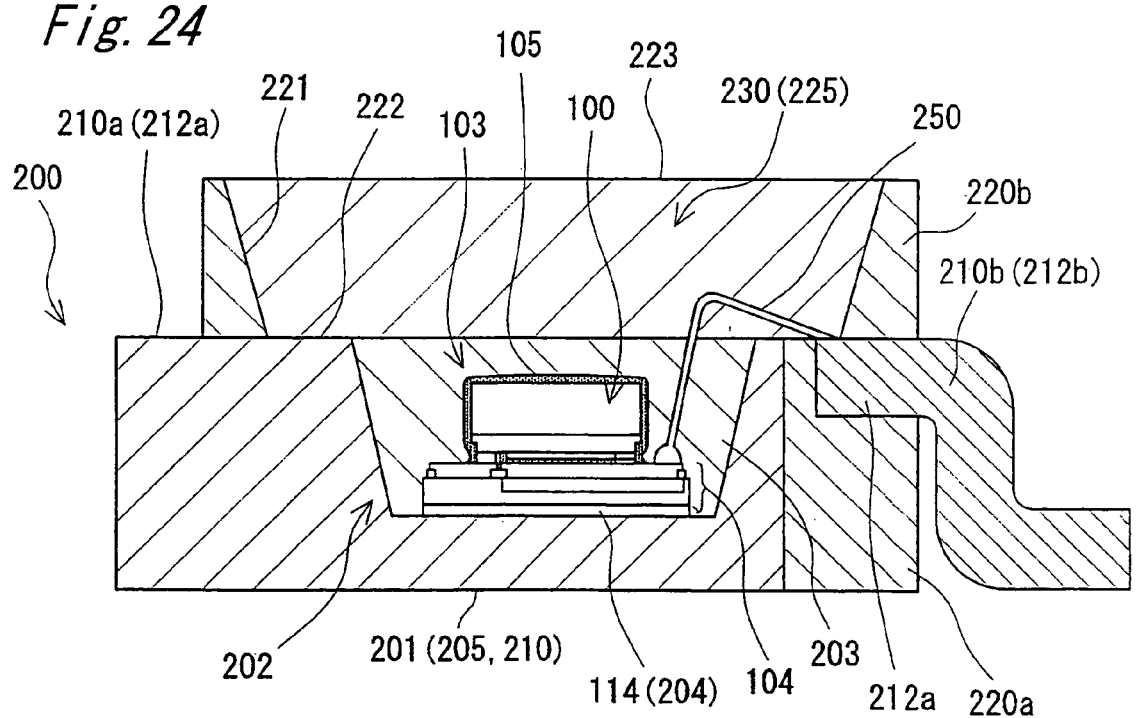
FIG. 24 is a schematic sectional view showing the light emitting device according to an embodiment of the present invention.

An element other than the light emitting element 100 may also be provided on the base 104. Here, a current, electrostatic protective element is formed in the base 104 as indicated by an equivalent circuit diagram of FIG. 22C, as shown in FIG. 22B. The current, electrostatic protective element is constituted from a p-type layer (a layer of a first conductivity type) 115a and an n-type layer (a layer of a second conductivity type) 115b provided in the base 104. At least two element portions may be provided on the base 104 and connected with the electrodes of the light emitting element 100 externally of the base and mounting base 201 (FIG. 24). A protective element may be mounted on a mounting portion 222 in light emitting device 200 and connected with a light emitting element (refer to FIG. 24).

The electrodes 14, 16 on light emitting element 100 side and the electrodes of the base 104 are connected via connecting member 114. Alternatively, a part of the electrodes on the light emitting element 100 side or part of the electrode 112 on the base 104 side may be used as the connecting member. For example, a connecting layer may be formed instead of pads 16b, 15b of the light emitting element 100.

The base 104 may also be a sub mount such as a heat sink that does not have an element structure. The base 104 and an exterior portion may be connected through a connection electrode by wire bonding or the like. The electrodes of the element portion of the base 104 or the electrodes that connect an interior and exterior of the base may also be formed on a mounting surface and used as the electrodes or connection layer 114 for connecting the light emitting element.

(Light Emitting Device 200)

Figure 23:
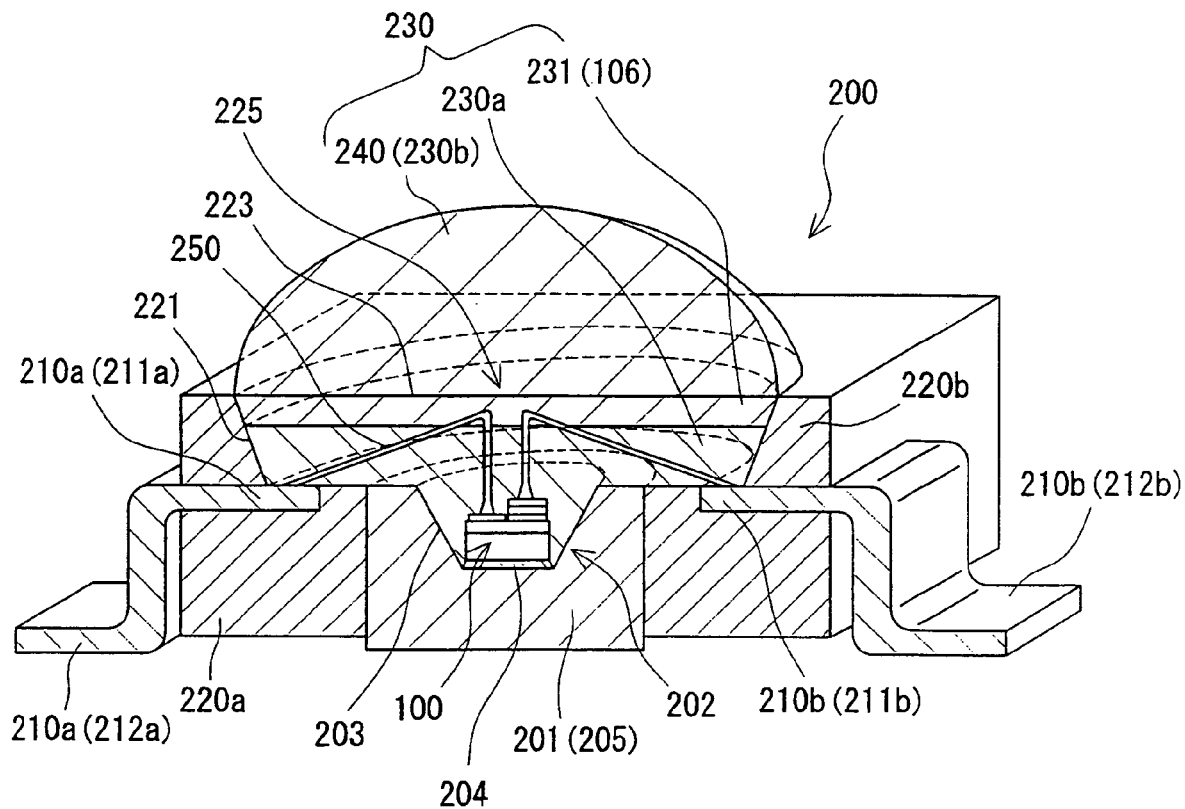
FIG. 23 is a schematic diagram showing the light emitting device according to an embodiment of the present invention.

FIG. 23 and FIG. 24 show light emitting devices comprising the light emitting element 100 or the element stack 103 on a device base. In the example shown in FIG. 24, two leads 210a and 210b are fastened onto device base 220. One of the leads, 210a, is a mount lead. The mount lead 210a functions as mounting base 201, and the light emitting element 100 (stack 103) is mounted via connection layer 114 (or the bonding layer 204) in a housing portion (recess) 202 of the device base 201. A side face 203 of the housing portion 202 of the mounting base 201 and a side face 221 of an opening 205 of the device base 220 function as light reflectors. The mounting base 201 that is the mount lead may also be used as a heat sink 205 for the light emitting element and connected to an external heat sink. The device base 220 also has opening 225 in light extracting surface 223, so that a top face of the mounting base 201 is exposed through the opening 225 as a terrace 222. A protective element and other elements may be mounted on the terrace 222. The recess 202 of the mounting base 201 and an interior of the opening 225 of the device base 220 are filled with a translucent sealing member 230. Lead electrode 210b comprises an inner lead 212a provided inside of the device base 220 and an external lead 212b that is an extension thereof to outside of the device base 220, so as to be connected with the outside thereby. The light emitting element 100 (stack 103) is electrically connected to the leads 210a and 210b via a wire 250 or connection member 204.

In the example shown in FIG. 23, the light emitting element 100 is mounted by the bonding member 204 on the mounting base 201 that is insulated from the leads 210a and 210b. A reflecting portion is provided on a recess side face 203 of the mounting base 201 that houses the light emitting element 100. The mounting base 201 may also be connected to an external heat sink as the heat sink 205. The light emitting element 100 is connected by the wire 250 to leads 211a and 211b. The leads 210a and 210b are electrically connected to an exterior via external leads 211a and 212b. Separation of the mounting base 201 and lead 210 makes the light emitting device of excellent thermal design. The recess 202 of the mounting base and the opening of the device base 220 may be sealed with the translucent sealing member 230. Light emission with desired directivity can be obtained by providing an appropriate optical system (lens) in a light extracting portion. The lens may be optically connected with the sealing member 230. Or, alternatively, the sealing member 230 itself may be formed in the shape of a lens.

(Light Converting Member)

A light converting member 106 or a light conversion layer 231 may be provided in the light emitting device as shown in FIG. 23. The light converting member 106 or the light conversion layer 231 absorbs a part of light emitted by the light emitting element 100 and emits light of a different wavelength, and may contain a fluorescent material. The light converting member 106 or the light conversion layer 231 is formed so as to cover a part of the light emitting element 100 or an entirety thereof. Alternatively, the light converting member may also be formed as a coating film 105 that covers a part of the stack base 104 as shown in FIG. 24. For a binder of the fluorescent material, an oxide or a hydroxide that includes at least one element selected from a group consisting of Si, Al, Ga, Ti, Ge, P, B, Zr, Y, Sn, Pb and an alkaline earth metal is preferably used. The binder can be produced from an organometallic compound that includes at least one element selected from a group consisting of Si, Al, Ga, Ti, Ge, P, B, Zr, Y, Sn, Pb and an alkaline earth metal (preferably plus oxygen). The organometallic compound includes a compound having an alkyl group and an allyl group. Examples of the organometallic compound include metal alkoxide, metal diketonate, metal diketonate complex and metal carboxylate.

The light converting member may also be provided as part of the sealing member 230 of the light emitting device 200. For example, the light converting member may be provided as a layer 231 provided on the sealing member 230a or between sealing members 230a and 230b, apart from the light emitting element 100, as shown in FIG. 23. Moreover, the sealing member 230 in its entirety may also be used as the light converting layer by dispersing the light converting member in the sealing member 230. The light converting member may also be provided as a sedimentation layer in the recess (housing portion) of the device base 220 or the mounting base 201. Furthermore, as shown in FIG. 24, the light converting member may be included in the film 105 that covers the substrate where protrusions are provided and/or the light emitting element 100.

In case the coating film is provided on a surface of the substrate opposite to the element forming surface, namely a back of the substrate and a side face of the substrate, if there is a significant difference in intensity of light emerging from the side face and the back surface of the substrate, color of light produced by blending converted light and light emitted by the light emitting element varies depending on a direction (color unevenness). Particularly when at least two fluorescent materials, specifically at least two kinds of fluorescent material having different wavelengths of converted light are used for the light converting member, a problem of color unevenness becomes profound. The substrate having the protrusions 20 provided on the light emitting element of the present invention as described above can suppress color unevenness. While the coating film 105 of the chip has been described, similar effects can be achieved also in the case of a light converting member in the sealing member, or in the case of extracting light from the light emitting element side.

Examples of the fluorescent material described above are as follows. As the fluorescent material that emits green light, $SrAl_2O_4$:Eu, $Y_2SiO_5$:Ce, Tb, $MgAl_{11}O_{19}$:Ce, Tb, $Sr_7Al_{12}O_{25}$:Eu, (at least one of Mg, Ca, Sr and Ba) $Ga_2S_4$:Eu may be used. As the fluorescent material that emits blue light, $Sr_5(PO_4)_3Cl$:Eu; $(SrCaBa)_5(PO_4)_3Cl$:Eu; $(BaCa)_5(PO_4)_3Cl$:Eu; (at least one of Mg, Ca, Sr and Ba)$_2B_5O_9Cl$:Eu, Mn; (at least one of Mg, Ca, Sr and Ba) $(PO_4)_6Cl_2$:Eu, Mn may be used. As the fluorescent material that emits red light, $Y_2O_2S$:Eu; $La_2O_2S$:Eu; $Y_2O_3$:Eu; $Gd_2O_2S$:Eu may be used. A composition that includes YAG makes it possible to emit white light so as to greatly broaden applications including the light source for illumination. YAG is a material represented by $(Y_{1-x}Gd_x)_3(Al_{1-y}Ga_y)_5O_{12}$:R (R is at least one element selected from Ce, Tb, Pr, Sm, Eu, Dy, Ho, and satisfies 0<R<0.5), for example, $(Y_{0.8}Gd_{0.2})_3Al_5O_{12}$:Ce, $Y_3(Al_{0.8}Ga_{0.2})_5O_{12}$:Ce.

While nitride-based fluorescent material is used as fluorescent material that emits reddish light in this embodiment, the light emitting device of the present invention may also be provided with a YAG-based fluorescent material and a fluorescent material that can emit reddish light. Fluorescent materials that can emit reddish light are those which emit light upon excitation by light of wavelength from 400 to 600 nm, for example, $Y_2O_2S$:Eu; $La_2O_2S$:Eu; CaS:Eu; SrS:Eu; ZnS:Mn; ZnCdS:Ag, Al; ZnCdS:Cu, Al; and the like. Use of the YAG-based fluorescent material and the fluorescent material that can emit reddish light enables color rendering performance of the light emitting device to be improved.

The YAG-based fluorescent material formed as described above and the fluorescent material that can emit reddish light represented by nitride-based fluorescent material can be used in such a manner that at least two kinds thereof exist in one color conversion layer at a lateral side face of the light emitting device, or at least one kind thereof exists in each of two color conversion layers. With such a constitution, light of mixed color can be obtained through mixing of light emitted by different kinds of fluorescent material.

Selecting fluorescent materials as described above enables to be made a light emitting device that can emit light with various wavelengths with high efficiency of extracting light. The light emitting device of the present invention is not limited to the visible region but may also be used for emitting an ultraviolet ray together with a fluorescent material that is excited by the ultraviolet ray and emits visible light. Further, the light emitting device can be applied to light of various wavelengths and electromagnetic radiation.

EXAMPLES

Now examples of the present invention will be described, but the present invention is not limited to these examples and may be applied to various other forms on the basis of the technical idea of the present invention.

Figure 20:
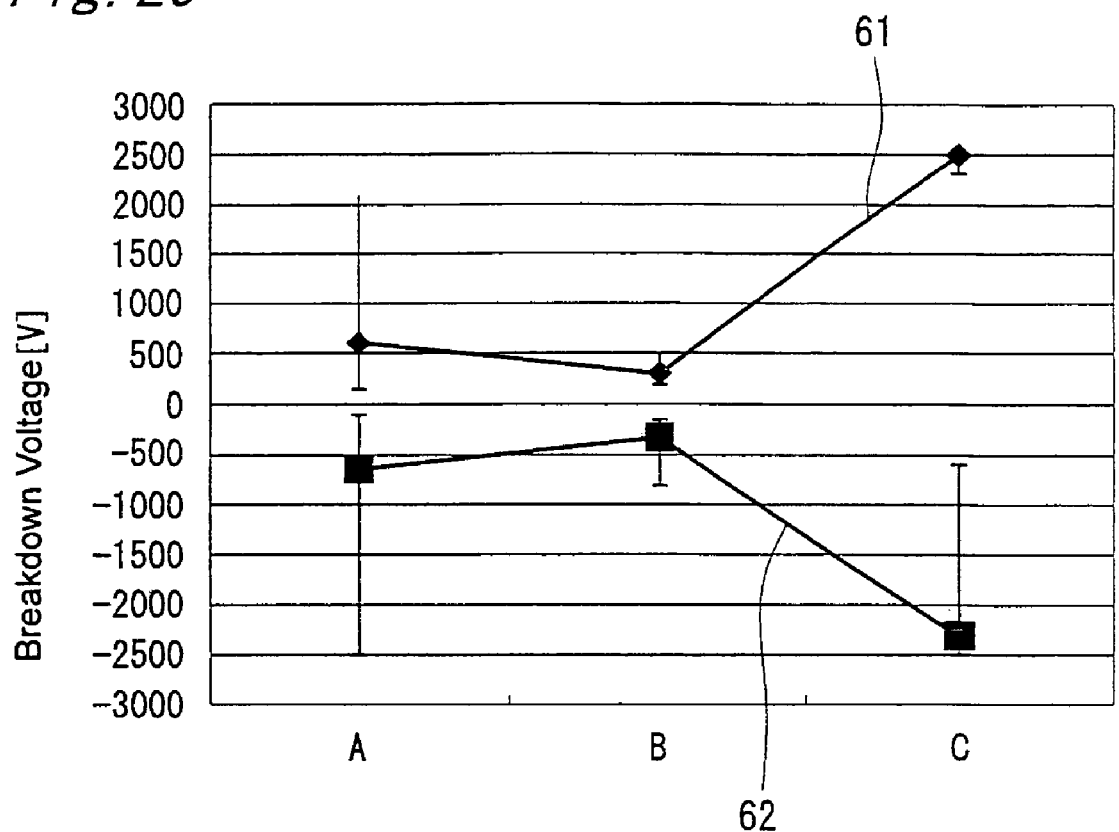
FIG. 20 is a graph showing electrostatic destruction characteristic according to an embodiment of the present invention.
Figure 21:
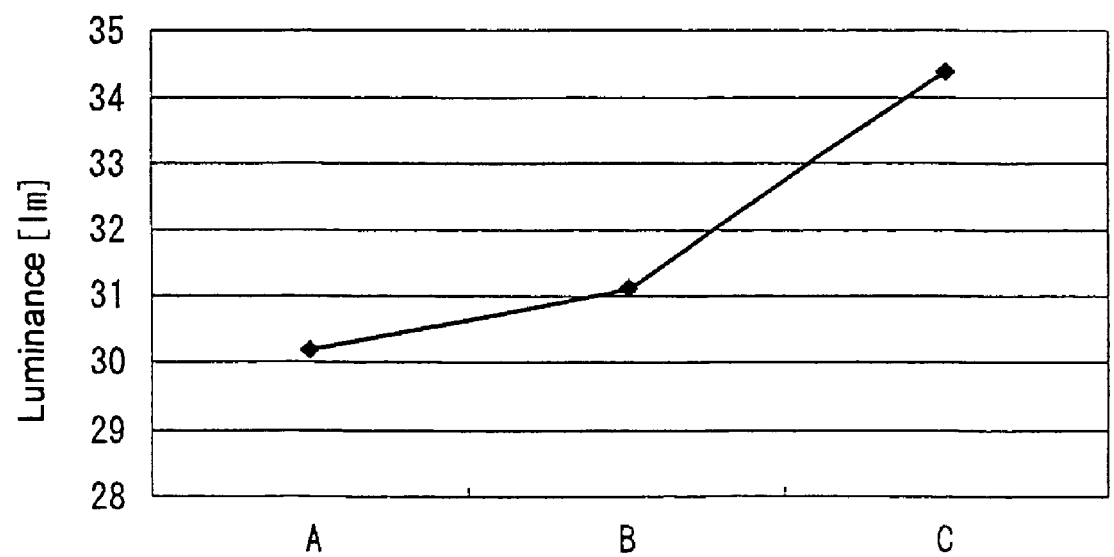
FIG. 21 is a graph showing luminance of light emitting device according to an embodiment of the present invention.

Characteristics of the semiconductor light emitting elements having protrusions of forms A, B and C to be described below were evaluated with results as shown in FIGS. 20, 21.

Sapphire substrates having a principal plane in a C plane and an orientation flat surface in an A plane are used.

In Example A, protrusions having a shape of an equilateral triangle measuring about 5 μm on one side are formed at a distance of 2 μm (distance between adjacent sides) on a substrate surface. The protrusions are disposed in such an arrangement that sides of adjacent protrusions 20 oppose each other substantially parallel as shown in FIG. 19D. A parallelogram enclosed by dashed line 43 having interior angles of about 60° and 120° is regarded as a unit cell that is repeated in directions of axes 51, 52 periodically at equal intervals. Sides of the protrusions are formed parallel to an M-plane.

Figure 18A:
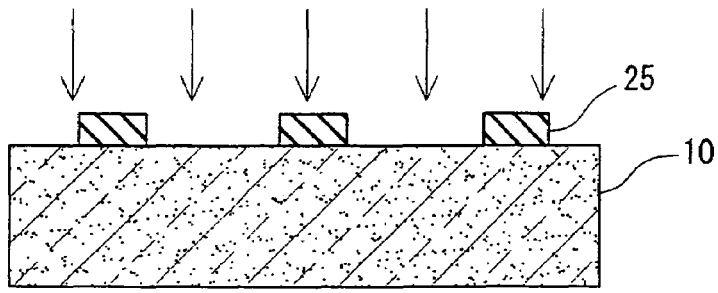
Figure 18B:
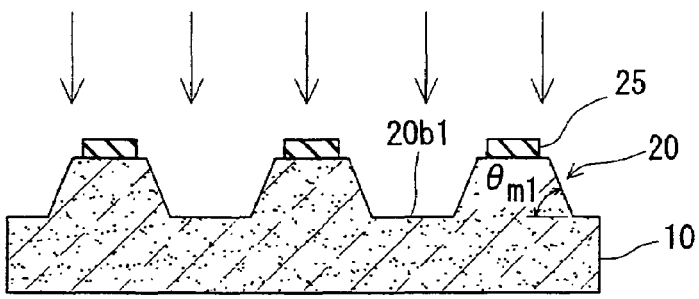
Figure 18C:
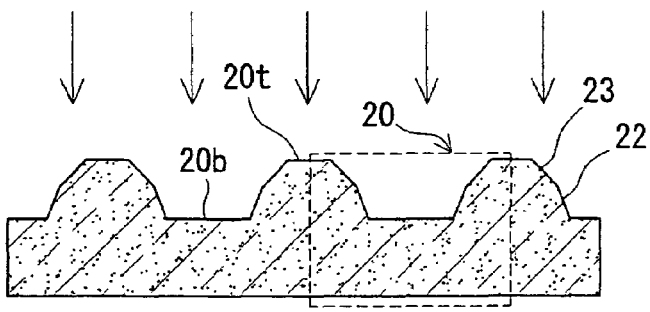
Figure 18F:
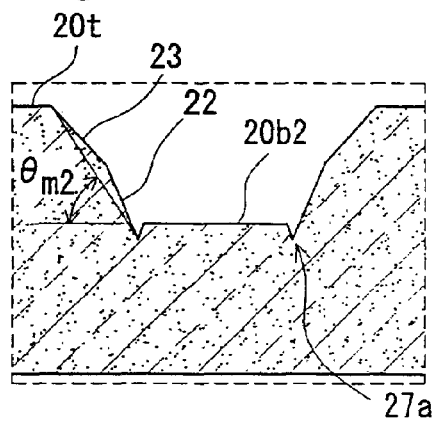

The protrusions are formed by a method shown in FIGS. 2A-2E, FIGS. 18A-18F. First, protective film 25 that makes a mask is formed from $SiO_2$ on the substrate and is shaped in a desired configuration by photolithography and RIE as shown in FIG. 2B, FIG. 18A. Then RIE etching is performed by using $Cl_2/SiCl_4$ as shown in FIG. 2C, FIG. 18B (first step). Depth of etching is set to about 1 μm so that protective mask 25 is almost totally removed. Then etching is continued so as to form protrusions having two inclined surfaces as shown in FIG. 2D, FIG. 18C (second step). This results in formation of the protrusions 20 having the first sloped surface 22 and the second sloped surface 23 as shown in FIG. 5A. Then, as will be described later in Example 1, a base layer made of GaN in thickness of about 4 μm, an n-type layer such as an n-type contact layer, an active layer and a p-type layer are formed on the substrate to make a semiconductor element. The n-type layer is partially exposed to form an n-type electrode therein. A transparent electrode of Ni/Au is formed over substantially an entire surface of the p-type layer, thereby making the light emitting element.

Figure 19A:
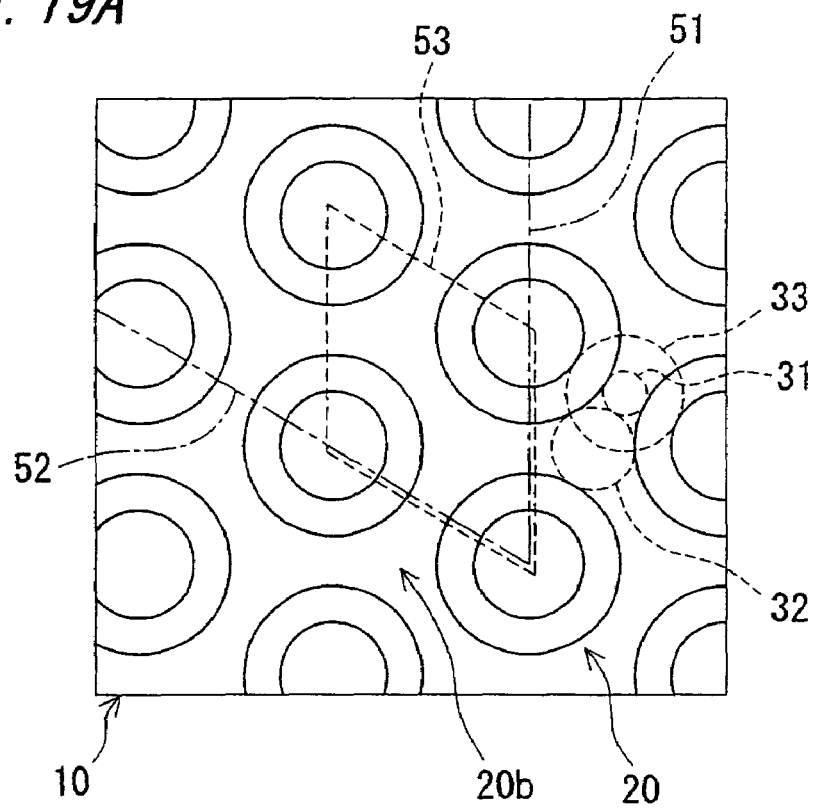
FIGS. 19A through 19D are schematic top views showing the pattern of protrusions formed on the substrate top surface according to an embodiment of the present invention.
Figure 19B:
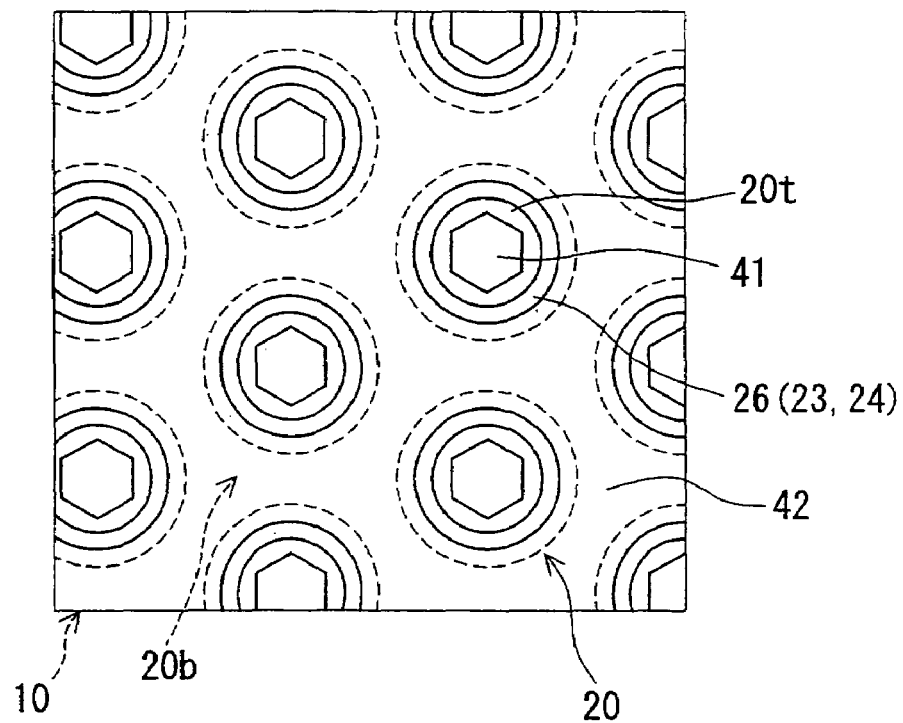
Figure 19C:
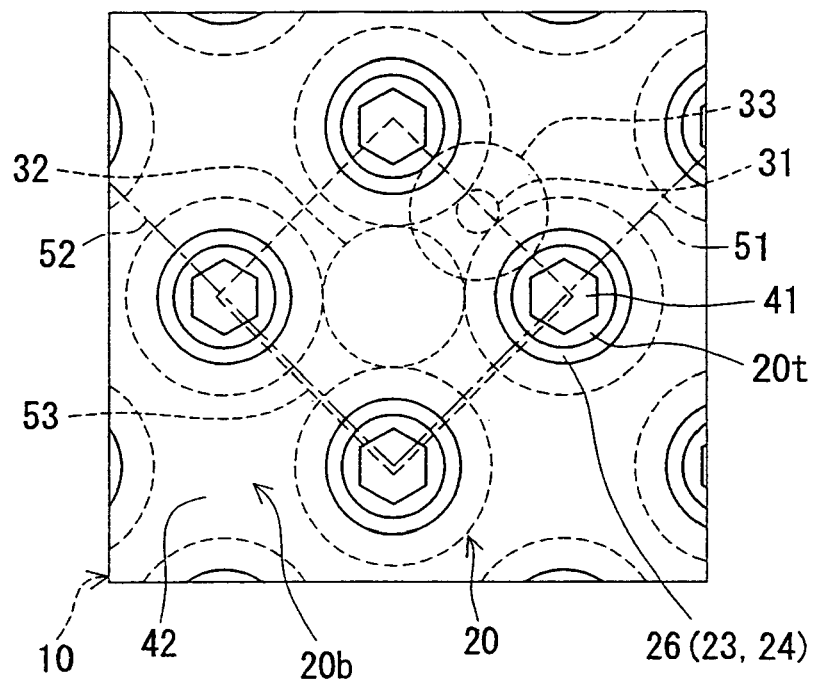
Figure 19D:
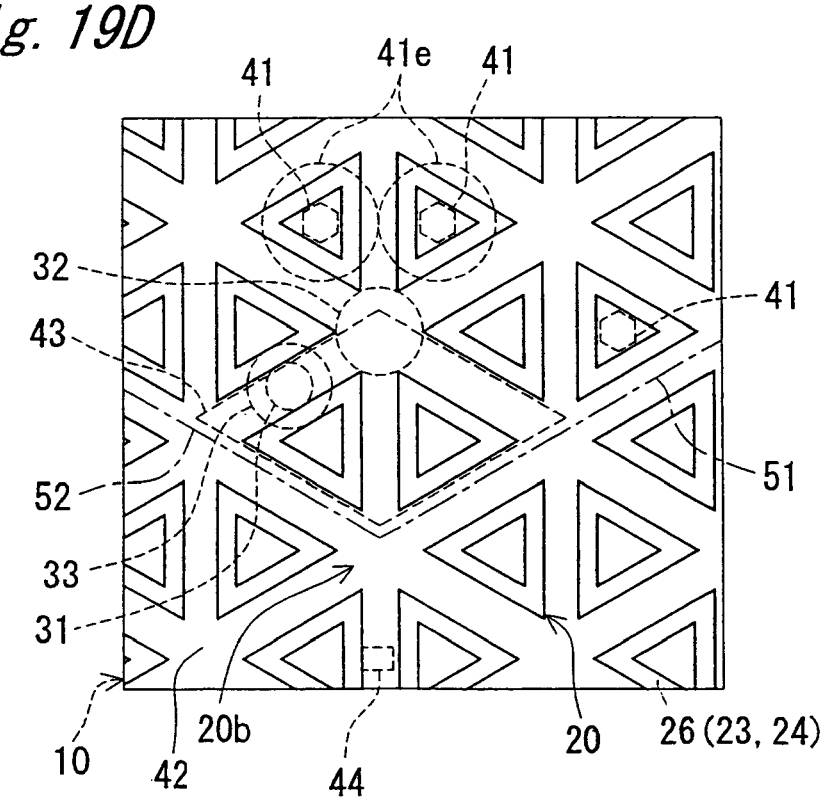

Example B is a variation of example A where the protrusions of the substrate are formed in circular shape as shown in Example 1, FIG. 4A, FIG. 19A and FIG. 19B. Protrusions having a diameter of 4 μm are arranged at intervals of 1.5 μm. A parallelogram enclosed by a dashed line having interior angles of about 60° and 120° is regarded as unit cell 53 that is repeated in directions of axes 51, 52 periodically as shown in FIG. 19A.

Figure 16A:
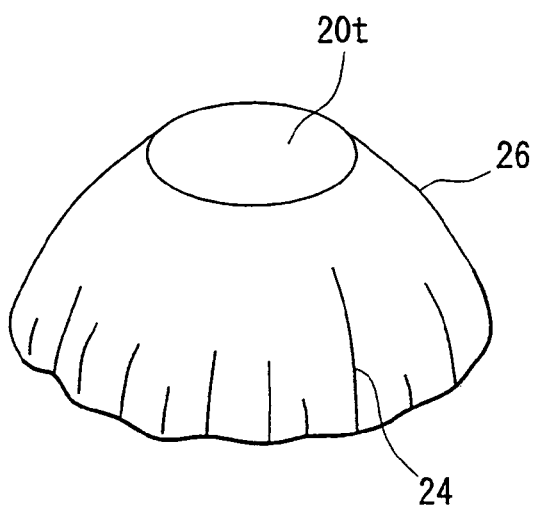
FIGS. 16A and 16B are perspective views showing the protrusion in an embodiment of the present invention.
Figure 18D:
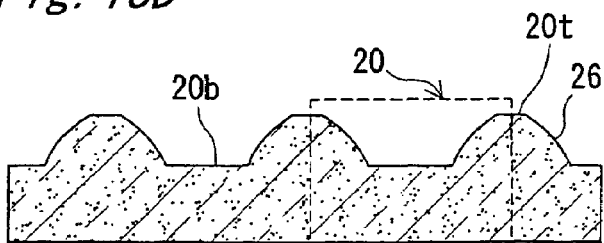
Figure 18G:
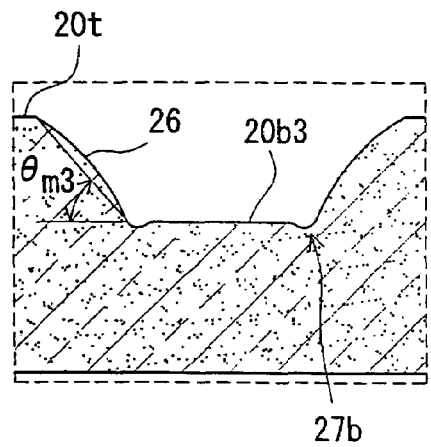

Example C is a variation of the substrate manufacturing process of Example B where the second step of etching is followed by RIE etching with $CF_4$ as a third step so as to form a side face (curved surface protruding outwardly) as shown in FIG. 18D, FIG. 15 and FIG. 16A.

Following results are obtained through observation of a surface and measurement of element characteristics of Examples A, B and C having the protrusions formed in different patterns as described above. An electrostatic destruction characteristic is shown in FIG. 20. Graph 61 shows electrostatic withstanding voltage in a forward direction, and graph 62 shows electrostatic withstanding voltage in a backward direction. Examples A and B show substantially the same electrostatic withstanding voltage in the forward direction, with Example B showing less data dispersion in the characteristics than Example A. Example C shows remarkably higher electrostatic withstanding voltage than Examples A and B. It can be seen that Example C shows small data dispersion comparable to that of Example B.

In terms of electrostatic withstanding voltage in the backward direction, too, Example A and Example B are comparable similarly to a case of forward direction, while Example C shows greatly improved electrostatic withstanding voltage. It can be seen that circular shapes of Examples B and C show less data dispersion in the characteristics than the triangular shape of Example A. Electrostatic withstanding voltage was measured under conditions of 200 pF and 0Ω. Breakdown voltage was measured on 10 pieces of each Example. Mean value, maximum value (maximum value is evaluated as "2500 V" if a sample is not destroyed at 2500 V) and minimum value of these measurements are plotted as shown in the graphs of FIG. 20.

Measurements of luminance of the light emitting element chips in the Examples show that Example B has slightly higher luminance than Example A as shown in FIG. 21. Output power is significantly higher in Example C than in Examples A and B, showing improvement of about 14% over Example A. With regards to Vf, Example B shows a value 0.02 V higher and Example C shows a value about 0.06 V higher than that of Example A. Variability of wavelength of emitted light within a wafer is comparable among the Examples.

Conditions of wafers whereon the semiconductor is formed are observed with an optical microscope for pits and are observed with TEM for threading dislocation, in order to compare crystallinity among the Examples. Example A shows many pits with a high density, showing unsatisfactory crystal growth in a large region. Example B shows less pits as a whole than Example A, showing unsatisfactory crystal growth in a smaller region. In Example C, pits are hardly observed, and unsatisfactory crystal growth is observed in only a smaller region. In Example A, voids 44 are observed at near a center of opposing sides of the triangular protrusions as shown in FIG. 19D. Observation of a cross section shows that occurrence of threading dislocation is less and crystallinity is better in Example A than in Example B. Inclination angle $\theta_m$ of an entire sloped surface of each protrusion observed with SEM is from about 65° to 70° in Example B and from about 45° to 50° in Example C.

Figure 16B:
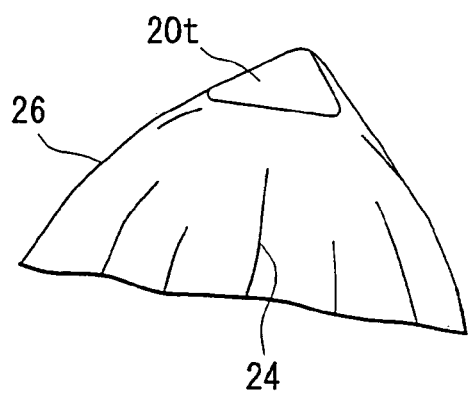
Figure 17A:
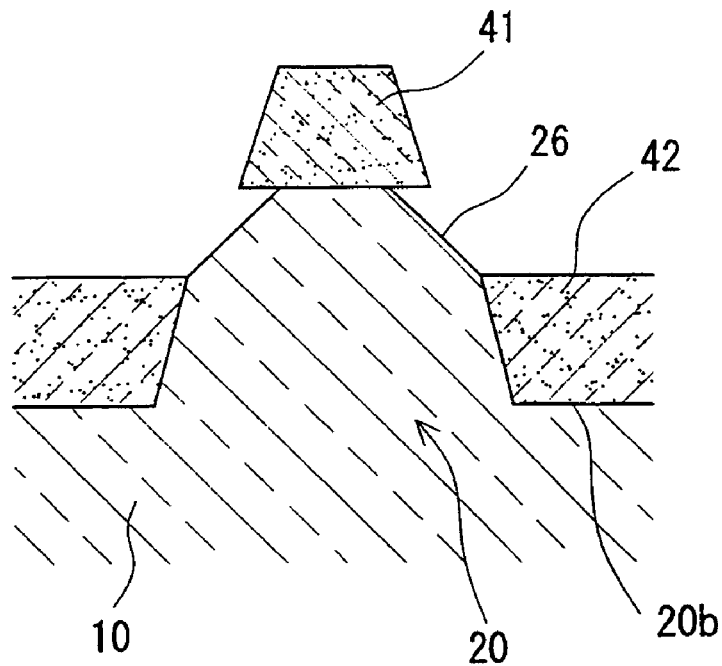
FIGS. 17A and 17B are schematic sectional views showing the protrusion formed on the substrate in an embodiment of the present invention, and semiconductor grown thereon.
Figure 17B:
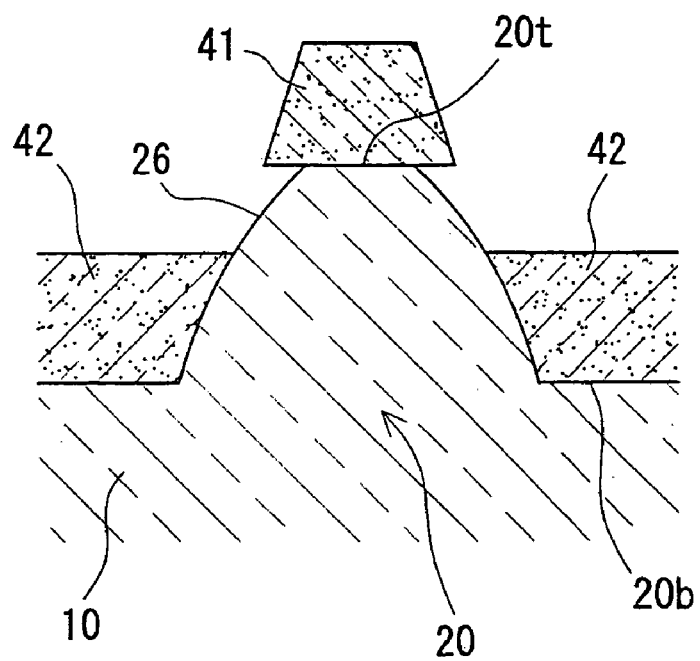

This suggests that smaller inclination angle increases the effect of extracting light and improves the efficiency of light emission in Example C. In Example C, it is supposed that the notch 27a shown in FIG. 18E is smoothed in the third step, and the side faces of the protrusions are smoothed (refer to FIG. 16) so as to form the curved surface 26, thus resulting in reduced pits in the semiconductor layer, reduced threading dislocation and reduced unsatisfactory growth. As a result, higher yield, less variability and higher output power are obtained in Example B than in Example A, and in Example C than in Example B.

Observation of the inclination angle $\theta_m$ of the entire sloped surface of the protrusion and surface condition of the side face of the protrusion while changing an etching condition in Example C shows as follows. When duration of etching in the third step is made longer, the inclination angle continues to decrease while craters appear due to damage by etching on a top face of the protrusion, a flat surface between the protrusions and a side face of the protrusion, with deteriorating crystallinity. Thus, it is desirable to set a proper duration of etching. Then, an etching gas used in the third step is changed. With Ar gas, a shape of the protrusion and electrostatic withstanding voltage that are intermediate between Examples A and C are obtained, and the inclination angle of the protrusion is about 60°. When $SiCl_4$ is used as the etching gas, the inclination angle is about 70°, slightly decreasing from the second step, while only a part on the top face side is turned into a curved surface. When etching with $SiCl_4$ gas is added following the third step of Example C, protrusions having an inclination angle of about 50°, comparable to that of Example C are obtained. When $SiCl_4/Cl_2$ gas is used in the etching of the third step, an inclination angle of about 58°, which is larger than that of Example C, is obtained. A decreasing trend of a radius of curvature of the curved surface on the side face of the protrusion is also observed. From findings described above, it is preferable to use $CF_4$ and Ar as the etching gas in the third step.

Example 1

A sapphire substrate of which a principal plane lies in C plane (0001) having orientation flat in A-plane (11-20) is used as a substrate. First, an $SiO_2$ film 25 is formed on sapphire substrate 10 to make an etching mask as shown in FIG. 2A.

Then, a round photo mask having a diameter of 5 μm is used to etch protective film 25 made of $SiO_2$ and the sapphire substrate 10 to a depth of 1 μm by RIE as shown in FIGS. 2B, 2C. After removing the protective film 25, a surface of the sapphire substrate 10 is further etched so as to form a repetitive pattern of protrusions 20, shown in FIG. 2D, having sloped surfaces formed in two steps (regions that are not etched are indicated by hatching). A diameter of the top surface of the protrusion 20 is 3 μm and distance between adjacent protrusions 20 is 1.5 μm. Angle of inclination $\theta_1$ of first sloped surface 22 on a side face of the protrusion 20 is 70°, and angle of inclination $\theta_2$ of second sloped surface 23 is 20° (FIG. 12).

On the sapphire substrate 10 whereon a repetitive pattern of the protrusion 20 has been formed, a low-temperature growth buffer layer of $Al_xGa_{1-x}N$ ($0 \leq x \leq 1$) is formed to a thickness of 100 Å, a GaN layer is formed to a thickness of 3 μm, an Si-doped GaN layer is formed to a thickness of 4 μm and a GaN layer is formed to a thickness of 3000 Å, as n-type semiconductor layers. Next, an active layer of a multiple quantum well structure is formed to make a light emitting region by forming six well layers of InGaN each 60 Å thick and seven barrier layers of Si-doped GaN each 250 Å thick alternately. The barrier layer to be formed last may be undoped GaN. By forming the first layer made of undoped GaN on the low-temperature growth buffer layer, the protrusions 20 can be embedded more uniformly so as to obtain high crystallinity of a semiconductor layer to be formed thereon.

After forming the active layer of multiple quantum well structure, 200 Å of Mg-doped AlGaN, 1000 Å of undoped GaN and 200 Å of Mg-doped GaN are grown as a p-type semiconductor layer. The undoped GaN layer formed as the p-type semiconductor layer shows a property of p-type due to Mg diffusing therein from an adjacent layer.

Then the Si-doped GaN layer is exposed by etching from the Mg-doped GaN, the p-type semiconductor layer, the active layer and part of the n-type semiconductor layer, so as to form an n-type electrode.

Then a transparent p-type electrode made of Ni/Au is formed over an entire surface of the p-type semiconductor layer, and a p-type pad electrode made of W/Pt/Au is formed on the transparent p electrode at a position opposing an exposed surface of the n-type semiconductor layer. The n-type electrode made of W/Pt/Au is formed on the exposed surface of the n-type semiconductor layer.

Last, the wafer is divided into rectangular chips so as to obtain semiconductor chips measuring 350 μm square. Each semiconductor chip is mounted on a lead frame that has a reflector, thereby making a bullet-shaped LED. The LED emits light having wavelength of 400 nm with output power of 14.0 mW for a forward current of 20 mA.

Comparative Example 1

A bullet-shaped LED was made similar to Example 1 except for forming a recess or protrusion in a single step on a surface of a sapphire substrate as a Comparative Example. Output power of the LED was 9.8 mW for a forward current of 20 mA.

Example 2

A sapphire substrate of which a principal plane lies in C plane (0001) having an orientation flat in A plane (11-20) is used as a substrate. A protective film is used to form circular protrusions having a diameter of 3 μm on sapphire substrate 10. A diameter of a top surface of the protrusion is 2 μm and a distance between adjacent protrusions is 1.0 µm. Angle of inclination $\theta_1$ of a sloped surface on a side face of the protrusion is 70°, and angle of inclination $\theta_2$ is 20°. The protrusions are formed in a pattern shown in FIG. 7B. In other respects, this Example is similar to Example 1. Output power of the LED thus obtained was 14.0 mW for a forward current of 20 mA.

Example 3

Figure 13:
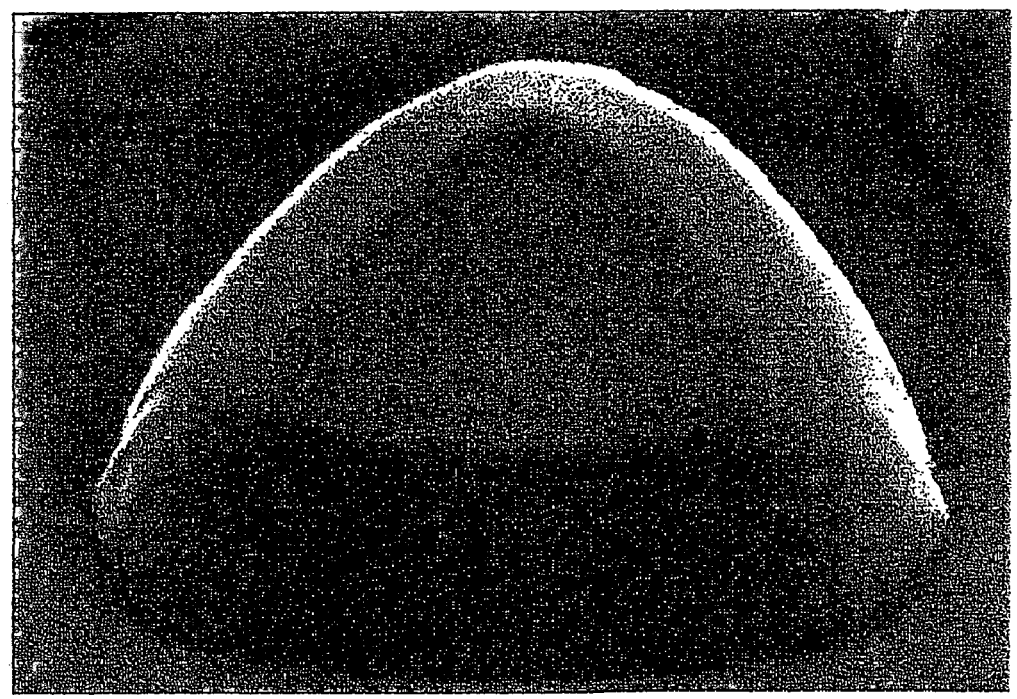
FIG. 13 is an SEM photograph of a protrusion according to another embodiment of the present invention.

Projections are formed on a substrate under the following conditions. In other respects, this Example is similar to Example 1. A photo mask having a shape of an equilateral triangle measuring 5 µm along one side is aligned so that one side of the equilateral triangle is perpendicular to an orientation flat. After etching protective film 25 made of $SiO_2$ and sapphire substrate 10 to a depth of 1 µm by RIE so that sides of the equilateral triangle become substantially parallel to M planes (1-100), (01-10) and (-1010) of sapphire as shown in FIGS. 2B, 2C, the protective film 25 is removed. A surface of the sapphire substrate 10 is further etched so as to form a repetitive pattern of protrusions 20 shown in FIG. 2D. Length a of one side of a top surface of the protrusion is 2 µm and distance b between adjacent protrusions is 1.5 µm. Angle of inclination $\theta_1$ of a side face of the protrusion is 70°, and angle of inclination $\theta_2$ is 20° (FIG. 13). Output power of an LED thus obtained was 12.0 mW for a forward current of 20 mA.

The present invention has been fully described by way of preferred embodiments while making reference to the accompanying drawings. Various variations and modifications of the present invention are apparent to those skilled in the art. Such variations and modifications are understood to fall within the scope of the present invention to the extent that the variations and modifications do not deviate from the appended claims.

What is claimed is:

1. A semiconductor light emitting device comprising:
   a transparent substrate including a surface for growing semiconductor layers including an active layer, said surface having protrusions, with a side face of each of said protrusions defining a first inclination angle on a lower portion of said side face and a second inclination angle on an upper portion of said side face, said first inclination angle being greater than said second inclination angle; and
   semiconductor layers, of material different from a material of said transparent substrate, on said surface of said transparent substrate, said semiconductor layers covering said protrusions,
   wherein either
   (i) said upper portion of said side face of each of said protrusions is flat and said lower portion of said side face of each of said protrusions is rough, or
   (ii) said upper portion of said side face of each of said protrusions has a surface roughness that is smaller than a surface roughness of said lower portion of said side face of each of said protrusions,
   wherein light is reflected at an interface between said protrusions and said semiconductor layers, and
   wherein a groove is formed at a bottom periphery of each of said protrusions.

2. The semiconductor device according to claim 1, wherein said side face of each of said protrusions defines said first inclination angle and said second inclination angle by virtue of comprising two surfaces each having a different inclination angle.

3. The semiconductor device according to claim 2, further comprising:
   a buffer layer between said surface of said transparent substrate and said semiconductor layers, said buffer layer having a thickness that is less than a height of said protrusions, said buffer layer having island portions provided on top faces of said protrusions with at least a portion of said side face of each of said protrusions not being covered by said buffer layer, and said buffer layer comprising layer portions provided on said surface of said transparent substrate between said protrusions and separated from said island portions.

4. The semiconductor device according to claim 2, wherein one of said two surfaces is on a lower side of each of said protrusions and the other of said two surfaces is on an upper side of said each of said protrusions, with the inclination angle of said one of said two surfaces being greater than the inclination angle of said other of said two surfaces.

5. The semiconductor device according to claim 4, wherein the inclination angle of said one of said two surfaces is larger than 45° and smaller than 90°.

6. The semiconductor device according to claim 4, wherein said material of said transparent substrate is selected from the group consisting of sapphire, SiC and spinel, and said each of said protrusions has one of a circular, triangular, parallelogram and hexagonal profile in plan view.

7. The semiconductor device according to claim 2, wherein said protrusions are arranged in a repetitive pattern.

8. The semiconductor device according to claim 1, wherein said side face of each of said protrusions comprises a curved side face.

9. The semiconductor device according to claim 8, wherein said side face of each of said protrusions defines said first inclination angle and said second inclination angle by having said curved side face define said first inclination angle on a lower portion of said curved face and said second inclination angle on an upper portion of said curved side face.

10. The semiconductor device according to claim 8, wherein
    said curved side face comprises a convexly curved side face.

11. A semiconductor light emitting device comprising:
    a transparent substrate including a surface for growing semiconductor layers including an active layer, said surface having protrusions, with a side face of each of said protrusions defining a first inclination angle on a lower portion of said side face and a second inclination angle on an upper portion of said side face, said first inclination angle being greater than said second inclination angle; and
    semiconductor layers, of material different from a material of said transparent substrate, on said surface of said transparent substrate, said semiconductor layers covering said protrusions,
    wherein said lower portion of said side face of each of said protrusions has notches, said notches being oriented longitudinally, and said upper portion of said side face of each of said protrusions has either no substantial notches or has notches of at least one of a smaller width and a smaller number than a width and a number, respectively, of said notches in said lower portion of said side face of each of said protrusions, and
    wherein light is reflected at an interface between said protrusions and said semiconductor layers.

12. The semiconductor device according to claim 11, wherein
said side face of each of said protrusions defines said first inclination angle and said second inclination angle by virtue of comprising two surfaces each having a different inclination angle.

13. The semiconductor device according to claim 12, further comprising:
a buffer layer between said surface of said transparent substrate and said semiconductor layers, said buffer layer having a thickness that is less than a height of said protrusions, said buffer layer having island portions provided on top faces of said protrusions with at least a portion of said side face of each of said protrusions not being covered by said buffer layer, and said buffer layer comprising layer portions provided on said surface of said transparent substrate between said protrusions and separated from said island portions.

14. The semiconductor device according to claim 12, wherein
one of said two surfaces is on a lower side of each of said protrusions and the other of said two surfaces is on an upper side of said each of said protrusions, with the inclination angle of said one of said two surfaces being greater than the inclination angle of said other of said two surfaces.

15. The semiconductor device according to claim 14, wherein
the inclination angle of said one of said two surfaces is larger than 45° and smaller than 90°.

16. The semiconductor device according to claim 14, wherein
said material of said transparent substrate is selected from the group consisting of sapphire, SiC and spinel, and
said each of said protrusions has one of a circular, triangular, parallelogram and hexagonal profile in plan view.

17. The semiconductor device according to claim 12, wherein
said protrusions are arranged in a repetitive pattern.

18. The semiconductor device according to claim 11, wherein
said side face of each of said protrusions comprises a curved side face.

19. The semiconductor device according to claim 18, wherein
said side face of each of said protrusions defines said first inclination angle and said second inclination angle by having said curved side face define said first inclination angle on a lower portion of said curved face and said second inclination angle on an upper portion of said curved side face.

20. The semiconductor device according to claim 18, wherein
said curved side face comprises a convexly curved side face.

21. A light emitting device comprising:
a transparent substrate having a surface for growing semiconductor layers including an active layer, said surface having protrusions spaced apart from one another,
a semiconductor light emitting element including semiconductor layers formed on said surface of said transparent substrate, said semiconductor light emitting element covering said protrusions,
wherein a width of a cross section of said protrusions at a base of each of said protrusions is greater than a width of a cross section of each of said protrusions at a top of each of said protrusions, such that
(i) circumscribed by side faces of two closest ones of said protrusions at the bases of these two protrusions is a first circle that is co-planar with said surface of said transparent substrate,
(ii) circumscribed by side faces of at least three adjacent ones of said protrusions at the bases of these at least three protrusions, with two of these at least three protrusions being said two closest ones of said protrusions, is a second circle that is co-planar with said surface of said transparent substrate, and
(iii) circumscribed by the side faces of said two closest ones of said protrusions at the tops of these two protrusions is a third circle that is co-planar with top surfaces of these two protrusions,
with a diameter of said second circle being larger than a diameter of said first circle and smaller than a diameter of said third circle, and with said third circle and said second circle overlapping each other,
wherein an inclination angle of the side face of each of said protrusions is smaller near a top of the protrusion than near a base of the protrusion,
wherein light is reflected at an interface between said protrusions and said semiconductor layers, and
wherein a side face of each of said protrusions has longitudinally-oriented notches.

22. The light emitting device according to claim 21, wherein
said protrusions are disposed periodically.

23. The light emitting device according to claim 22, wherein
said side face of said each of said protrusion comprises a convexly curved side face.

24. The light emitting device according to claim 21, wherein
said base of said each of said protrusions is circular, and
said protrusions being disposed periodically includes said protrusions being substantially equally spaced in two axial directions that define an angle of about 60°.

* * * * *